US012696641B2

(12) United States Patent
Kim et al.

(10) Patent No.: US 12,696,641 B2
(45) Date of Patent: Jul. 28, 2026

(54) LIGHT EMITTING DISPLAY DEVICE

(71) Applicant: Samsung Display Co., LTD., Yongin-si (KR)

(72) Inventors: Jong Seok Kim, Yongin-si (KR); Kiyoung Kim, Yongin-si (KR); Seung Woo Sung, Yongin-si (KR); Dong Hyun Son, Yongin-si (KR); Sola Lee, Yongin-si (KR); Jin Goo Jung, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 359 days.

(21) Appl. No.: 18/344,996

(22) Filed: Jun. 30, 2023

(65) Prior Publication Data

US 2024/0049535 A1 Feb. 8, 2024

(30) Foreign Application Priority Data

Aug. 3, 2022 (KR) ........................ 10-2022-0096798

(51) Int. Cl.
*H10K 59/131* (2023.01)
(52) U.S. Cl.
CPC .................................. *H10K 59/131* (2023.02)
(58) Field of Classification Search
None
See application file for complete search history.

(56) References Cited

U.S. PATENT DOCUMENTS

2021/0134932 A1 5/2021 Chae et al.
2021/0193782 A1 6/2021 Seo et al.

2021/0313415 A1* 10/2021 Ma ........................ H10K 59/131
2021/0351261 A1* 11/2021 Kim ...................... H10K 59/131
2022/0045159 A1* 2/2022 Lee ....................... H10K 59/121
2022/0045160 A1 2/2022 Lee et al.
(Continued)

FOREIGN PATENT DOCUMENTS

KR 10-2021-0046114 4/2021
KR 10-2021-0052724 A 5/2021
(Continued)

OTHER PUBLICATIONS

Office Action dated Jan. 20, 2026 issued in corresponding Korean Patent Application No. 10-2022-0096798.

*Primary Examiner* — Cory W Eskridge
(74) *Attorney, Agent, or Firm* — F. CHAU & ASSOCIATES, LLC

(57) ABSTRACT

A light emitting display device includes a display area and a component area surrounded by the display area, the component area in which an optical element is disposed, wherein the display area includes a first normal pixel and a second normal pixel connected to a first data line and adjacent to opposite sides of the component area, respectively, and a third normal pixel and a fourth normal pixel connected to a second data line and positioned on the opposite sides of the component area, respectively, the component area includes a first unit pixel connected to the first data line and a bypass data line, the second data line and the bypass data line are formed of different conductive layers, respectively, and the second data line is connected to a bypass data line in the boundary area positioned between the display area and the component area.

20 Claims, 38 Drawing Sheets

(56)          References Cited

U.S. PATENT DOCUMENTS

| | | | | |
|---|---|---|---|---|
| 2022/0208870 A1* | 6/2022 | Choi | .................... | H10K 59/123 |
| 2022/0246687 A1* | 8/2022 | Lee | ...................... | H10K 59/123 |
| 2022/0261115 A1* | 8/2022 | Bok | ...................... | G06F 3/0412 |
| 2022/0343836 A1* | 10/2022 | An | ...................... | G09G 3/3233 |
| 2022/0399407 A1* | 12/2022 | Cha | ...................... | H10K 59/121 |
| 2022/0416001 A1 | 12/2022 | Kim et al. | | |
| 2023/0005998 A1* | 1/2023 | Oh | ...................... | H10K 59/126 |
| 2023/0080838 A1* | 3/2023 | Yang | .................... | G09G 3/3233 |
| | | | | 257/40 |
| 2023/0108100 A1* | 4/2023 | Park | ...................... | H10D 86/60 |
| | | | | 257/40 |
| 2023/0142681 A1* | 5/2023 | Cho | .................... | H10K 59/121 |
| | | | | 345/174 |
| 2023/0371307 A1* | 11/2023 | Lee | ...................... | H10K 59/121 |
| 2023/0395770 A1* | 12/2023 | No | ...................... | H04M 1/0266 |

FOREIGN PATENT DOCUMENTS

| | | |
|---|---|---|
| KR | 10-2021-0081513 A | 7/2021 |
| KR | 10-2021-0130906 | 11/2021 |
| KR | 10-2022-0019888 A | 2/2022 |
| KR | 10-2022-0051684 | 4/2022 |
| KR | 10-2023-0003711 | 1/2023 |

* cited by examiner

FIG. 7
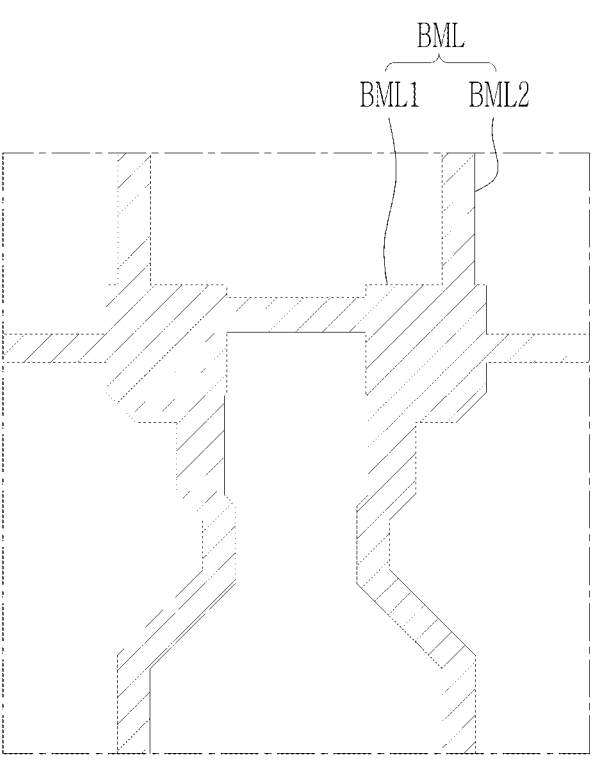
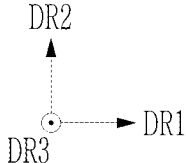

FIG. 8
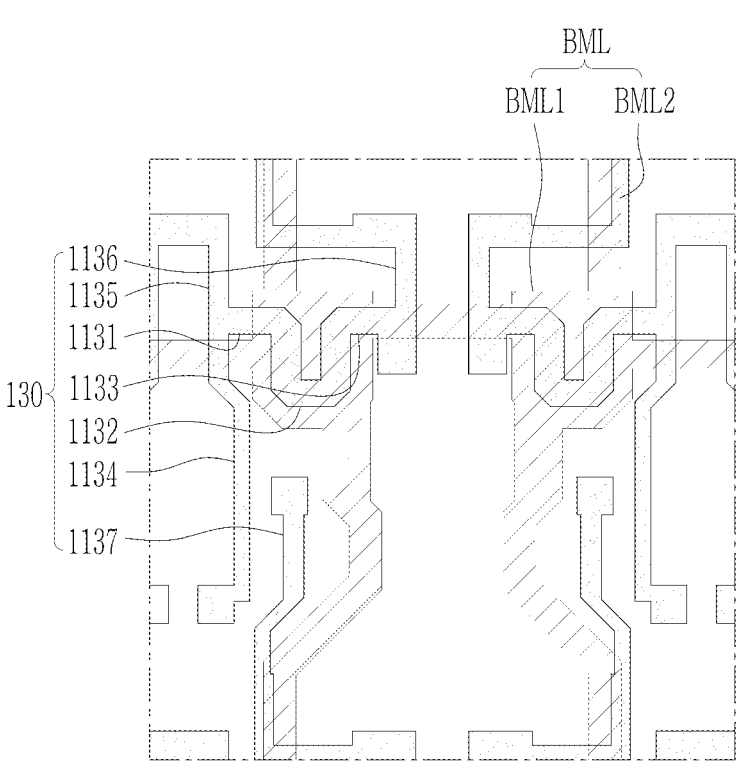
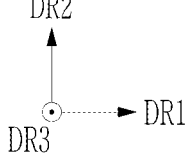

FIG. 9
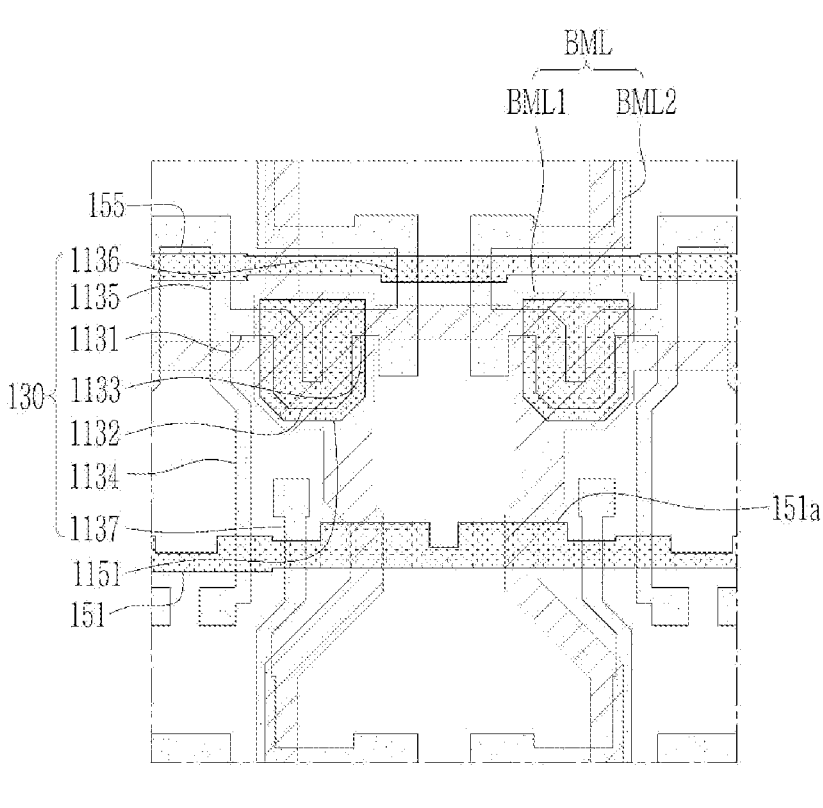
GAT1 : 1151, 151, 151a, 155
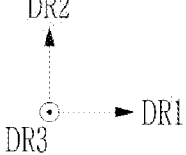

GAT2 : 3155, 4155, 152a, 153a, 127

GAT3 : 128a, 3151, 4151, 152b, 153b

SD1 : 128b, 1175, 3175, 127CM, 171CM
ACM1, FL-SD1

FIG. 22
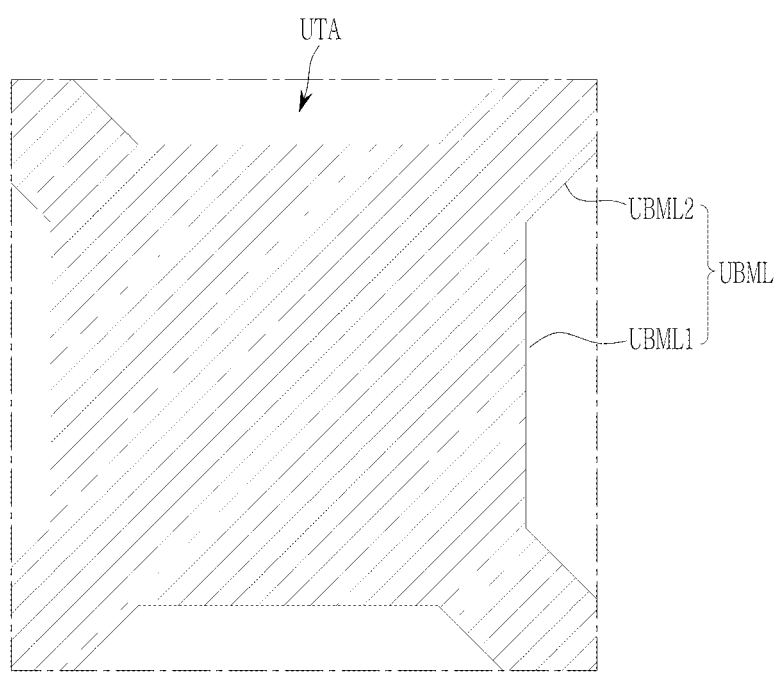
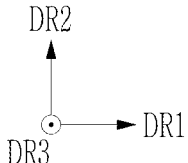

FIG. 23
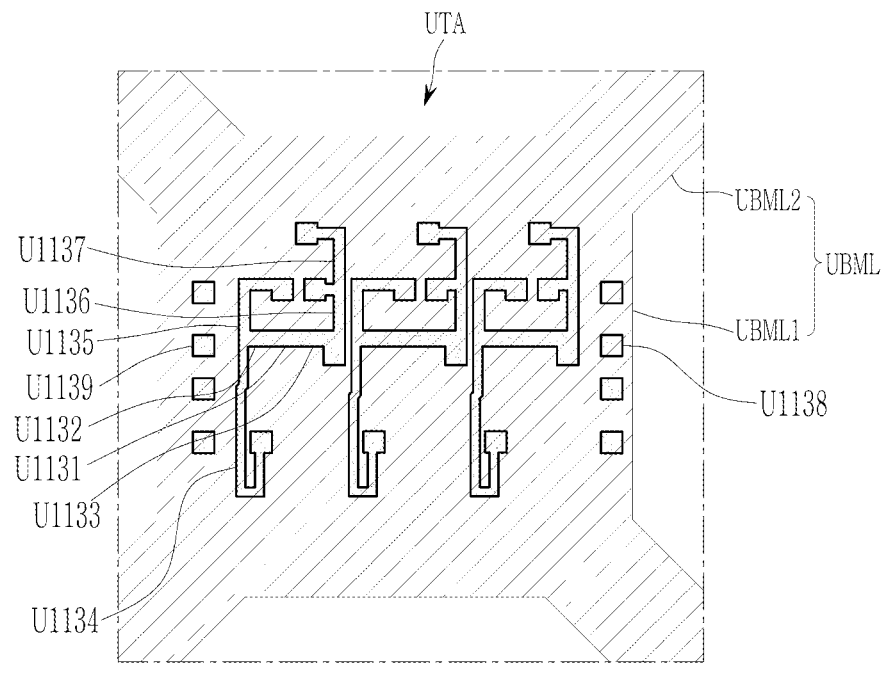
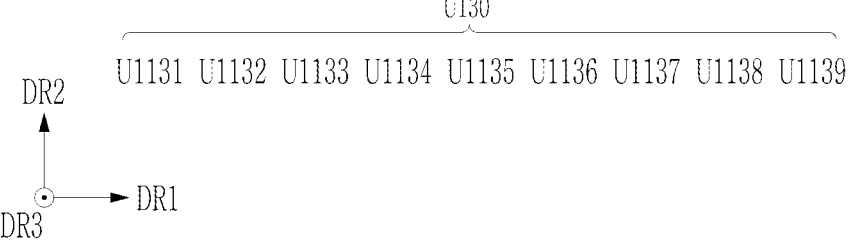

DR2

U130

U1131 U1132 U1133 U1134 U1135 U1136 U1137 U1138 U1139

DR3 ⊙ → DR1

U127b  UACM1
U171p-1  U128CM  U3175 U172a     U128b

U128bp

U127bp
U171p-1

U172CM

U1175
U171CM

U127CM

DR2

DR3 ← → DR1

SD1 : U127b, U127bp, U127CM
U128b, U128bp, U128CM
U171p-1, U171CM
U172a, U172CM
U1175, UACM1, U3175

⊠ OP1
▣ OP2

DR2

DR3 ⊙ → DR1

FIG. 36
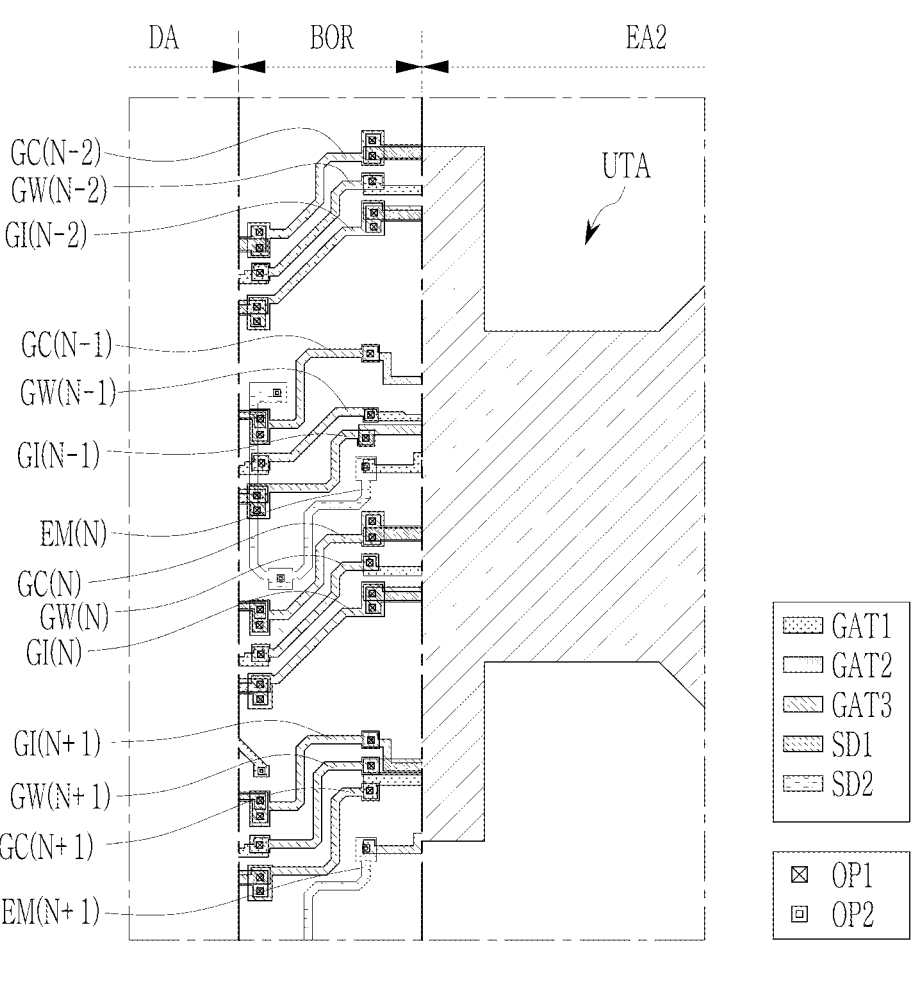
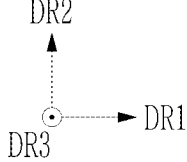

(A)                    (B)

LIGHT EMITTING DISPLAY DEVICE

CROSS-REFERENCE TO RELATED APPLICATION(S)

This application claims priority to and benefits of Korean Patent Application No. 10-2022-0096798 under 35 U.S.C. § 119, filed on Aug. 3, 2022, in the Korean Intellectual Property Office, the entire contents of which are incorporated herein by reference.

BACKGROUND

1. Technical Field

Embodiments relate to a light emitting display device including a component area in which an optical element such as a camera is positioned on a rear surface.

2. Description of the Related Art

A display device is a device that displays a screen, and includes a liquid crystal display (LCD), an organic light emission diode (OLED), and the like. The display device is used in various electronic devices such as a mobile phone, a navigation device, a digital camera, an electronic book, a portable game machine, and various terminals.

A display device such as an organic light emitting device may have a structure in which the display device may be bent or folded by using a flexible substrate.

For example, in small electronic devices such as portable phones, optical elements such as cameras and optical sensors are formed in a bezel area, which is the periphery of the display area, however as the size of the peripheral area of the display area is gradually reduced while the size of the displayed screen is increased, a technology capable of positioning the cameras or optical sensors on the back of the display area has been developed, and a structure that does not form a polarizer on the front of the display device has been developed to improve the efficiency of the optical sensor.

The above information disclosed in this Background section is only for enhancement of understanding of the background of the described technology, and therefore it may contain information that does not form the prior art that is already known in this country to a person of ordinary skill in the art.

SUMMARY

Embodiments provide a light emitting display device capable of reducing an area of a pixel displaying an image in a component area in which an optical element such as a camera is positioned on a rear surface of the display area, and capable of increasing an area of a light transmissive area through which light is transmitted, thereby operating the optical element positioned on the rear surface with improved performance.

However, embodiments of the disclosure are not limited to those set forth herein. The above and other embodiments will become more apparent to one of ordinary skill in the art to which the disclosure pertains by referencing the detailed description of the disclosure given below.

A light emitting display device according to an embodiment may include a display area and a component area surrounded by the display area, the component area in which an optical element is disposed, wherein the display area may include: a first normal pixel and a second normal pixel connected to a first data line and adjacent to opposite sides of the component area, respectively; and a third normal pixel and a fourth normal pixel connected to a second data line and adjacent to the opposite sides of the component area, respectively, the component area may include a first unit pixel connected to the first data line and a bypass data line, the second data line and the bypass data line may be formed of different conductive layers, and the second data line may be connected to the bypass data line in a boundary area positioned between the display area and the component area.

The first data line may be formed of a second data conductive layer and may continuously extend in the display area and the component area.

The first data line may be formed of a second data conductive layer in the display area and the component area, the boundary area may include a connection part formed of a first data conductive layer, and the connection part and the first data line may be connected to each other in the boundary area.

A unit pixel may be positioned in the component area, and the unit pixel positioned in the component area may not be connected to the second data line and the bypass data line.

The first data line and the second data line formed in the display area may be formed of a second data conductive layer, and the bypass data line positioned in the component area may be formed of a first data conductive layer.

A driving voltage line commonly connected to the first normal pixel, the second normal pixel, and the first unit pixel may be further included, and the driving voltage line may be formed of a second data conductive layer in the display area and may be connected to a driving voltage applying part formed of a first data conductive layer in the component area.

The component area may further include a bypass driving voltage line and another driving voltage applying part formed of the second data conductive layer, and the bypass driving voltage line may be connected to the another driving voltage applying part.

A driving voltage line commonly connected to the first normal pixel, the second normal pixel, and the first unit pixel may be further included, the driving voltage line may be formed of a second data conductive layer in the display area and the component area, the boundary area may include a connection part formed of a first data conductive layer, and the connection part and the driving voltage line may be connected in the boundary area.

A first initialization voltage line commonly connected to the first normal pixel, the second normal pixel, and the first unit pixel may be further included, the first initialization voltage line may be formed of a first data conductive layer in the display area and the component area, the component area further may include a first initialization voltage applying part formed of a second gate conductive layer so that the first initialization voltage line may be connected to the first initialization voltage applying part in the component area.

The component area may further include a bypass first initialization voltage line formed of the first data conductive layer and a plurality of first island parts formed of in a semiconductor layer, and the bypass first initialization voltage line and the plurality of first island parts may be connected to each other in the component area.

The light emitting display device may further include a first initialization voltage line commonly connected to the first normal pixel, the second normal pixel, and the first unit pixel; and a second initialization voltage line formed of the first data conductive layer in the display area and the component area, wherein the component area may further include a second initialization voltage applying part formed of the second gate conductive layer so that the second initialization voltage line may be connected to the second initialization voltage applying part in the component area.

The component area may further include a bypass second initialization voltage line formed of the first data conductive layer and a plurality of second island parts formed of a semiconductor layer, and the bypass second initialization voltage line and the plurality of second island parts may be connected to each other in the component area.

A second initialization voltage line commonly connected to the first normal pixel, the second normal pixel, and the first unit pixel may be further included, the second initialization voltage line may be formed of the first data conductive layer in the display area and the component area, the boundary area may include a connection part formed of a second data conductive layer, and the connection part and the second initialization voltage line may be connected in the boundary area.

The display area may further include a fifth normal pixel and a sixth normal pixel connected to a first signal line extending in a direction intersecting the first data line and the second data line and adjacent to opposite sides of the component area, respectively, the first unit pixel of the component area may be connected to the first signal line, the boundary area may further include a connection part, and the connection part and the first signal line may be connected to each other in the boundary area.

The display area may further include a seventh normal pixel and an eighth normal pixel connected to a second signal line extending in a direction intersecting the first data line and the second data line, and adjacent to the other opposite sides of the component area, respectively, the component area may further include a bypass signal line, the boundary area may further include another connection part, and the bypass signal line and the second signal line may be connected to the another connection part in the boundary area.

A light emitting display device according to an embodiment may include a display area and a component area surrounded by the display area, the component area in which an optical element is disposed, wherein the display area may include a first normal pixel and a second normal pixel adjacent to opposite sides of the component area and commonly connected to one data line; and a first voltage line adjacent to the first normal pixel and the second normal pixel, the component area may include a light blocking portion and a unit pixel positioned on the light blocking portion, the light blocking portion may include the plurality of openings corresponding to a light transmissive area, a plurality of openings may not overlap the unit pixel in a plan view, the first voltage line is divided into a first portion adjacent to the first normal pixel and a second portion adjacent to the second normal pixel, the first portion and the second portion are electrically disconnected from each other, and the first portion is electrically connected to the light blocking portion.

The first portion of the first voltage line and the first normal pixel may be electrically disconnected from each other, and the second portion of the first voltage line and the second normal pixel may be electrically connected to each other.

A first initialization voltage or a second initialization voltage may be applied to the second portion of the first voltage line.

The display area may include a third normal pixel and a fourth normal pixel adjacent to the opposite sides of the component area, respectively, and commonly connected to another data line; and a second voltage line to which a voltage applied to the second portion of the first voltage line is applied, and the third normal pixel, the fourth normal pixel, and the unit pixel may be commonly connected to the second voltage line.

A pad part adjacent to a side of a driving part; and a first voltage application wiring connecting the first portion of the first voltage line connected to the light blocking portion and the pad part may be further included, wherein the first voltage application wiring may be extended along an edge portion of the light emitting display device.

According to embodiments, although the signal line and/or the voltage line commonly connected to the component pixel included in the component area and the normal pixel included in the display area are connected through different conductive layers, the contact structure connecting the different conductive layers may be formed in the boundary area positioned between the component pixel area and the normal pixel area, not in the component pixel area, accordingly the area of the component pixel area is not increased, but the area of the light transmissive area is relatively wide. Therefore, the area ratio of the light transmissive area among the component areas is increased, so that the transmittance of light is improved, and the optical element positioned on the back may operate with improved performance.

According to embodiments, in case that the light blocking portion positioned on the rear surface of the unit pixel in the component area receives the voltage, without forming a separate wiring, the existing wiring is divided into a first portion and a second portion, and the voltage is applied in such a way that one of them is connected to the light blocking portion so that the area of the light transmissive area of the component area is not reduced.

BRIEF DESCRIPTION OF THE DRAWINGS

FIG. 7 to FIG. 18 are schematic views showing a structure of each layer according to a manufacturing order of a lower panel layer among a normal pixel of a light emitting display device according to an embodiment.

FIG. 22 to FIG. 33 are schematic views showing a structure of each layer according to a manufacturing order of a lower panel layer among a second component pixel according to FIG. 21.

FIG. 35 and FIG. 36 are schematic views showing a signal line for connecting a normal pixel and a second component pixel and a conductive layer for connecting a voltage line according to an embodiment as a table.

DETAILED DESCRIPTION OF THE EMBODIMENTS

Figure 1:
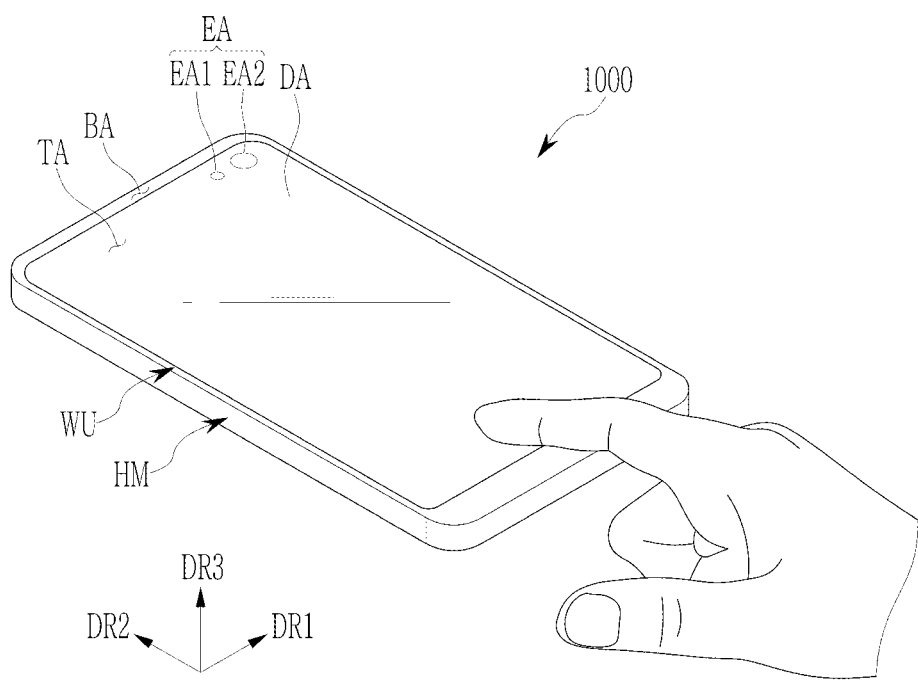
FIG. 1 is a schematic perspective view showing a use state of a light emitting display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Also, throughout the specification, when it is said that parts such as a wire, a layer, a film, an area, a plate, and a constituent element are "extended in a first direction or a second direction", this does not mean only a straight line shape extending straight in the corresponding direction, but also includes a structure that is bent in a part, has a zigzag structure, or extends while including a curved line structure as a structure that extends overall along the first direction or the second direction.

For example, electronic devices (e.g., a mobile phone, a TV, a monitor, a laptop computer, etc.) included in display devices and display panels described in the specification, or electronic devices included in display devices and display panels, etc. manufactured by manufacturing methods described in a specification, are not excluded from a scope of this specification.

Hereinafter, a schematic structure of a display device (e.g., a light emitting display device) is schematically described with reference to FIG. 1 to FIG. 3.

Figure 2:
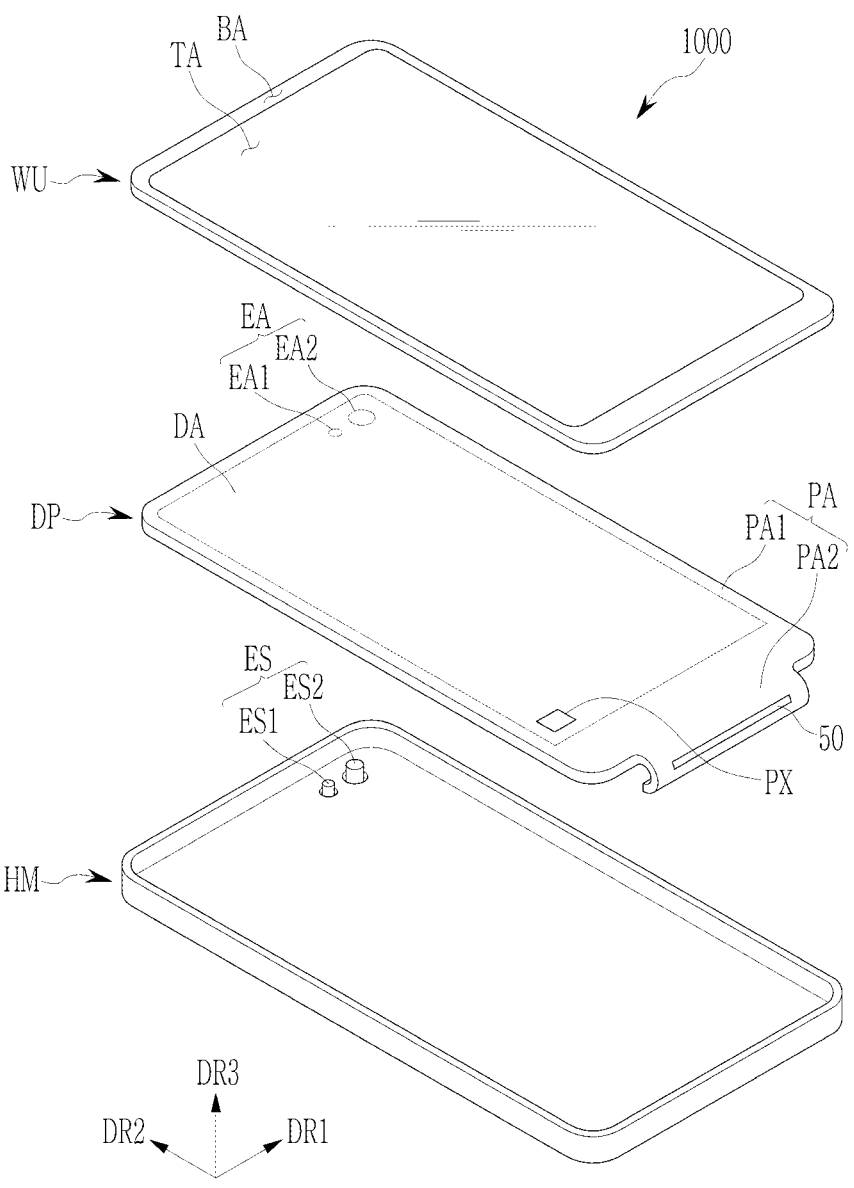
FIG. 2 is a schematic exploded perspective view of a light emitting display device according to an embodiment.
Figure 3:
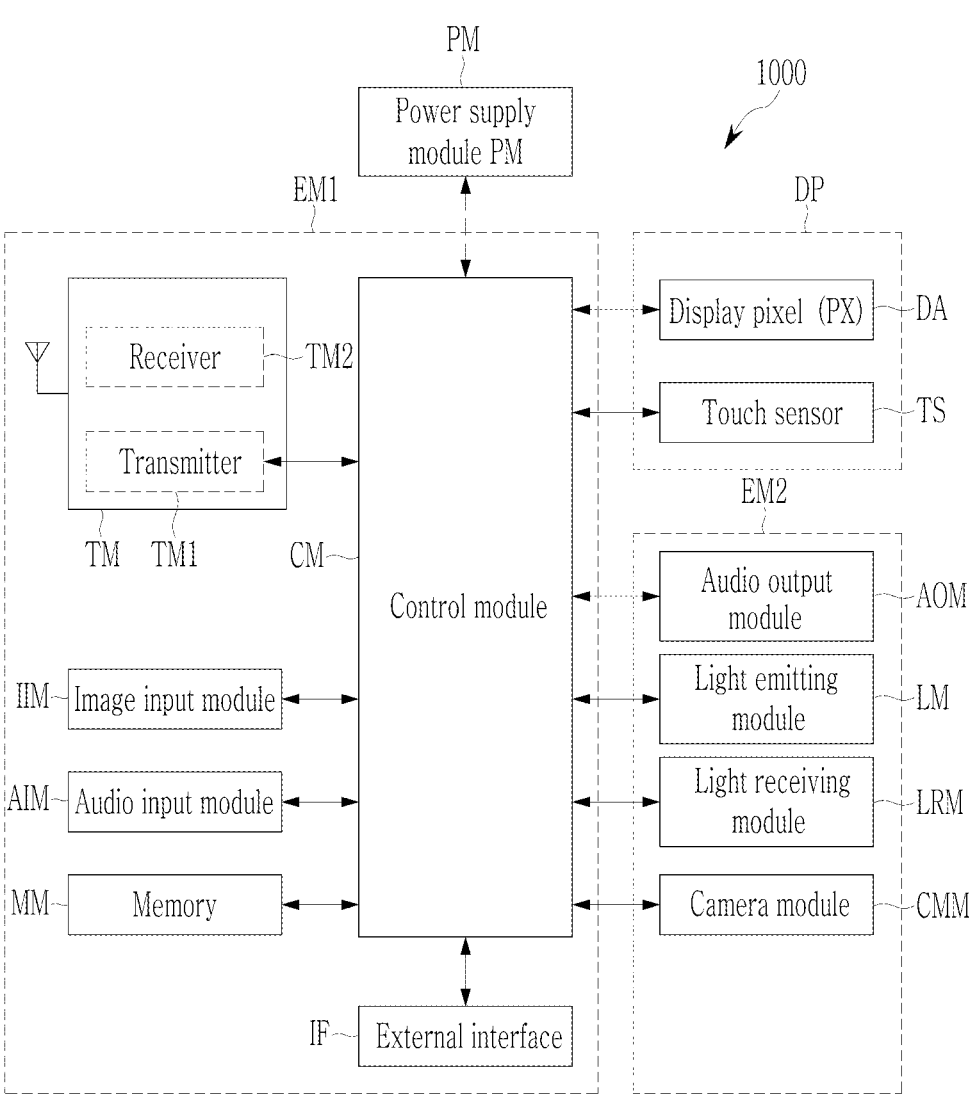
FIG. 3 of a block diagram of a light emitting display device according to an embodiment.

FIG. 1 is a schematic perspective view showing a use state of a light emitting display device according to an embodiment, FIG. 2 is a schematic exploded perspective view of a light emitting display device according to an embodiment, and FIG. 3 of a block diagram of a light emitting display device according to an embodiment.

Referring to FIG. 1, a light emitting display device 1000 according to an embodiment may be a device for displaying a motion picture or a still image, and may be used as a display screen of various products such as a television, a laptop, a monitor, an advertisement board, the Internet of things (JOT), etc., as well as portable electronic devices such as a mobile phone, a smart phone, a tablet personal computer, a mobile communication terminal, an electronic notebook, an e-book, a PMP (portable multimedia player), a navigation device, a UMPC (Ultra Mobile PC), etc. For example, the light emitting display device 1000 may be used in a wearable device such as a smart watch, a watch phone, a glasses display, and a head mounted display (HMD). For example, the light emitting display device 1000 may be used as an instrument panel of a car, and a center fascia of the car or a CID (Center Information Display) disposed on a dashboard, a room mirror display that replaces a side mirror of the car, an entertainment device for a rear seat of the car, or a display disposed on the rear surface of the front seat. FIG. 1 shows that the light emitting display device 1000 is used as a smartphone for better comprehension and descriptive convenience.

The light emitting display device 1000 may display an image in a third direction DR3 on a display surface parallel to each of a first direction DR1 and a second direction DR2. The display surface on which the image is displayed may correspond to the front surface of the light emitting display device 1000 and may correspond to the front surface of a cover window WU. The images may include static images as well as dynamic images.

In an embodiment, a front surface (or an upper surface) and a rear surface (or a lower surface) of each member are defined based on the direction in which the image is displayed. The front surface and the rear surface may be opposed to each other in the third direction DR3, and the normal directions of each of the front and the rear surfaces may be parallel to the third direction DR3. The separation distance in the third direction DR3 between the front surface and the rear surface may correspond to the thickness in the third direction DR3 of the display panel.

The light emitting display device 1000 according to an embodiment may detect (or sense) an input (referring to a hand in FIG. 1) of a user applied from the outside. The input of the user may include various types of external inputs such as a part of the user's body, light, heat, or pressure. In an embodiment, the user's input is shown with the user's hand applied to the front. However, embodiments are not limited thereto. The user's input may be provided in various forms, and the light emitting display device 1000 may sense the user's input applied to the side surface or the rear surface of the light emitting display device 1000 according to the structure of the light emitting display device 1000.

Referring to FIG. 1 and FIG. 2, the light emitting display device 1000 may include a cover window WU, a housing HM, a display panel DP, and an optical element ES. In an embodiment, the cover window WU and the housing HM may be combined to form the appearance of the light emitting display device 1000.

The cover window WU may include an insulation panel. For example, the cover window WU may be made of glass, plastic, or a combination thereof.

The front surface of the cover window WU may define the front surface of the light emitting display device 1000. The transmissive area TA may be an optically transparent area. For example, the transmissive area TA may be an area having visible light transmittance of about 90% or more.

The blocking area BA may define the shape of the transmissive area TA. The blocking area BA may be adjacent to the transmissive area TA and may surround the transmissive area TA. The blocking area BA may be an area having relatively low light transmittance compared to the transmissive area TA. The blocking area BA may include an opaque material that blocks light. The blocking area BA may have a certain color. The blocking area BA may be defined by a bezel layer provided separately from the transparent substrate defining the transmissive area TA, or may be defined by an ink layer formed by inserting or coloring ink into the transparent substrate.

The display panel DP may include display pixels PX displaying an image and a driving part 50, and the display pixels PX may be positioned in the display area DA and the component area EA. The display panel DP may include the front surface including a display area DA and a non-display area PA. In an embodiment, the display area DA and the component area EA may be areas in which an image is displayed by including a pixel, and simultaneously may be an area in which an external input is sensed by positioning a touch sensor on the upper side in a third direction DR3 of the display pixels PX.

The transmissive area TA of the cover window WU may at least partially overlap the display area DA and the component area EA of the display panel DP. For example, the transmissive area TA may overlap the entire surface of the display area DA and the component area EA, or may overlap at least a portion of the display area DA and the component area EA. Accordingly, the user may recognize the image through the transmissive area TA or provide the external input based on the image. However, embodiments are not limited thereto. For example, an area in which the image is displayed and an area in which the external input is detected may be separated from each other.

The non-display area PA of the display panel DP may at least partially overlap the blocking area BA of the cover window WU. The non-display area PA may be an area covered by the blocking area BA. The non-display area PA may be adjacent to the display area DA and may surround the display area DA. The image may not be displayed in the non-display area PA, and a driving circuit or driving wiring for driving the display area DA may be disposed. The non-display area PA may include a first peripheral area PA1 positioned outside the display area DA and a second peripheral area PA2 including a driving part 50, connection wiring, and a bending area. In the embodiment of FIG. 2, the first peripheral area PA1 may be positioned on three sides of the display area DA, and the second peripheral area PA2 may be positioned on the other side of the display area DA.

In an embodiment, the display panel DP may be assembled in a flat state in which the display area DA, the component area EA, and the non-display area PA face the cover window WU. However, embodiments are not limited thereto. The part of the non-display area PA of the display panel DP may be bent. For example, the portion of the non-display area PA may face the rear surface of the light emitting display device 1000, so that the blocking area BA shown on the front surface of the light emitting display device 1000 may be reduced, and as shown in FIG. 2, the second peripheral area PA2 may be bent to be positioned on the rear surface of the display area DA, and assembled.

For example, the component area EA of the display panel DP may include a first component area EA1 and a second component area EA2. The first component area EA1 and the second component area EA2 may be at least partially surrounded by the display area DA. Although the first component area EA1 and the second component area EA2 are shown to be spaced apart from each other, embodiments are not limited thereto, and at least some of them may be connected. The first component area EA1 and the second component area EA2 may be areas in which an optical element (referring to ES of FIG. 2; hereinafter referred to as a component), which is operated by using infrared lights, visible lights, or a sound, is disposed below the first component area EA1 and the second component area EA2.

The display area DA and the component area EA may include light emitting diodes LED and pixel circuit parts for generating and transmitting a light emitting current to each of a plurality of light emitting diodes LED. For example, a single light emitting diode LED and a single pixel circuit part are referred to as a pixel PX. In the display area DA and the component area EA, a single pixel circuit part and a single light emitting diode LED may be formed in a one-to-one relationship.

The first component area EA1 may include a transmissive part through which light or/and sound may pass and a display part including pixels. The transmissive part may be positioned between adjacent pixels and may be formed of a transparent layer through which light or/and sound may pass. The transmissive part may be positioned between the adjacent pixels. According to an embodiment, a layer, through which light is not transmitted, such as a light blocking layer, may overlap the first component area EA1. The number of the pixels per unit area (or pixel density) of the pixels (hereinafter referred to as normal pixels) included in the display area DA may be the same as the number of the pixels per unit area (or pixel density) of the pixels (hereinafter referred to as first component pixels) included in the first component area EA1.

The second component area EA2 may include an area (hereinafter, also referred to as a light transmissive area) formed of a transparent layer to pass light therethrough, the light transmissive area may not include a conductive layer or a semiconductor layer, and a layer including a light blocking material, for example, a pixel definition layer and/or a light blocking layer, may include an opening overlapping a position corresponding to the second component area EA2, thereby having a structure that does not block light. The number of the pixels per unit area (or pixel density) of the pixels (hereinafter also referred to as second component pixels) included in the second component area EA2 may be smaller than the number of the pixels per unit area (or pixel density) of the normal pixels included in the display area DA. As a result, the resolution of the second component pixels may be lower than the resolution of the normal pixels.

Referring to FIG. 3, the display panel DP may further include a touch sensor TS in addition to the display area DA including the display pixels PX. The display panel DP may be visually recognized by the user from the outside through the transmissive area TA including the display pixels PX that generates the image. For example, the touch sensor TS may be positioned on the display pixels PX, and may detect the external input applied from the outside. The touch sensor TS may detect the external input provided to the cover window WU.

Referring to FIG. 2, the second peripheral area PA2 may include a bending part. The display area DA and the first peripheral area PA1 may have a flat state substantially parallel to the plane defined by the first direction DR1 and the second direction DR2, and a side of the second peripheral area PA2 may extend from the flat state and may have the flat state again after going through the bending part. As a result, at least a part of the second peripheral area PA2 may be bent and assembled to be positioned on the rear surface side of the display area DA. At least a portion of the second peripheral area PA2 may overlap the display area DA in a plan view in case that the light emitting display device 100 is assembled, so that the blocking area BA of the light emitting display device 1000 may be reduced. However, embodiments are not limited thereto. For example, the second peripheral area PA2 may not be bent.

The driving part 50 may be mounted on the second peripheral area PA2, and may be mounted on the bending part or positioned on one of sides (e.g., opposite sides) of the bending part. The driving part 50 may be implemented in the form of a chip.

The driving part 50 may be electrically connected to the display area DA and the component area EA to transmit an electrical signal to the pixels of the display area DA and the component area EA. For example, the driving part 50 may provide data signals to the display pixels PX disposed in the display area DA. In another example, the driving part 50 may include a touch driving circuit and may be electrically connected to the touch sensor TS disposed in the display area DA and/or the component area EA. For example, the driving part 50 may be designed to include various circuits in addition to the above-described circuits or to provide various electrical signals to the display area DA.

For example, a pad part may be positioned at the end portion of the second peripheral area PA2, and the light emitting display device 1000 may be electrically connected to a flexible printed circuit board (FPCB) including a driving chip by the pad part. For example, the driving chip positioned on the flexible printed circuit board may include various driving circuits for driving the light emitting display device 1000 or connectors for power supply. According to an embodiment, instead of the flexible printed circuit board, a rigid printed circuit board (PCB) may be used.

The optical element ES may be disposed under the display panel DP. The optical element ES may include a first optical element ES1 overlapping the first component area EA1 and a second optical element ES2 overlapping the second component area EA2. The first optical element ES1 may use infrared lights. For example, the first component area EA1 may overlap a layer that does not transmit light, such as a light blocking layer.

The first optical element ES1 may be an electronic element, which is operated by using light or sound. For example, the first optical element ES1 may be a sensor that receives and uses light such as an infrared sensor, a sensor that outputs and senses light or sound to measure a distance or recognize a fingerprint, a small lamp that outputs light, or a speaker that outputs a sound, etc. In the case of the electronic element is operated by using light, light of various wavelength bands such as visible light, infrared light, and ultraviolet light may be used.

The second optical element ES2 may be at least one of a camera, an infrared camera (IR camera), a dot projector, an infrared illuminator, and a time-of-flight sensor (ToF sensor).

Referring to FIG. 3, the light emitting display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, the display pixel and the touch sensor TS positioned in the display area DA among the configurations of the display panel DP are shown as an example.

The power supply module PM may supply power required for the overall operation of the light emitting display device 1000. The power supply module PM may include a conventional battery module.

The first electronic module EM1 and the second electronic module EM2 may include various functional modules for operating the light emitting display device 1000. The first electronic module EM1 may be mounted (e.g., directly mounted) on the motherboard electrically connected to the display panel DP, or mounted on a separate substrate and electrically connected to the motherboard through a connector.

The first electronic module EM1 may include a control module CM, a wireless communication module TM, an image input module IIM, an audio input module AIM, a memory MM, and an external interface IF. Some of the modules may not be mounted on the motherboard and may be electrically connected to the motherboard through a flexible printed circuit board connected thereto.

The control module CM may control the overall operation of the light emitting display device 1000. The control module CM may be a microprocessor. For example, the control module CM may activate or deactivate the display panel DP. The control module CM may control other modules such as the image input module IIM or the audio input module AIM based on the touch signal received from the display panel DP.

The wireless communication module TM may transmit/receive a wireless signal with other terminals by using Bluetooth or Wi-Fi. The wireless communication module TM may transmit/receive voice signals by using a general communication line. The wireless communication module TM may include a transmitter TM1 that modulates and transmits a signal to be transmitted, and a receiver TM2 that demodulates a received signal.

The image input module IIM may process the image signal to be converted into image data that are displayed on the display panel DP. The audio input module AIM may receive an external sound signal by a microphone in a recording mode, a voice recognition mode, etc. to be converted into electrical voice data.

The external interface IF may function as an interface connected to an external charger, a wired/wireless data port, or a card socket (e.g., a memory card, a SIM/UIM card).

The second electronic module EM2 may include an audio output module AOM, a light emitting module LM, a light receiving module LRM, and a camera module CMM, and at least some of these as the optical elements ES, as shown in FIG. 1 and FIG. 2, may be positioned on the rear surface of the display panel DP. The optical element ES may include a light emitting module LM, a light receiving module LRM, and a camera module CMM. For example, the second electronic module EM2 may be mounted (e.g., directly mounted) on the motherboard, or mounted on a separate substrate and electrically connected to the display panel DP through a connector, or electrically connected to the first electronic module EM1.

The audio output module AOM may convert audio data received from the wireless communication module TM or audio data stored in the memory MM to be output to the outside.

The light emitting module LM may generate and output light. The light emitting module LM may output infrared light. For example, the light emitting module LM may include an LED element. For example, the light receiving module LRM may detect or sense infrared light. The light receiving module LRM may be activated in case that infrared light above a certain level is detected. The light receiving module LRM may include a complementary metal-oxide semiconductor (CMOS) sensor. After the infrared light generated by the light emitting module LM is output, the light may be reflected by an external subject (e.g., a user's finger or a face), and the reflected infrared light may be incident on the light receiving module LRM. The camera module CMM may take external images.

In an embodiment, the optical element ES may additionally include an optical detecting sensor or a thermal detecting sensor. The optical element ES may detect an external object received through the front surface or may provide a sound signal such as a voice through the front surface to the outside. For example, the optical element ES may include a plurality of configurations, and is not limited to any one embodiment.

Again, referring to FIG. 2, the housing HM may be combined with the cover window WU. The cover window WU may be disposed in front of the housing HM. The housing HM may be combined with the cover window WU to provide a certain accommodation space. The display panel DP and the optical element ES may be accommodated in a certain accommodation space provided between the housing HM and the cover window WU.

The housing HM may include a material with relatively high stiffness. For example, the housing HM may include frames and/or plates made of glass, plastic, or metal, or a combination thereof. The housing HM may reliably protect the components of the light emitting display device 1000 housed (or accommodated) in the interior space from external impact.

Hereinafter, the structure of the light emitting display device 1000 according to an embodiment is described with reference to FIG. 4.

Figure 4:
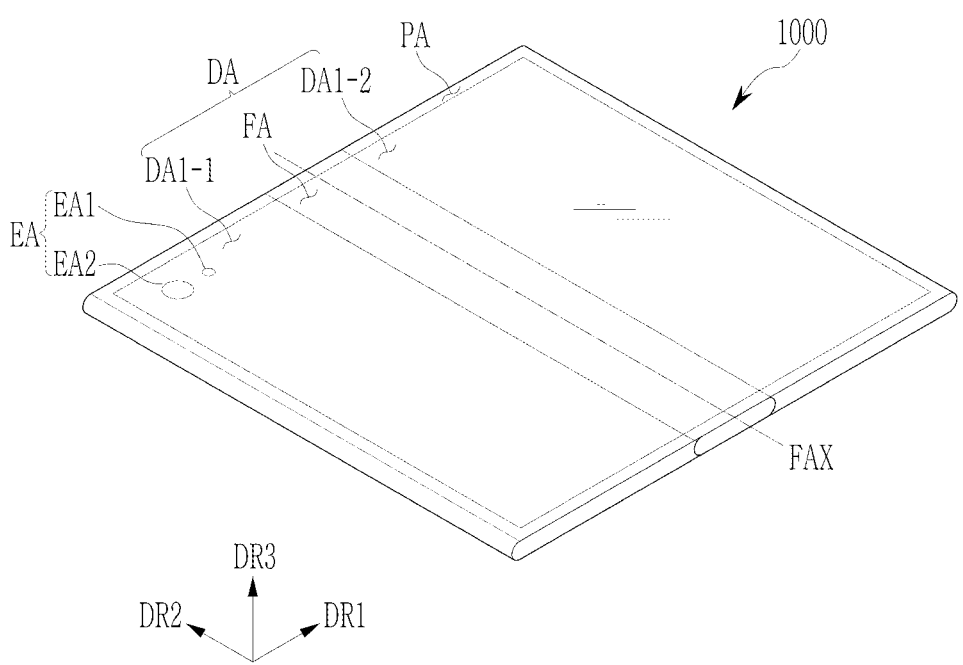
FIG. 4 is a schematic perspective view showing a use state of a light emitting display device according to an embodiment.

FIG. 4 is a schematic perspective view showing a light emitting display device according to an embodiment.

A description of the same configuration as the above-described constituent elements is omitted for descriptive convenience, and the embodiment of FIG. 4 shows a foldable light emitting display device in which the light emitting display device 1000 is folded through a folding line (FAX).

Referring to FIG. 4, in an embodiment, the light emitting display device 1000 may be a foldable display device. The light emitting display device 1000 may be folded outward or inward based on the folding axis FAX. In case that the light emitting display device 1000 is folded outward based on the folding axis FAX, the display surfaces of the light emitting display device 1000 may be respectively positioned on the outside in the third direction DR3, so that the images may be displayed in directions (e.g., opposite directions). In case that the light emitting display device 1000 is folded inward based on the folding axis FAX, the display surface may not be visually recognized from the outside.

In an embodiment, the light emitting display device 1000 may include a display area DA, a component area EA, and a non-display area PA. The display area DA may be divided into a first-first display area DA1-1, a first-second display area DA1-2, and a folding area FA. The first-first display area DA1-1 and the first-second display area DA1-2 may be positioned on the left and right sides, respectively, based on (or at the center) of the folding axis FAX, and the folding area FA may be positioned between the first-first display area DA1-1 and the first-second display area DA1-2. At this time, in case that the light emitting display device 1000 is folded outward based on the folding axis FAX, the first-first display area DA1-1 and the first-second display area DA1-2 may be positioned on sides (e.g., opposite sides) in the third direction DR3, and the images may be displayed in directions (e.g., opposite directions). For example, in case that the light emitting display device 1000 is folded inward based on the folding axis FAX, the first-first display area DA1-1 and the first-second display area DA1-2 may not be visually recognized from the outside.

Figure 5:
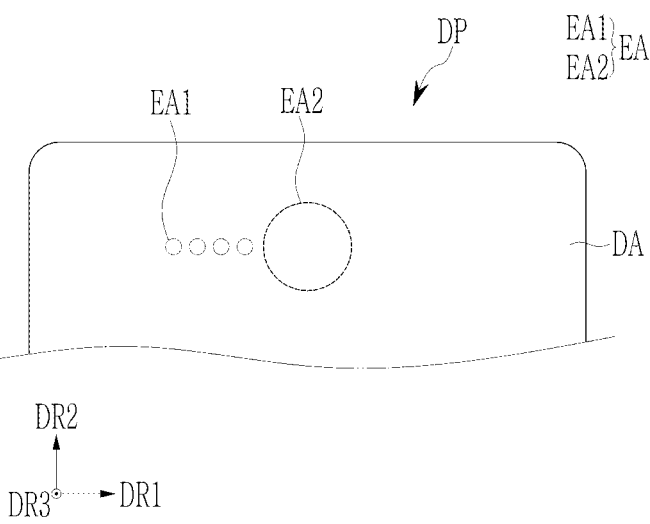
FIG. 5 is a schematic top plan view enlarging a partial area of a light emitting display device according to an embodiment.

FIG. 5 is a schematic top plan view enlarging and showing a partial area of a light emitting display device according to an embodiment.

FIG. 5 shows a part of the display panel DP among the light emitting display devices according to an embodiment and is illustrated with a display panel for a mobile phone.

The display area DA may be positioned on the front of the display panel DP, and the component area EA may be positioned within the display area DA. The component area EA may include a first component area EA1 and a second component area EA2. In the embodiment of FIG. 5, the first component area EA1 may be positioned in the position adjacent to the second component area EA2. In the embodiment of FIG. 5, the first component area EA1 may be positioned to the left of the second component area EA2. The position and number of first component areas EA1 may vary for each embodiment. In FIG. 5, the second optical element ES2 corresponding to the second component area EA2 may be a camera, and the first optical element ES1 corresponding to the first component area EA1 may be an optical sensor.

Light emitting diodes LED and pixel circuit parts for generating and transmitting a light emitting current to each of light emitting diodes LED may be formed in the display area DA. For example, a single light emitting diode LED and a single pixel circuit part are referred to as a pixel PX. In the display area DA, a single pixel circuit part and a single light emitting diode LED may be formed in a one-to-one Relationship. The display area DA is hereinafter also referred to as 'a normal display 'area'. In FIG. 5, the structure of the display panel DP under the cut line is not shown, but the display area DA may be positioned under the cut line.

The display panel DP according to an embodiment may be largely divided into the lower panel layer and the upper panel layer. The lower panel layer may be the part where the light emitting diode LED and the pixel circuit part of the pixel are positioned, and may include an encapsulation layer (referring to 400 of FIG. 34) that covers them. For example, the lower panel layer may be from the substrate (referring to 110 in FIG. 34) to the encapsulation layer (referring to 400 in FIG. 34) and may include an anode Anode, a pixel definition layer (referring to 380 in FIG. 34), an emission layer (referring to EML in FIG. 34), a spacer (referring to 385 in FIG. 34), a functional layer (referring to FL in FIG. 34), and a cathode (referring to Cathode in FIG. 34), and may include an insulating layer, a semiconductor layer, and a conductive layer between the substrate and the anode. For example, the upper panel layer as a part positioned above the encapsulation layer (referring to 400 in FIG. 34) may include a sensing insulating layer (referring to 501, 510, and 511 in FIG. 34) and sensing electrodes (referring to 540 and 541 of FIG. 34) that sense the touch, and may include a light blocking layer (referring to 220 of FIG. 34), a color filter (referring to 230 of FIG. 34), and a planarization layer (referring to 550 of FIG. 34).

The first component area EA1 may be only formed of a transparent layer to pass light therethrough, a conductive layer or a semiconductor layer may be not positioned to pass light, a photosensor area (referring to OPS of FIG. 18) may be formed in the lower panel layer, and an opening (hereinafter also referred to as an additional opening) may be formed at the position corresponding to the first component area EA1 in the pixel definition layer, the light blocking layer, and the color filter of the upper panel layer to have a structure that does not block light. For example, although the photosensor area is positioned in the lower panel layer, in case that there is no opening corresponding to the upper panel layer, the upper panel layer may be the display area DA, not the first component area EA1. A single first component area EA1 may include adjacent photosensor areas. For example, the pixels adjacent to the photosensor area may be included in the first component area EA1. For example, in case that the first optical element ES1 corresponding to the first component area EA1 uses infrared instead of visible light, the first component area EA1 may overlap the light blocking layer 220 that blocks the visible light.

The second component area EA2 may include a second component pixel (referring to UPC in FIG. 19) and a light transmissive area (referring to UTA in FIG. 19), and a space between the adjacent second component pixels may be a light transmissive area. The second component area EA2 according to an embodiment is described in detail more in FIG. 19 to FIG. 34.

For example, the structure of the lower panel layer among the normal pixels of the display area DA is described through FIG. 7 to FIG. 13, and FIG. 34.

For example, a peripheral area may be further positioned outside the display area DA. For example, FIG. 5 shows a display panel for a mobile phone, but in case of a display panel where an optical element is positioned on the back of the display panel, the display panel of FIG. 5 may be applied to a flexible display device. In the case of the flexible display device among the light emitting display device, the position of the second component area EA2 and the first component area EA1 may be different from the position in FIG. 5.

Hereinafter, the structure of the pixel positioned on the lower panel layer of the display panel DP is described with reference to FIG. 6 in detail.

The following pixel structure may be a circuit structure of the normal pixel formed in the display area DA or a circuit structure of the second component pixel formed in the second component area EA2. According to an embodiment, the pixel formed in the first component area EA1 may also have the same circuit structure as that shown in FIG. 6.

Figure 6:
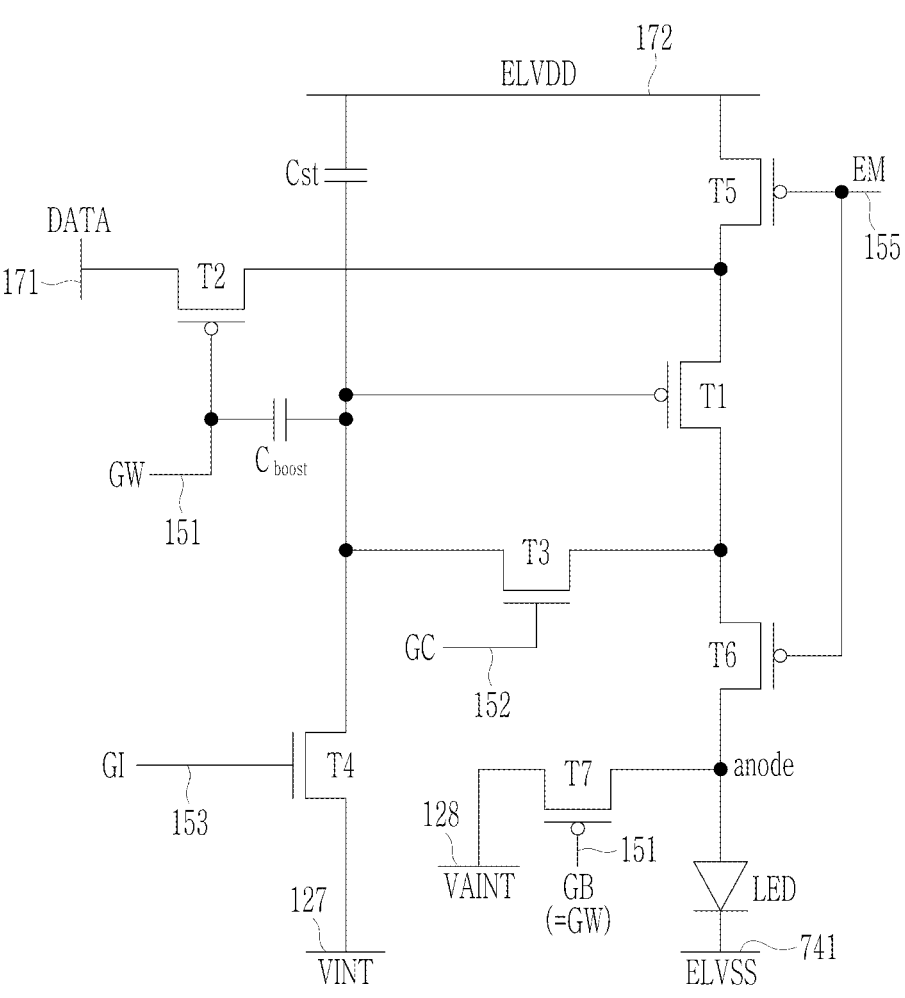
FIG. 6 is a schematic diagram of an equivalent circuit of a pixel included in a light emitting display device according to an embodiment.

FIG. 6 is a schematic diagram of an equivalent circuit of a pixel included in a light emitting display device according to an embodiment.

A pixel according to an embodiment may include transistors T1, T2, T3, T4, T5, T6, and T7, a storage capacitor Cst, a boost capacitor Cboost, and a light emitting diode LED, which are connected to several wires 127, 128, 151, 152, 153, 155, 171, 172, and 741. For example, the transistors and the capacitors except for the light emitting diode LED may form the pixel circuit part. In another example, the boost capacitor Cboost may be omitted.

Wires 127, 128, 151, 152, 153, 155, 171, 172, and 741 may be connected (e.g., electrically connected) to the pixel PX. The plurality of wires include a first initialization voltage line 127, a second initialization voltage line 128, a first scan line 151, a second scan line 152, an initialization control line 153, a light emission control line 155, a data line 171, a driving voltage line 172, and a common voltage line 741.

The first scan line 151 may be connected (e.g., electrically connected) to a scan driver to transmit a first scan signal GW to the second transistor T2 and the seventh transistor T7. A voltage of an opposite polarity to the voltage applied to the first scan line 151 may be applied to the second scan line 152 at the same timing as the signal of the first scan line 151. For example, in case that a negative voltage is applied to the first scan line 151, a positive voltage may be applied to the second scan line 152. The second scan line 152 may transmit a second scan signal GC to the third transistor T3. The initialization control line 153 may transmit an initialization control signal GI to the fourth transistor T4. The light emission control line 155 may transmit a light emission control signal EM to the fifth transistor T5 and the sixth transistor T6.

The data line 171 may be a wire transmitting a data voltage DATA generated from a data driver, and a luminance emitted by the light emitting diode LED may be changed according to a change of the magnitude of the light emitting current transmitted to the light emitting diode LED. The driving voltage line 172 may apply the driving voltage ELVDD. The first initialization voltage line 127 may transmit the first initialization voltage VINT, and the second initialization voltage line 128 may transmit the second initialization voltage VAINT. The common voltage line 741 may apply a common voltage ELVSS to the cathode of the light emitting diode LED. In an embodiment, the voltages applied to the driving voltage line 172, the first and second initialization voltage lines 127 and 128, and the common voltage line 741 may be a constant voltage, respectively.

The driving transistor T1 (or a first transistor) may be a p-type transistor and may have a silicon semiconductor as a semiconductor layer. The driving transistor T1 may be a transistor that adjusts the magnitude of the light emitting current output to the anode of the light emitting diode LED according to the magnitude of the voltage (e.g., the voltage stored in the storage capacitor Cst) of the gate electrode of the driving transistor T1. Since the brightness of the light emitting diode LED is adjusted according to the magnitude of the light emitting current output to the anode of the light emitting diode LED, the light emitting luminance of the light emitting diode LED may be adjusted according to the data voltage DATA applied to the pixel PX. For example, the first electrode of the driving transistor T1 may receive the driving voltage ELVDD and may be connected (e.g., electrically connected) to the driving voltage line 172 through the fifth transistor T5. For example, the first electrode of the driving transistor T1 may be also connected to the second electrode of the second transistor T2 to receive a data voltage DATA. For example, the second electrode of the driving transistor T1 may output the light emitting current to the light emitting diode LED and may be connected (e.g., electrically connected) to the anode of the light emitting diode LED via the sixth transistor T6 (hereinafter referred to as an output control transistor). For example, the second electrode of the driving transistor T1 may be also connected to the third transistor T3, and the data voltage DATA applied to the first electrode may be transferred to the third transistor T3. For example, the gate electrode of the driving transistor T1 may be connected (e.g., electrically connected) to an electrode (hereinafter referred to as 'a second storage electrode') of the storage capacitor Cst. The voltage of the gate electrode of the driving transistor T1 may be changed according to the voltage stored in the storage capacitor Cst, and accordingly, the light emitting current output by the driving transistor T1 may be changed. The storage capacitor Cst may function to keep the voltage of the gate electrode of the driving transistor T1 constant for one frame. For example, the gate electrode of the driving transistor T1 may also be connected (e.g., electrically connected) to the third transistor T3 so that the data voltage DATA applied to the first electrode of the driving transistor T1 may be transmitted to the gate electrode of the driving transistor T1 through the third transistor T3. For example, the gate electrode of the driving transistor T1 may be also connected to the fourth transistor T4, and may be initialized by receiving the first initialization voltage VINT.

The second transistor T2 may be a p-type transistor and may have a silicon semiconductor as a semiconductor layer. The second transistor T2 may be a transistor that receives the data voltage DATA into the pixel PX. The gate electrode of the second transistor T2 may be connected (e.g., electrically connected) to the first scan line 151 and an electrode (hereinafter referred to as 'a lower boost electrode') of the boost capacitor Cboost. The first electrode of the second transistor T2 may be connected (e.g., electrically connected) to the data line 171. The second electrode of the second transistor T2 may be connected (e.g., electrically connected) to the first electrode of the driving transistor T1. In case that the second transistor T2 is turned on by the negative voltage of the first scan signal GW transmitted through the first scan line 151, the data voltage DATA transferred through the data line 171 may be transmitted to the first electrode of the driving transistor T1, and finally the data voltage DATA may be transmitted to the gate electrode of the driving transistor T1 and stored in the storage capacitor Cst.

The third transistor T3 may be an n-type transistor and may have an oxide semiconductor as a semiconductor layer. The third transistor T3 may electrically connect the second electrode of the driving transistor T1 and the gate electrode of the driving transistor T1. As a result, the third transistor T3 may be a transistor that operates to compensate the data voltage DATA by the threshold voltage of the driving transistor T1 and stored in the second storage electrode of the storage capacitor Cst. The gate electrode of the third transistor T3 may be connected (e.g., electrically connected) to the second scan line 152, and the first electrode of the third transistor T3 may be connected (e.g., electrically connected) to the second electrode of the driving transistor T1. The second electrode of the third transistor T3 may be connected (e.g., electrically connected) to the second storage electrode of the storage capacitor Cst, the gate electrode of the driving transistor T1, and the other electrode (hereinafter referred to as 'an upper boost electrode') of the boost capacitor Cboost. The third transistor T3 may be turned on by the positive voltage of the second scan signal GC transmitted through the second scan line 152 to connect the gate electrode of the driving transistor T1 and the second electrode of the driving transistor T1 and to transmit the voltage applied to the gate electrode of the driving transistor T1 to the second storage electrode of the storage capacitor Cst to be stored to the storage capacitor Cst. At this time, the voltage stored in the storage capacitor Cst may be stored in a state in which the voltage of the gate electrode of the driving transistor T1 in case that the driving transistor T1 is turned off is stored, so that the threshold voltage Vth of the driving transistor T1 may be compensated.

The fourth transistor T4 may be an n-type transistor and may have an oxide semiconductor as a semiconductor layer. The fourth transistor T4 may function to initialize the gate electrode of the driving transistor T1 and the second storage electrode of the storage capacitor Cst. The gate electrode of the fourth transistor T4 may be connected (e.g., electrically connected) to the initialization control line 153, and the first electrode of the fourth transistor T4 may be connected (e.g., electrically connected) to the first initialization voltage line 127. The second electrode of the fourth transistor T4 may be connected (e.g., electrically connected) to the second electrode of the third transistor T3, the second storage electrode of the storage capacitor Cst, the gate electrode of the driving transistor T1, and the upper boost electrode of the boost capacitor Cboost. The fourth transistor T4 may be turned on by the positive voltage of the initialization control signal GI received through the initialization control line 153. For example, the first initialization voltage Vinit may be transmitted to the gate electrode of the driving transistor T1, the second storage electrode of the storage capacitor Cst, and the upper boost electrode of the boost capacitor Cboost to be initialized.

The fifth transistor T5 and the sixth transistor T6 may be p-type transistors, and have a silicon semiconductor as a semiconductor layer.

The fifth transistor T5 may function to transmit the driving voltage ELVDD to the driving transistor T1. The gate electrode of the fifth transistor T5 may be connected (e.g., electrically connected) to the light emission control line 155, the first electrode of the fifth transistor T5 may be connected (e.g., electrically connected) to the driving voltage line 172, and the second electrode of the fifth transistor T5 may be connected (e.g., electrically connected) to the first electrode of the driving transistor T1.

The sixth transistor T6 may function to transmit the light emitting current output from the driving transistor T1 to the light emitting diode LED. The gate electrode of the sixth transistor T6 may be connected (e.g., electrically connected) to the light emission control line 155, the first electrode of the sixth transistor T6 may be connected (e.g., electrically connected) to the second electrode of the driving transistor T1, and the second electrode of the sixth transistor T6 may be connected (e.g., electrically connected) to the anode of the light emitting diode LED.

The seventh transistor T7 may be a p-type transistor or an n-type transistor, and the semiconductor layer may include a silicon semiconductor or an oxide semiconductor, in an embodiment of FIG. 6, the seventh transistor T7 may be a p-type transistor and may include a silicon semiconductor. The seventh transistor T7 may function to initialize the anode of the light emitting diode LED. The gate electrode of the seventh transistor T7 may be connected (e.g., electrically connected) to first scan line 151, the first electrode of the seventh transistor T7 may be connected (e.g., electrically connected) to the anode of the light emitting diode LED, and the second electrode of the seventh transistor T7 may be connected (e.g., electrically connected) to the second initialization voltage line 128. For example, the gate electrode of the seventh transistor T7 may be connected (e.g., electrically connected) to the first scan line 151 of the previous pixel PX, so that the gate electrode of the seventh transistor T7 may not be connected (e.g., electrically connected) to the same first scan line 151 as the gate electrode of the second transistor T2 included in the same pixel PX, but may be connected (e.g., electrically connected) to the same first scan line 151 as the gate electrode of the second transistor T2 of the previous pixel PX. In case that the seventh transistor T7 is turned on by the negative voltage of the first scan line 151, the second initialization voltage VAINT may be applied to the anode of the light emitting diode LED to be initialized. For example, the gate electrode of the seventh transistor T7 may be connected (e.g., electrically connected) to a separate bypass control line and may be controlled by the first scan line 151 and separate wiring. According to an embodiment, the second initialization voltage line 128 to which the second initialization voltage VAINT is applied may be the same as the first initialization voltage line 127 to which the first initialization voltage VINT is applied.

Although it has been described that a single pixel PX includes seven transistors T1 to T7 and two capacitors (e.g., the storage capacitor Cst and the boost capacitor Cboost), embodiments are not limited thereto, and the boost capacitor Cboost may be excluded according to an embodiment. Although the embodiment in which the third transistor and the fourth transistor are formed of the n-type transistor is described, only one of them may be formed as an n-type transistor or the other transistor (e.g., the seventh transistor, etc.) may be formed as an n-type transistor.

In the above, the circuit structure of the pixel PX formed in the display area DA was described with reference to FIG. 6.

Hereinafter, the detailed planar structure and stacked structure of the lower panel layer of the pixel formed in the display area DA and the first component area EA1 are described through FIG. 7 to FIG. 18, and FIG. 34. For example, in case that the photosensor area (referring to OPS of FIG. 18) overlaps in a plan view a layer that does not transmit light such as a light blocking layer (referring 220 of FIG. 34) and/or a pixel definition layer (referring to 380 of FIG. 34), the pixel may be a normal pixel positioned in the display area DA. For example, in case that the photosensor area (referring to OPS of FIG. 18) overlaps only the layer through which light passes, the pixel may be a pixel (also referred to as the first component pixel) positioned in the first component area EA1. in case that the first optical element ES1 positioned on the rear surface is an infrared sensor, the photosensor area of the first component pixel (referring to OPS of FIG. 18) may overlap the light blocking layer in a plan view.

FIG. 7 to FIG. 18 are schematic views showing a structure of each layer according to a manufacturing order of a lower panel layer among a normal pixel of a light emitting display device according to an embodiment.

Referring to FIG. 7, a metal layer BML may be positioned on a substrate 110.

The substrate 110 may include a material that does not bend due to a rigid characteristic such as glass, or a flexible material that is bendable such as plastic or polyimide. In the case of the flexible substrate, as shown in FIG. 34, the substrate 110 may have a structure that a double-layered structure of polyimide and a barrier layer formed of an inorganic insulating material thereon is formed in a double layer.

The metal layer BML may include expansion parts BML1 and a connection part BML2 connecting the expansion parts BML1 to each other. The expansion part BML1 of the metal layer BML may be formed at a position overlapping the channel 1132 of the driving transistor T1 in a plan view among the first semiconductor layer formed later. The metal layer BML may be also called a lower shielding layer, may include a metal or a metal alloy such as copper (Cu), molybdenum (Mo), aluminum (Al), titanium (Ti), etc., and may additionally include amorphous silicon and may consist of a single layer or multiple layers.

Figure 34:
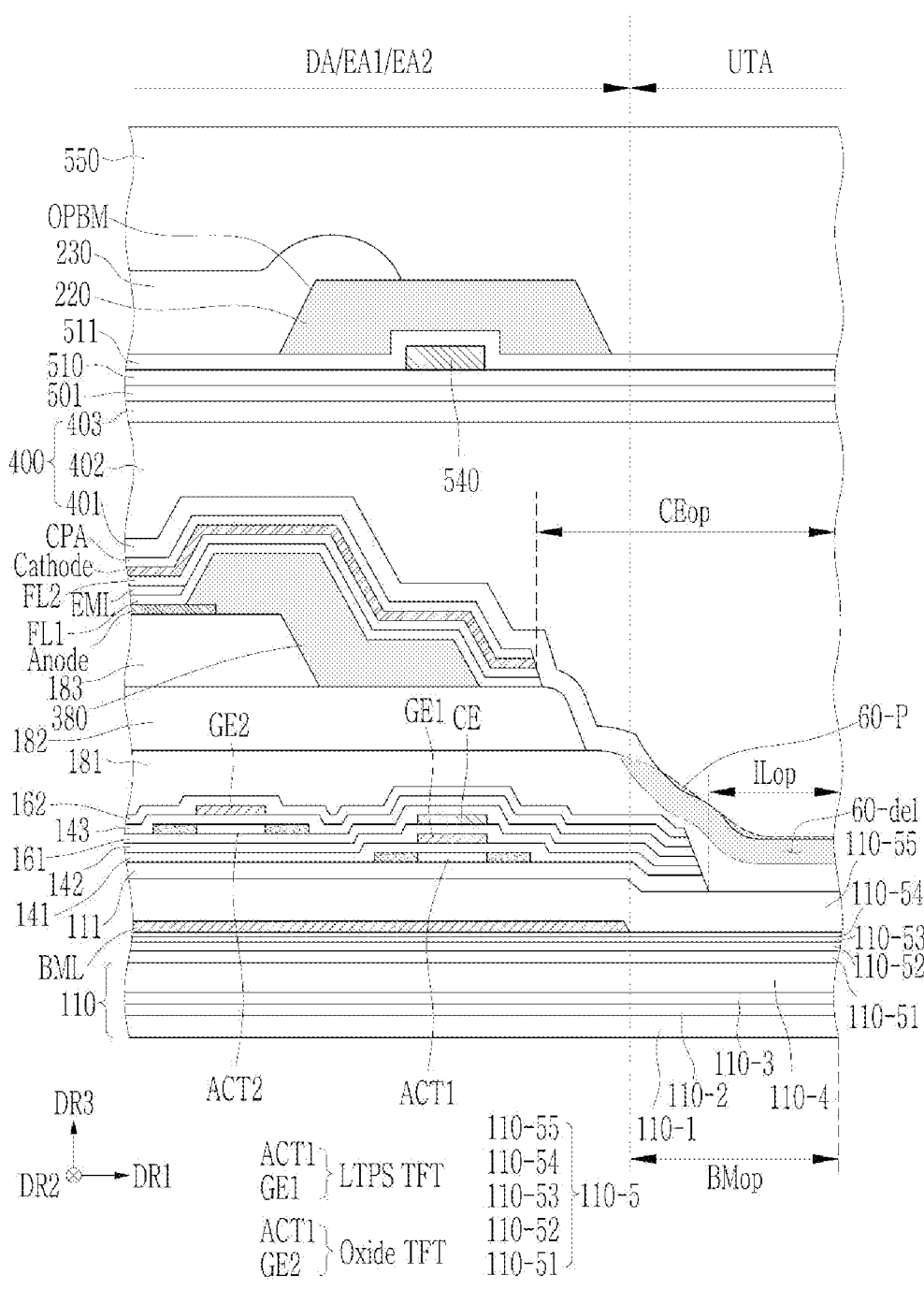
FIG. 34 is a schematic cross-sectional view of a light emitting display device according to an embodiment.

Referring to FIG. 34, a buffer layer 111 covering the substrate 110 and the metal layer BML may be disposed on the substrate 110 and the metal layer BML. The buffer layer 111 may function to block penetration of impurity elements into the first semiconductor layer 130, and may be an inorganic insulating layer including a silicon oxide ($SiO_x$), a silicon nitride (SiNx), a silicon oxynitride ($SiO_xN_y$), or the like.

On the buffer layer 111, as shown in FIG. 8, a first semiconductor layer 130 formed of a silicon semiconductor (e.g., a polycrystalline semiconductor) may be positioned. The first semiconductor layer 130 may include a channel 1132, a first area 1131, and a second area 1133 of the driving transistor T1. For example, the first semiconductor layer 130 may include channels of the second transistor T2, the fifth transistor T5, the sixth transistor T6, and the seventh transistor T7 as well as the driving transistor T1, and may have areas having a conductive layer characteristic by a plasma process or by doping on sides (e.g., opposite sides) of each channel to function as the first and second electrodes.

The channel 1132 of the driving transistor T1 may have a curved shape that is bent in a "U" shape in a plan view. However, the shape of channel 1132 of the driving transistor T1 is not limited thereto, and may be variously changed. For example, the channel 1132 of the driving transistor T1 may be bent into various different shapes such as an "S" shape or may have a bar shape. A first area 1131 and a second area 1133 of the driving transistor T1 may be positioned on sides (e.g., opposite sides) of the channel 1132 of the driving transistor T1. The first area 1131 and the second area 1133 positioned in the first semiconductor layer may function as the first electrode and the second electrode of the driving transistor T1.

A channel, a first area, and a second area of the second transistor T2 may be positioned in the portion 1134 extending downward from the first area 1131 of the driving transistor T1 in the first semiconductor layer 130. A channel, a first area, and a second area of the fifth transistor T5 may be positioned in the portion 1135 extending upward from the first area 1131 of the driving transistor T1. A channel, a first area, and a second area of the seventh transistor T7 may be positioned in the portion 1137 that is further extended with being bent from the portion 1136 of the first semiconductor layer 130. A channel, a first area and a second area of the seventh transistor T7 may be positioned in the portion 1137 that is bent from the portion 1136 of the first semiconductor layer 130 and further may extend upward.

Referring to FIG. 34, a first gate insulating layer 141 may be positioned on the first semiconductor layer 130 including the channel 1132, the first area 1131, and the second area 1133 of the driving transistor T1. The first gate insulating layer 141 may be an inorganic insulating layer including a silicon oxide ($SiO_x$), a silicon nitride ($SiN_x$), a silicon oxynitride ($SiO_xN_y$), or the like.

Referring to FIGS. 9 and 34, a first gate conductive layer GAT1 including a gate electrode 1151 of the driving transistor T1 may be positioned on the first gate insulating layer 141. The first gate conductive layer GAT1 may include a gate electrode of each of the second transistor T2, the fifth transistor T5, the sixth transistor T6, and the seventh transistor T7 as well as the driving transistor T1. The gate electrode 1151 of the driving transistor T1 may overlap the channel 1132 of the driving transistor T1. The channel 1132 of driving transistor T1 may be covered by the gate electrode 1151 of the driving transistor T1.

The first gate conductive layer GAT1 may further include a first scan line 151 and a light emission control line 155. The first scan line 151 and the light emission control line 155 may extend in an approximately horizontal direction (hereinafter also referred to as a first direction DR1). The first scan line 151 may be connected (e.g., electrically connected) to the gate electrode of the second transistor T2, and the first scan line 151 may be integral with the gate electrode of the second transistor T2. The first scan line 151 may be connected (e.g., electrically connected) or integral with the gate electrode of the seventh transistor T7 of the next pixel PX. The first scan line 151 may include a lower boost electrode 151a having an extended width, and overlap an upper boost electrode 3138t to be described below to form a boost capacitor Cboost.

For example, the light emission control line 155 may be connected (e.g., electrically connected) to the gate electrode of the fifth transistor T5 and the gate electrode of the sixth transistor T6, and the light emission control line 155 and the gate electrode of the fifth transistor T5 and the sixth transistor T6 may be integral with each other.

The first gate conductive layer GAT1 may include a metal such as copper (Cu), molybdenum (Mo), aluminum (Al), titanium (Ti), or a metal alloy, and may be formed as a single layer or multiple layers.

After the first gate conductive layer GAT1 including the gate electrode 1151 of the driving transistor T1 is formed, a plasma treatment or a doping process may be performed to make the exposed area of the first semiconductor layer conductive. For example, the first semiconductor layer covered by the first gate conductive layer GAT1 may not be conductive, and the portion of the first semiconductor layer not covered by the first gate conductive layer GAT1 may have the same characteristic as the conductive layer. As a result, the transistor including the conductive portion may have a p-type transistor characteristic, and the driving transistor T1, the second transistor T2, the fifth transistor T5, the sixth transistor T6, and the seventh transistor T7 may be p-type transistors or n-type transistors.

Referring to FIG. 34, a second gate insulating layer 142 may be positioned on the first gate conductive layer GAT1 including the gate electrode 1151 of the driving transistor T1 and the first gate insulating layer 141. The second gate insulating layer 142 may be an inorganic insulating layer including a silicon oxide ($SiO_x$), a silicon nitride ($SiN_x$), a silicon oxynitride ($SiO_xN_y$), or the like.

Figure 10:
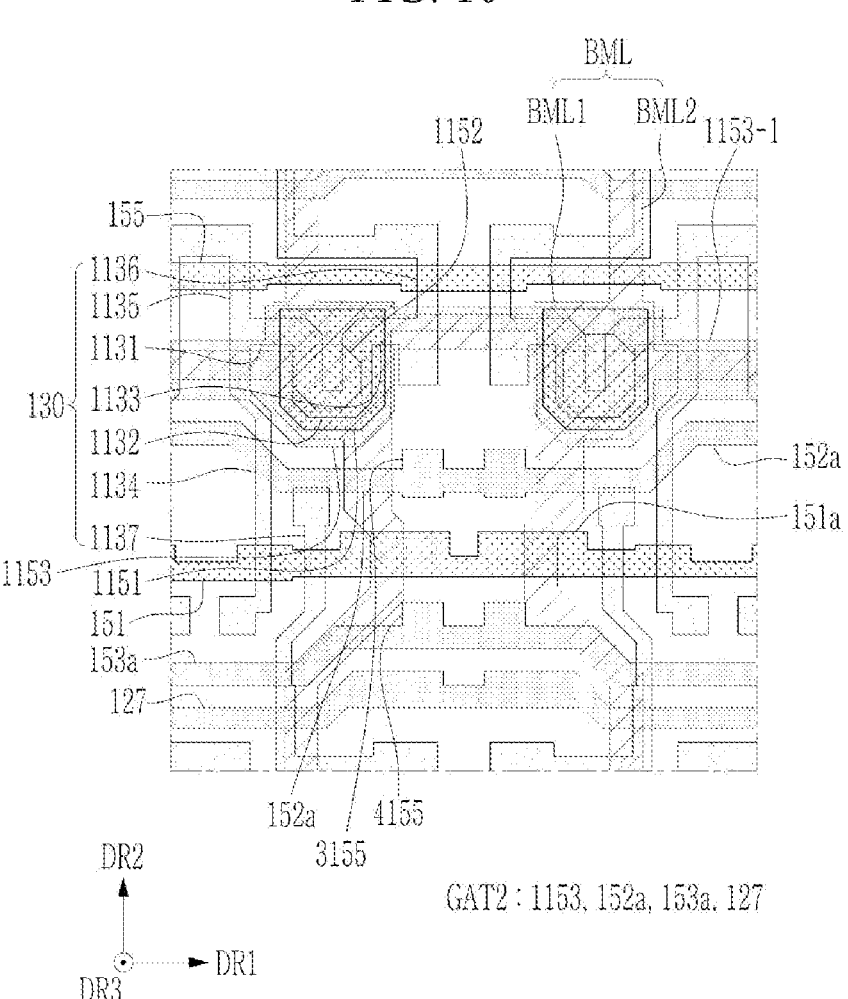
Figure 11:
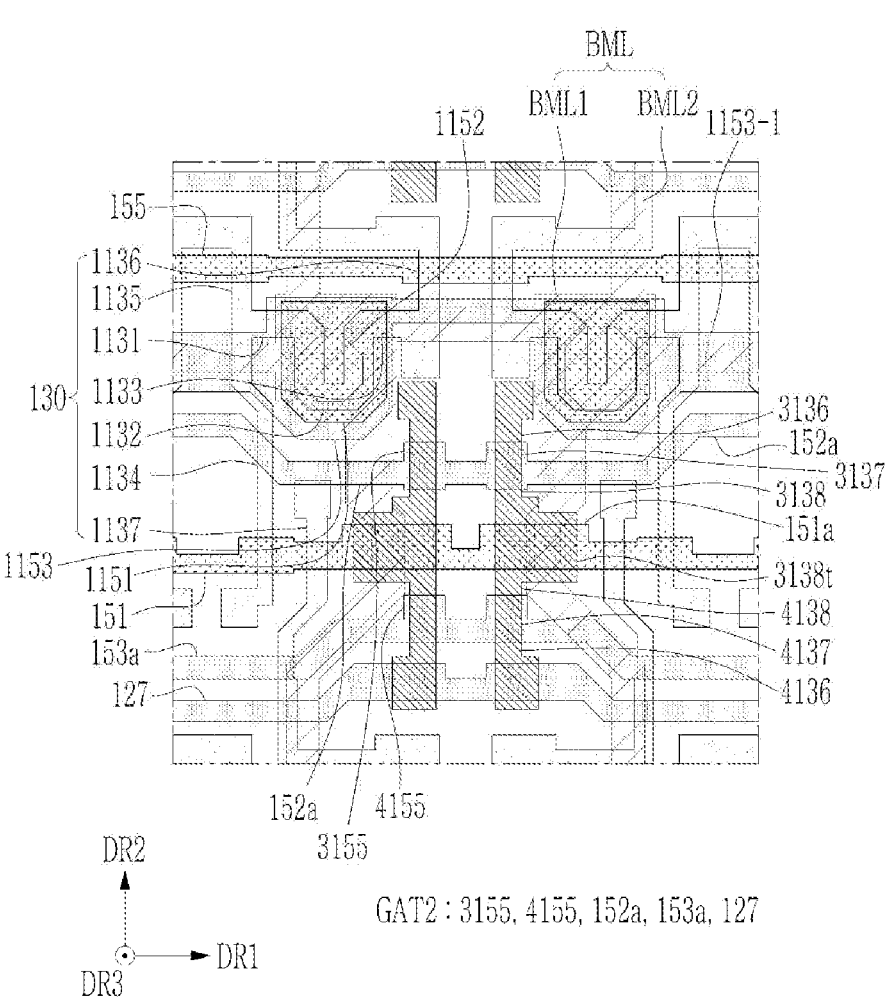

Referring to FIGS. 10 and 11, a second gate conductive layer GAT2 may include a first storage electrode 1153 of a storage capacitor Cst, a lower shielding layer 3155 of a third transistor T3, and a lower shielding layer 4155 of a fourth transistor T4 disposed on the second gate insulating layer 142. The lower shielding layers 3155 and 4155 may be positioned below the channels of the third transistor T3 and the fourth transistor T4, respectively, and may function to shield from optical or electromagnetic interference provided to the channel from the lower side.

Figure 12:
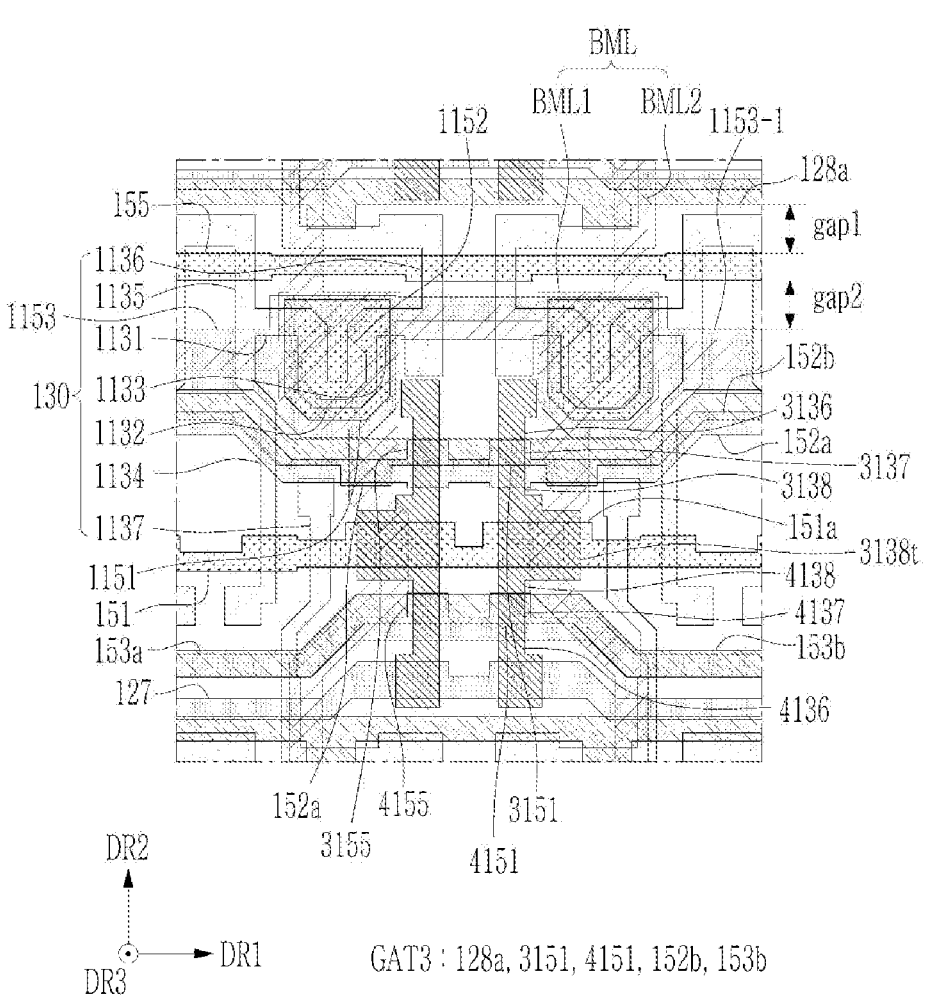

The first storage electrode 1153 may overlap the gate electrode 1151 of the driving transistor T1 to form a storage capacitor Cst. An opening 1152 may be formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 may include a connection part 1153-1 extending in a horizontal direction (e.g., the first direction DR1) to connect the adjacent first storage electrodes 1153 to each other. The connection part 1153-1 of the first storage electrode 1153 may be positioned to have an upper side separated by a certain distance from the upper side of the first storage electrode 1153. In this way, by forming the connection part 1153-1 of the first storage electrode 1153, as shown in FIG. 12, an interval (or distance) gap1 and an interval (or distance) gap2 may be formed to have the same spacing in a plan view.

The lower shielding layer 3155 of the third transistor T3 may overlap the channel 3137 and the gate electrode 3151 of the third transistor T3. The lower shielding layer 4155 of the fourth transistor T4 may overlap the channel 4137 and the gate electrode 4151 of the fourth transistor T4.

The second gate conductive layer GAT2 may further include a lower second scan line 152a, a lower initialization control line 153a, and a first initialization voltage line 127. The lower second scan line 152a, the lower initialization control line 153a, and the first initialization voltage line 127 may extend approximately in the horizontal direction (e.g., the first direction DR1). The lower second scan line 152a may be connected (e.g., electrically connected) to and may be integral with the lower shielding layer 3155 of the third transistor T3. The lower initialization control line 153a may be connected (e.g., electrically connected) to the lower shielding layer 4155 of the fourth transistor T4 and may be integral with each other.

The second gate conductive layer GAT2 may include a metal or a metal alloy such as copper (Cu), molybdenum (Mo), aluminum (Al), or titanium (Ti), and may be formed as a single layer or multiple layers.

Referring to FIG. 34, a first interlayer insulating layer 161 may be positioned on the second gate conductive layer GAT2 including the first storage electrode 1153 of the storage capacitor Cst, the lower shielding layer 3155 of the third transistor T3, and the lower shielding layer 4155 of the fourth transistor T4. The first interlayer insulating layer 161 may include an inorganic insulating layer including a silicon oxide ($SiO_x$), a silicon nitride ($SiN_x$), a silicon oxynitride ($SiO_xN_y$), and the like, and an inorganic insulating material may be thickly formed according to an embodiment.

Referring to FIG. 11, on the first interlayer insulating layer 161, an oxide semiconductor layer including a channel 3137, a first area 3136, and a second area 3138 of the third transistor T3, and a channel 4137, a first area 4136, and a second area 4138 of the fourth transistor T4, may be positioned. For example, the oxide semiconductor layer may include an upper boost electrode 3138t of the boost capacitor Cboost.

The channel 3137, the first area 3136, and the second area 3138 of the third transistor T3, and the channel 4137, the first area 4136, and the second area 4138 of the fourth transistor T4 may be connected to each other to be integral with each other. The first area 3136 and the second area 3138 of third transistor T3 may be positioned on sides (e.g., opposite sides) of the channel 3137 of the third transistor T3, and the first area 4136 and the second area 4138 of the fourth transistor T4 may be positioned on sides (e.g., opposite sides) of the channel 4137 of the fourth transistor T4. The second area 3138 of the third transistor T3 may be connected to the second area 4138 of the fourth transistor T4. The channel 3137 of the third transistor T3 may overlap the lower shielding layer 3155, and the channel 4137 of fourth transistor T4 may overlap the lower shielding layer 4155.

The upper boost electrode 3138t of the boost capacitor Cboost may be positioned between the second area 3138 of the third transistor T3 and the second area 4138 of the fourth transistor T4. The upper boost electrode 3138t of the boost capacitor Cboost may overlap the lower boost electrode 151a of the boost capacitor Cboost positioned on the first gate conductive layer GAT1 to form the boost capacitor Cboost.

Referring to FIG. 34, a third gate insulating layer 143 may be positioned on the oxide semiconductor layer including the channel 3137, the first area 3136 and the second area 3138 of the third transistor T3, the channel 4137, the first area 4136 and the second area 4138 of the fourth transistor T4, and the upper boost electrode 3138t of the boost capacitor Cboost.

The third gate insulating layer 143 may be positioned on the entire surface of the oxide semiconductor layer and the first interlayer insulating layer 161. Accordingly, the third gate insulating layer 143 may cover the upper surface and the side of the channel 3137, the first area 3136 and the second area 3138 of the third transistor T3, the channel 4137, the first area 4136, and the second area 4138 of the fourth transistor T4, and the upper boost electrode 3138t of the boost capacitor Cboost. However, embodiments are not limited thereto, and the third gate insulating layer 143 may not be positioned on the entire surface of the oxide semiconductor layer and the first interlayer insulating layer 161. For example, the third gate insulating layer 143 may overlap the channel 3137 of the third transistor T3 and may not overlap the first area 3136 and the second area 3138. For example, the third gate insulating layer 143 may overlap the channel 4137 of the fourth transistor T4 and may not overlap the first area 4136 and the second area 4138.

The third gate insulating layer 143 may include an inorganic insulating layer including a silicon oxide ($SiO_x$), a silicon nitride ($SiN_x$), a silicon oxynitride ($SiO_xN_y$), or the like.

Referring to FIG. 12, on the third gate insulating layer 143, a third gate conductive layer GAT3 including a gate electrode 3151 of the third transistor T3, and a gate electrode 4151 of the fourth transistor T4 may be positioned.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer GAT3 may further include an upper second scan line 152b and an upper initialization control line 153b.

The upper second scan line 152b, and the upper initialization control line 153b may extend in approximately the horizontal direction (e.g., the first direction DR1). The upper second scan line 152b may include the gate electrode 3151 of the third transistor T3, and may form the second scan line 152 together with the lower second scan line 152a. The upper initialization control line 153*b* may include the gate electrode 4151 of the fourth transistor T4, and may form the initialization control line 153 together with the lower initialization control line 153*a*.

For example, the third gate conductive layer GAT3 may further include a lower second initialization voltage line 128*a*. The lower second initialization voltage line 128*a* may extend in approximately the horizontal direction (e.g., the first direction DR1), and the second initialization voltage VAINT may be applied.

Referring to the embodiment of FIG. 12, based on the light emission control line 155 positioned on the first gate conductive layer GAT1 in a plan view, the interval gap1 in a plane up to the lower second initialization voltage line 128*a* positioned in the third gate conductive layer GAT3 and the interval gap2 in a plane up to the connection part 1153-1 of the first storage electrode 1153 positioned in the second gate conductive layer GAT2 may be the same as each other. For example, the interval gap2 may be an interval (or distance) from the extended part of the light emission control line 155 to the connection part 1153-1 of the first storage electrode 1153, but according to an embodiment, the interval gap2 may be an interval (or distance) from the portion that is not the extended part of the light emission control line 155 to the connection part 1153-1 of the first storage electrode 1153.

As described above, the portion in which the two intervals (or two distances) gap1 and gap2 are constant may overlap, in a plan view, an extension part FL-SD1 (hereinafter also referred to as a first extension part) and/or the anode Anode positioned on a first data conductive layer SD1, which will be described below, and may overlap, in a plan view, red and/or blue openings OPr and/or OPb among the openings formed in the pixel definition layer 380 (see, e.g., FIG. 18). In addition, the center portion of the red and/or blue openings OPr and/or OPb of the pixel definition layer 380 may be positioned on the light emission control line 155, which is the center portion of two intervals gap1 and gap2 in a plan view. For example, the upper boundary of the red and/or blue openings OPr and/or OPb of the pixel definition layer 380 may overlap the lower second initialization voltage line 128*a* in a plan view, and the lower boundary of the red, green, and blue openings OPr, OPb, and OPb of the pixel definition layer 380 may overlap the first storage electrode 1153 in a plan view.

As described above, in the red and blue openings OPr and OPb and/or the anode Anode of the red and/or blue of the pixel definition layer 380, three wirings positioned thereunder may have the same intervals gap1 and gap2 to each other, so that the anode Anode of the red and/or blue light emitting diodes LED may be further planarized. As a result, the display quality may be improved by preventing the light reflected from the anode Anode from spreading asymmetrically, and by reducing a reflection color band due to a color spread (e.g., a color separation) caused by the reflected light.

The third gate conductive layer GAT3 may include a metal or a metal alloy such as copper (Cu), molybdenum (Mo), aluminum (Al), or titanium (Ti), and may be formed of a single layer or multiple layers.

After forming the third gate conductive layer GAT3 including the gate electrode 3151 of the third transistor T3 and the gate electrode 4151 of the fourth transistor T4, the portion of the oxide semiconductor layer covered by the third gate conductive layer GAT3 may be formed into the channel by a plasma treatment or a doping process, and the portion of the oxide semiconductor layer not covered by the third gate conductive layer GAT3 may be conductive. The channel 3137 of the third transistor T3 may be positioned under the gate electrode 3151 to overlap the gate electrode 3151. The first area 3136 and the second area 3138 of the third transistor T3 may not overlap the gate electrode 3151. The channel 4137 of the fourth transistor T4 may be positioned under the gate electrode 4151 to overlap the gate electrode 4151. The first area 4136 and the second area 4138 of the fourth transistor T4 may not overlap the gate electrode 4151. The upper boost electrode 3138*t* may not overlap the third gate conductive layer GAT3. The transistor including an oxide semiconductor layer may have characteristics of an n-type transistor.

Referring to FIG. 34, a second interlayer insulating layer 162 may be positioned on the third gate conductive layer GAT3 including the gate electrode 3151 of the third transistor T3 and the gate electrode 4151 of the fourth transistor T4. The second interlayer insulating layer 162 may have a single-layer or multi-layered structure. The second interlayer insulating layer 162 may include an inorganic insulating material such as a silicon nitride ($SiN_x$), a silicon oxide ($SiO_x$), or a silicon oxynitride ($SiO_xN_y$), and may include an organic material according to an embodiment.

Figure 13:
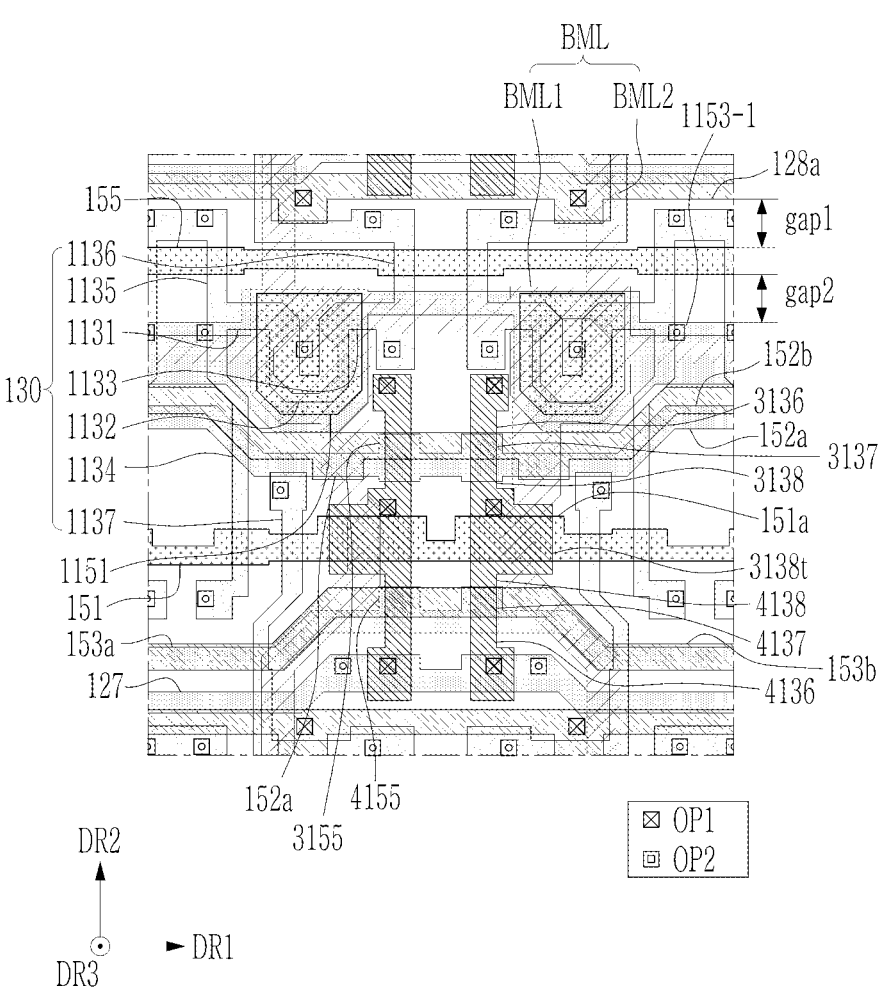

Referring to FIG. 13, two types of openings OP1 and OP2 may be formed in the second interlayer insulating layer 162. Two types of openings OP1 and OP2 may be formed by using different masks.

The opening OP1 may be an opening formed in at least one of the second interlayer insulating layer 162, the third gate insulating layer 143, the first interlayer insulating layer 161, the second gate insulating layer 142, and the first gate insulating layer 141 and may expose the first semiconductor layer 130, the first gate conductive layer GAT1, or the second gate conductive layer GAT2.

The opening OP2 may be an opening formed in the second interlayer insulating layer 162 and/or the third gate insulating layer 143 and may expose the oxide semiconductor layer or the third gate conductive layer GAT3.

At least one of the opening OP1 may overlap at least a portion of the gate electrode 1151 of the driving transistor T1, and may also be formed in the third gate insulating layer 143, the first interlayer insulating layer 161, and the second gate insulating layer 142. For example, at least one of the openings OP1 may overlap the opening 1152 of the first storage electrode 1153, and may be positioned inside the opening 1152 of the first storage electrode 1153.

At least one of the openings OP2 may overlap at least a portion of the boost capacitor Cboost, and may be further formed in the third gate insulating layer 143.

Another one of the openings OP1 may overlap at least a part of the second area 1133 of the driving transistor T1 and may be further formed in the third gate insulating layer 143, the first interlayer insulating layer 161, the second gate insulating layer 142, and the first gate insulating layer 141.

Another one of the openings OP2 may overlap at least a part of the first area 3136 of the third transistor T3 and may be formed in the third gate insulating layer 143.

Figure 14:
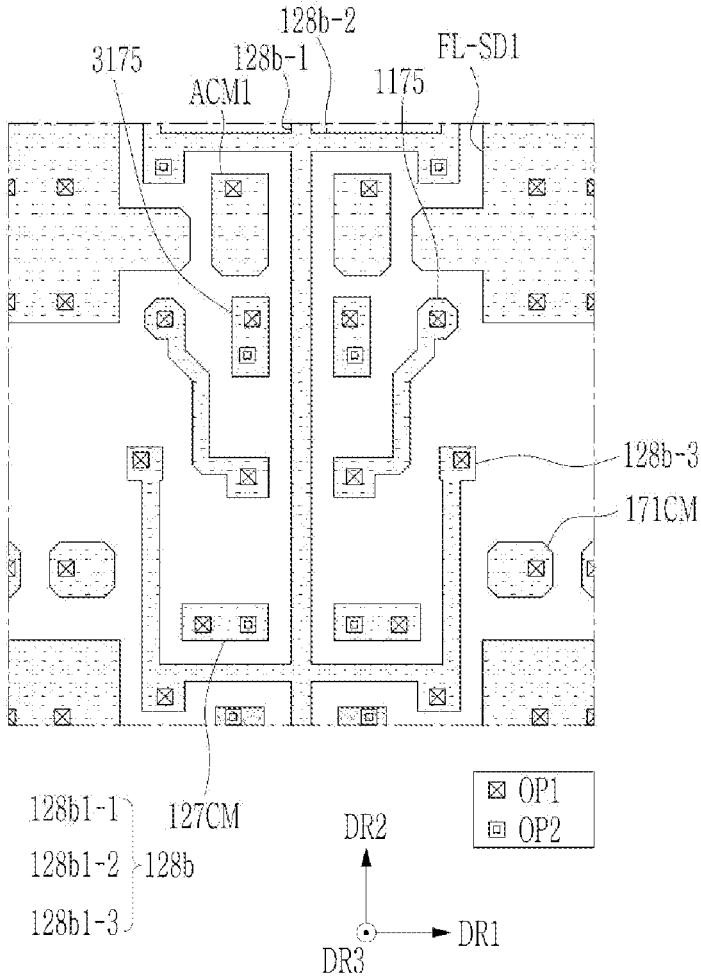
Figure 15:
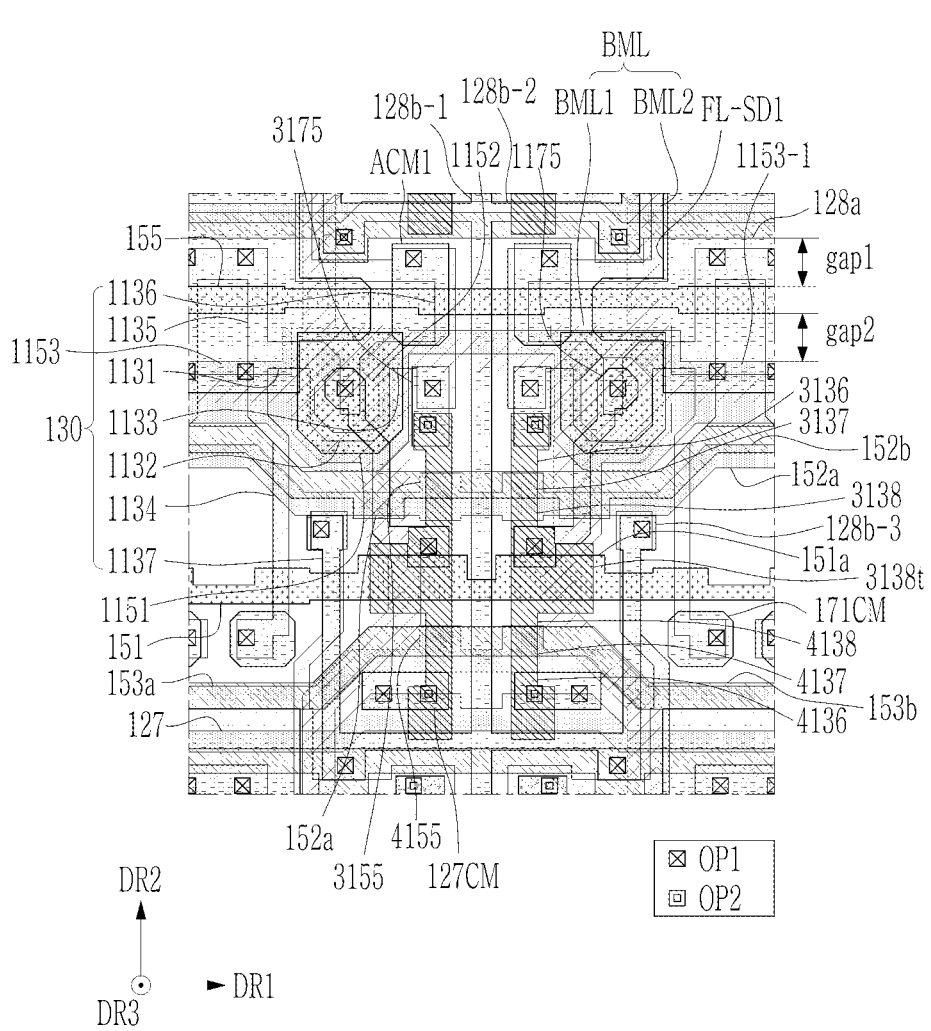

Referring to FIG. 14 and FIG. 15, a first data conductive layer SD1 including a first connection electrode 1175 and a second connection electrode 3175 may be positioned on the second interlayer insulating layer 162. FIG. 14 is a schematic top plan view showing the first data conductive layer SD1 and openings OP1 and OP2 since it is difficult to readily recognize the first data conductive layer SD1 in FIG. 15, and FIG. 15 is a schematic top plan view showing all layers below the first data conductive layer SD1.

The first connection electrode 1175 may overlap the gate electrode 1151 of the driving transistor T1. The first connection electrode 1175 may be connected (e.g., electrically connected) to the gate electrode 1151 of the driving transistor T1 through the opening OP1 and the opening 1152 of the first storage electrode 1153. The first connection electrode 1175 may overlap the boost capacitor Cboost. The first connection electrode 1175 may be connected (e.g., electrically connected) to the upper boost electrode 3138*t* of the boost capacitor Cboost through the opening OP2. Accordingly, the gate electrode 1151 of the driving transistor T1 and the upper boost electrode 3138*t* of the boost capacitor Cboost may be connected (e.g., electrically connected) by the first connection electrode 1175. For example, the gate electrode 1151 of the driving transistor T1 may also be connected (e.g., electrically connected) to the second area 3138 of the third transistor T3 and the second area 4138 of the fourth transistor T4 by the first connection electrode 1175.

The second connection electrode 3175 may overlap the second area 1133 of the driving transistor T1. The second connection electrode 3175 may be connected (e.g., electrically connected) to the second area 1133 of the driving transistor T1 through the opening OP1. The second connection electrode 3175 may overlap the first area 3136 of the third transistor T3. The second connection electrode 3175 may be connected (e.g., electrically connected) to the first area 3136 of the third transistor T3 through the opening OP2. Accordingly, the second area 1133 of the driving transistor T1 and the first area 3136 of the third transistor T3 may be connected (e.g., electrically connected) by the second connection electrode 3175.

The first data conductive layer SD1 may further include an upper second initialization voltage line 128*b*. The upper second initialization voltage line 128*b* may have a wiring part 128*b*-1 extending in a vertical direction (a second direction DR2) and a first extending part 128*b*-2 protruded at sides (e.g., opposite sides) of the horizontal direction (e.g., the first direction DR1) from the wiring part 128*b*-1, and may include a second extending part 128*b*-3 positioned with again bending in the vertical direction (e.g., the second direction DR2) from the first extending part 128*b*-2. In the portion where the first extending part 128*b*-2 and the second extending part 128*b*-3 meet, the upper second initialization voltage line 128*b* may be electrically connected to the lower second initialization voltage line 128*a* positioned on the third gate conductive layer GAT3 through the opening OP2. As a result, the second initialization voltage VAINT may be transmitted in the horizontal direction (e.g., the first direction DR1) through the lower second initialization voltage line 128*a* positioned on the third gate conductive layer GAT3, and the first data conductive layer SD1 may transmit it in the vertical direction (e.g., the second direction DR2) through the upper second initialization voltage line 128*b*.

The end portion of the second extending part 128*b*-3 may be electrically connected to a portion 1137 of the first semiconductor layer 130 through the opening OP1 to transmit the second initialization voltage VAINT to the seventh transistor T7.

The first data conductive layer SD1 may further include a connection part 127CM and 171CM, an anode connection part ACM1, and an expansion part FL-SD1.

The connection part 127CM may be connected (e.g., electrically connected) to the first initialization voltage line 127 of the second gate conductive layer GAT2 through the opening OP1, and may be connected (e.g., electrically connected) to a portion of the second semiconductor layer ACT2 (e.g., the oxide semiconductor layer) through the opening OP2 to transmit the first initialization voltage VINT flowing through the first initialization voltage line 127 to the fourth transistor T4 of the oxide semiconductor layer.

The connection part 171CM may be electrically connected to a portion 1134 of the first semiconductor layer 130, e.g., the second transistor T2, through the opening OP1.

The anode connection part ACM1 may be electrically connected to a portion 1136 of the first semiconductor layer 130, e.g., the sixth transistor T6, through the opening OP1.

The expansion part FL-SD1 may be widely formed in order to planarize the anode included in the red and blue light emitting diodes LED positioned overlying it. For example, the expansion part FL-SD1 may be connected (e.g., electrically connected) to a portion 1135 of the first semiconductor layer 130 through the opening OP1, e.g., the fifth transistor T5, and may be also electrically connected to the first storage electrode 1153 through the opening OP1. The expansion part FL-SD1 positioned in (or formed of) the first data conductive layer SD1 may overlap the anode of the red and/or blue light emitting diodes LED in a plan view, so it may be called an expansion part for planarizing the anode for the red and/or blue light emitting diode LED.

According to the embodiment of FIG. 15, the interval gap1, in a plan view, from the light emission control line 155 positioned in (or formed of) the first gate conductive layer GAT1 to the lower second initialization voltage line 128*a* positioned in (or formed of) the third gate conductive layer GAT3 and the interval gap2, in a plan view, from the light emission control line 155 positioned in (or formed of) the first gate conductive layer GAT1 to the connection part 1153-1 of the first storage electrode 1153 positioned in (or formed of) the second gate conductive layer GAT2 may be the same as each other. The light emission control line 155, the lower second initialization voltage line 128*a*, and the connection part 1153-1 of the first storage electrode 1153, which are the portions where the intervals gap1 and gap2 are constant, may overlap, in a plan view, the expansion part FL-SD1 of the first data conductive layer SD1. For example, the portion in which two intervals gap1 and gap2 are constant may overlap, in a plan view, the anode Anode included in the blue light emitting diode LED to be described below and the red and blue openings OPr and OPb of the pixel definition layer 380 corresponding to the red and blue light emitting diode LED in a plan view.

The first data conductive layer SD1 may include a metal such as aluminum (Al), copper (Cu), molybdenum (Mo), titanium (Ti), or a metal alloy, and may be formed as a single layer or multiple layers.

Referring to FIG. 34, a first organic layer 181 may be positioned on the first data conductive layer SD1 including the first connection electrode 1175 and the second connection electrode 3175. The first organic layer 181 may be an organic insulator including an organic material, and the organic material may include at least one material selected from a group consisting of polyimide, polyamide, acryl resin, benzocyclobutene, and phenol resin.

Figure 16:
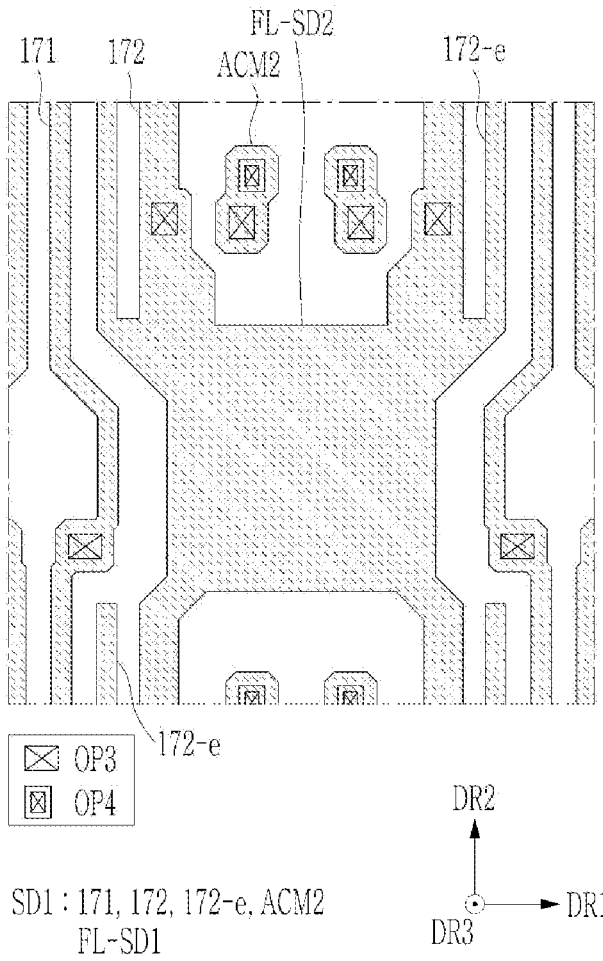
Figure 17:
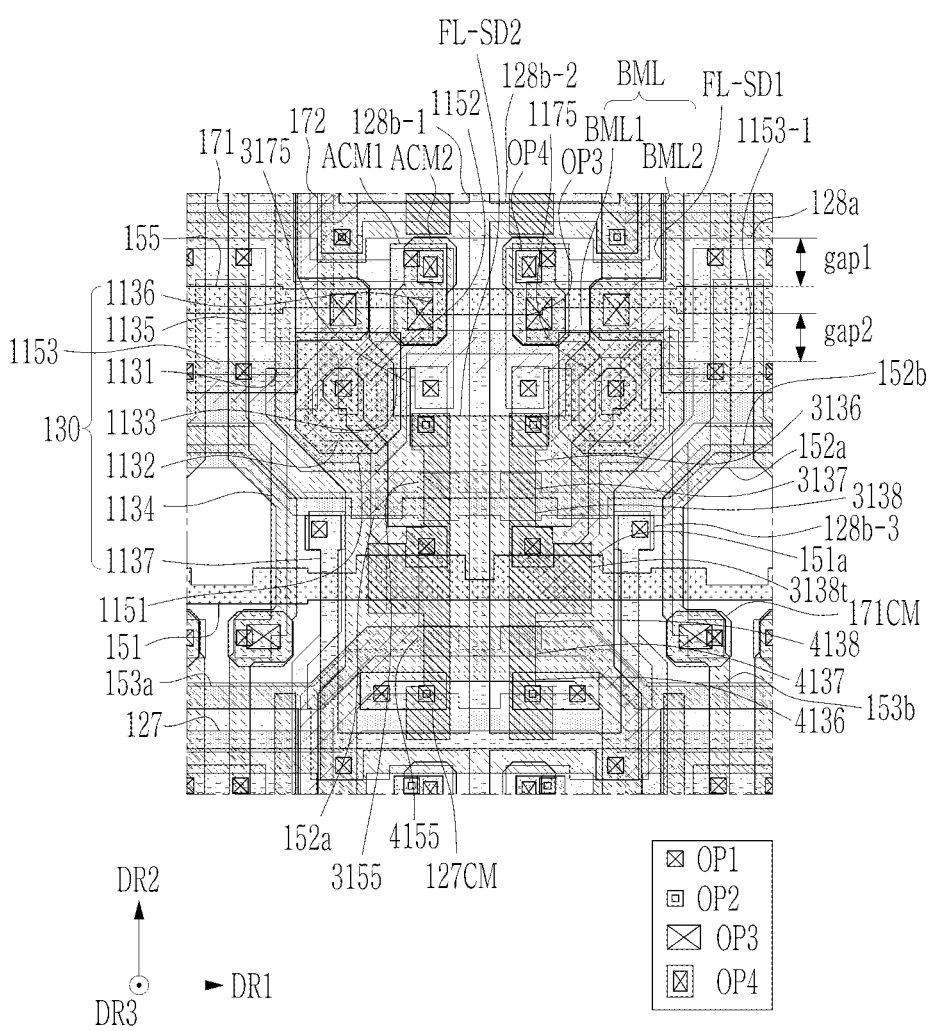

Referring to FIG. 16, FIG. 17, and FIG. 34, the first organic layer 181 may include a lower organic layer opening OP3. A second data conductive layer SD2 including a data line 171, a driving voltage line 172, and an anode connection part ACM2 may be positioned on the first organic layer 181. On the second data conductive layer SD2, a second organic layer 182 and a third organic layer 183 may be positioned, and the second organic layer 182 and the third organic layer 183 include an anode connection opening OP4. The anode connection part ACM2 may be electrically connected to the anode through the anode connection opening OP4. FIG. 16 is a schematic top plan view only showing the second data conductive layer SD2 and the openings OP3 and OP4 since it is difficult to readily recognize the second data conductive layer SD2 in FIG. 17, and FIG. 17 is a schematic top plan view showing the second data conductive layer SD2 and all surrounding layers.

Referring to FIG. 16 and FIG. 17, the lower organic layer opening OP3 of the first organic layer 181 may overlap the connection part 171CM, the anode connection part ACM1, and the expansion part FL-SD1 positioned in (or formed of) the first data conductive layer SD1 to expose the connection part 171CM, the anode connection part ACM1, and the expansion part FL-SD1.

The second data conductive layer SD2 may include a data line 171, a driving voltage line 172, and an anode connection part ACM2.

The data line 171 and the driving voltage line 172 may extend in approximately a vertical direction (e.g., the second direction DR2). The data line 171 may be connected (e.g., electrically connected) to the connection part 171CM of the first data conductive layer SD1 through the lower organic layer opening OP3, and may be connected (e.g., electrically connected) to the second transistor T2 through the lower organic layer opening OP3. The driving voltage line 172 may be electrically connected to the fifth transistor T5 and the first storage electrode 1153 through the expansion part FL-SD1 of the first data conductive layer SD1 through the lower organic layer opening OP3. The anode connection part ACM2 may be electrically connected to the anode connection part ACM1 of the first data conductive layer SD1 through the opening OP3, and may be electrically connected to the sixth transistor T6.

Referring to FIG. 16, the driving voltage line 172 may include the expansion part FL-SD2 (hereinafter referred to as a second expansion part) and the protruded wiring part 172-e, and may have a structure that is not formed at the portion where the anode connection part ACM2 is formed.

The expansion part FL-SD2 may be formed widely in order to planarize the overlying anode. The expansion part FL-SD2 positioned on the second data conductive layer SD2 may overlap the anode of the green light emitting diode LED in a plan view, so it may be called an expansion part for planarizing the anode for the green light emitting diode LED.

For example, the protruded wiring part 172-e of the driving voltage line 172 may be also formed as two on sides (e.g., opposite sides) of two data lines 171 in order to flatly form the overlying anode of the red and/or blue light emitting diodes LED, so that a structure of a total of four wires 171 and 172-e may be positioned below the anode.

Referring to the embodiment of FIG. 17, the portion having two intervals (or distances) gap1 and gap2 constant may overlap the structure of four wirings 171 and 172-e positioned on the second data conductive layer SD2 in a plan view. For example, the portion in which two intervals gap1 and gap2 may be constant and the four wirings 171 and 172-e may overlap, in a plan view, the anode Anode of the red and/or blue light emitting diode LED to be described below and/or the red and blue openings OPr and OPb of the pixel definition layer 380.

Due to the structure under the anode Anode and the organic layers 181, 182, and 183 as described above, the anode may have a flattening characteristic, so that the light reflected from the anode Anode may not spread asymmetrically, and as a result, the reflective color band due to the color spread (e.g., the color separation) phenomenon by the reflected light may be reduced, thereby improving the display quality.

For example, the anode of the green light emitting diode LED overlapping the expansion part FL-SD2 positioned in (or formed of) the second data conductive layer SD2 may have the improved planarization characteristic rather than the anode of the red and/or blue light emitting diode LED overlapping the expansion part FL-SD1 positioned in (or formed of) the first data conductive layer SD1. According to an embodiment, the expansion part FL-SD2 positioned on the second data conductive layer SD2 may overlap the anode of the different color light emitting diode LED.

In an embodiment, the expansion part FL-SD1 and the expansion part FL-SD2 may be electrically connected to the driving voltage line 172 so that the driving voltage ELVDD may be transmitted.

The second data conductive layer SD2 may include a metal or a metal alloy such as aluminum (Al), copper (Cu), molybdenum (Mo), or titanium (Ti), and may be formed of a single layer or multiple layers.

Referring to FIG. 34, the second organic layer 182 and the third organic layer 183 may be positioned on the second data conductive layer SD2. The second organic layer 182 and the third organic layer 183 may be organic insulators, and may include at least one material selected from the group consisting of polyimide, polyamide, acryl resin, benzocyclobutene, and phenol resin. In another example, the third organic layer 183 may be omitted.

The anode connection opening OP4 may be formed in the second organic layer 182 and the third organic layer 183, through which the anode Anode and the anode connection part ACM2 are electrically connected.

For the first organic layer 181, the second organic layer 182, and the third organic layer 183, in order to more flat the anode positioned thereon, an exposure and development process to flatten the top surface of each organic layer by using a slit mask after laminating each organic layer may be included. The process by using such a slit mask may be performed every time in case that each organic layer is stacked, and after some organic layers are stacked, the exposure process with the slit mark may not be carried out. For example, the slit mark used at this time have a pattern in which a slit pattern is parallel to the first direction DR1, e.g., in the horizontal direction so that a step of the organic layer generated due to the pattern in the vertical direction (e.g., the second direction DR2) formed in the first data conductive layer SD1 and/or the second data conductive layer SD2 may be further readily removed.

Figure 18:
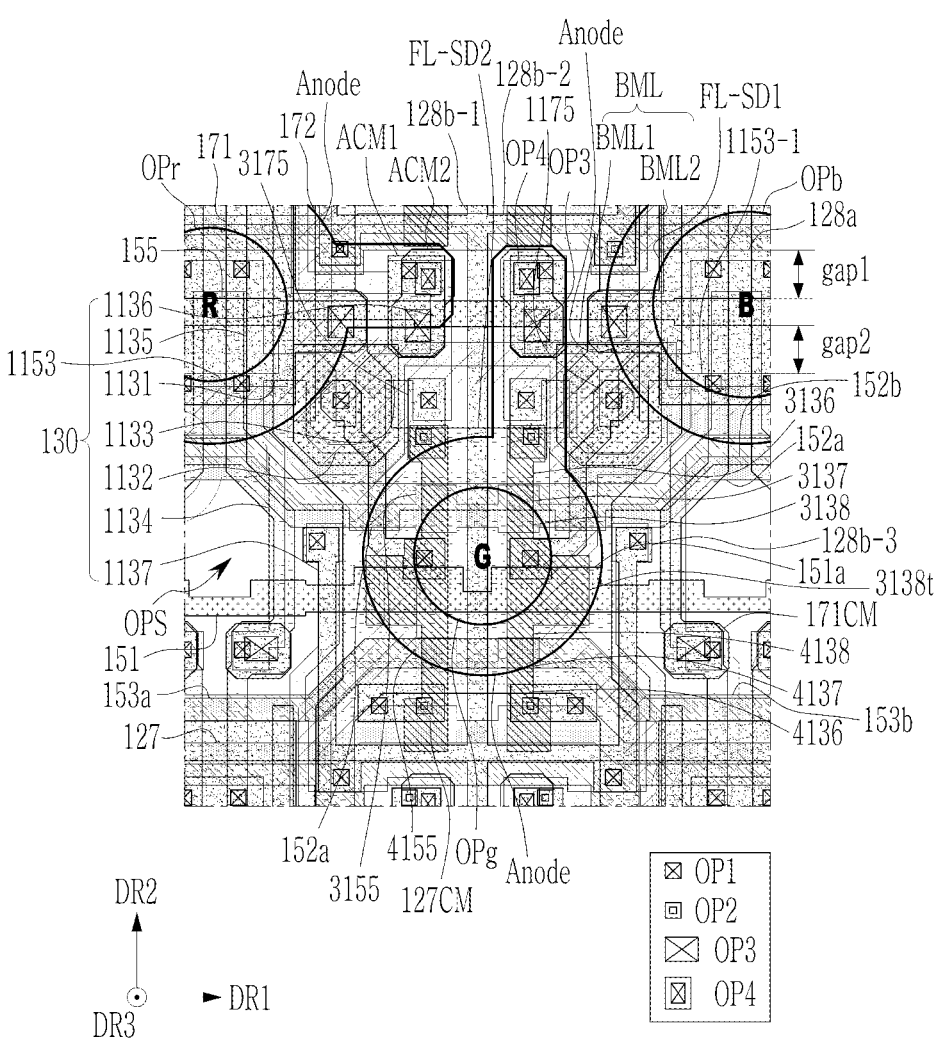

Referring to FIG. 18, the anode Anode may be formed on the third organic layer 183. The anode Anode may further include an extension part Anode-e to receive a current from the pixel circuit unit through the opening OP4.

Referring to FIG. 18 and FIG. 34, the pixel definition layer 380 may be positioned on the anode Anode, and the red, green, and blue openings OPr, OPg, and OPb of the pixel definition layer 380 may be formed to overlap the anode Anode.

The red, green, and blue openings OPr, OPg, and OPb formed in the pixel definition layer 380 may be divided into a red opening OPr overlapping the anode of the red light emitting diode LED, a green opening OPg overlapping the anode of the green light emitting diode LED, and a blue opening OPb overlapping the anode of the blue light emitting diode LED. The expansion part Anode-e of the anode Anode may not be exposed by the red, green, and blue openings OPr, OPg, and OPb of the pixel definition layer 380, and may have a structure overlapping the pixel definition layer 380 in a plane. As a result, the anode connection opening OP4 may have a structure overlapping the pixel definition layer 380 in a plan view. According to an embodiment, the pixel definition layer 380 may have an opaque characteristic, and may include a black color pigment.

In an embodiment, by the expansion part FL-SD1 of the first data conductive layer SD1 and the expansion part FL-SD2 of the second data conductive layer SD2 positioned below the anode, the portion at least exposed by the red, green, and blue openings OPr, OPg, and OPb of the pixel definition layer 380 among the anode Anode may be formed flat.

Referring to the embodiment of FIG. 18, the portion in which two intervals gap1 and gap2 may be constant may overlap the anode Anode of the red and/or blue light emitting diode LED and/or the red, green, and blue openings OPr, OPg, and OPb of the pixel definition layer 380 in a plan view. For example, the center portion of the red, green, and blue openings OPr, OPg, and OPb of the pixel definition layer 380 may be positioned on the light emission control line 155, which is the center portion of two intervals gap1 and gap2 in a plan view. For example, the upper boundary of the red, green, and blue openings OPr, OPg, and OPb of the pixel definition layer 380 may overlap the lower second initialization voltage line 128*a* in a plan view, and the lower boundary of the red, green, and blue openings OPr, OPg, and OPb of the pixel definition layer 380 may overlap the first storage electrode in a plan view. Due to the structure under the anode Anode and the organic layers 181, 182, and 183 as described above, the anode may have a flattening characteristic, so that the light reflected from the anode Anode may not spread asymmetrically, and as a result, the reflective color band due to the color spread (e.g., the color separation) phenomenon by the reflected light may be reduced, thereby improving the display quality.

Figure 19:
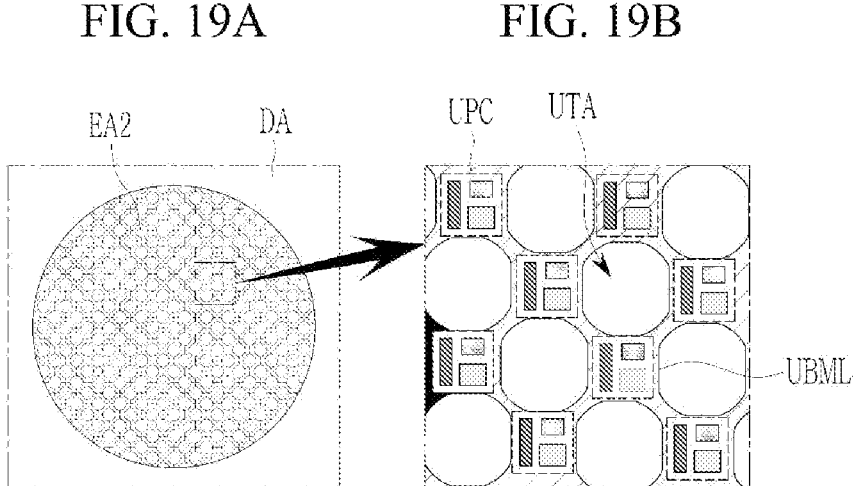
FIGS. 19A, 19B, 20, and 21 are schematic views showing a structure of a second component area according to an embodiment.

Hereinafter, the structure of the second component area EA2 and the second component pixel is described through FIG. 19 to FIG. 33, first the entire structure of the second component area EA2 is described through FIG. 19 to FIG. 21.

FIG. FIGS. 19A, 19B, 20, and 21 are schematic views showing a structure of a second component area according to an embodiment.

FIG. 19A shows an enlarged second component area EA2, and FIG. 19B shows the structure of a unit pixel UPC and a light transmissive area UTA by enlarging a portion of the second component area EA2.

Figure 20:
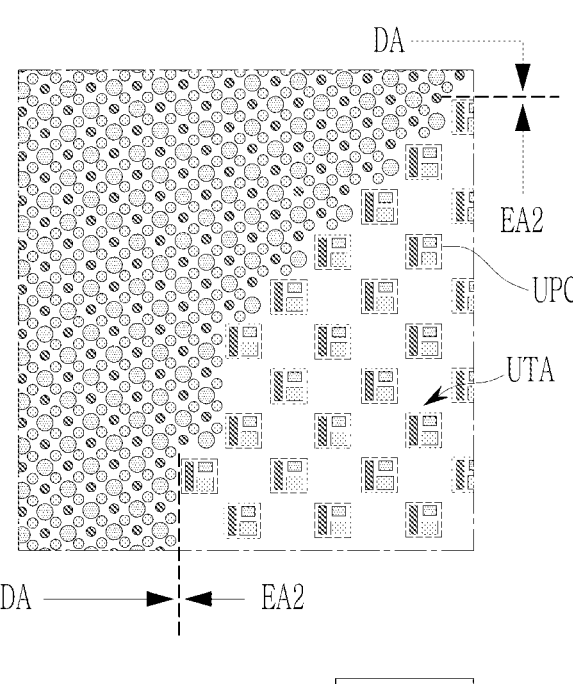
Figure 21:
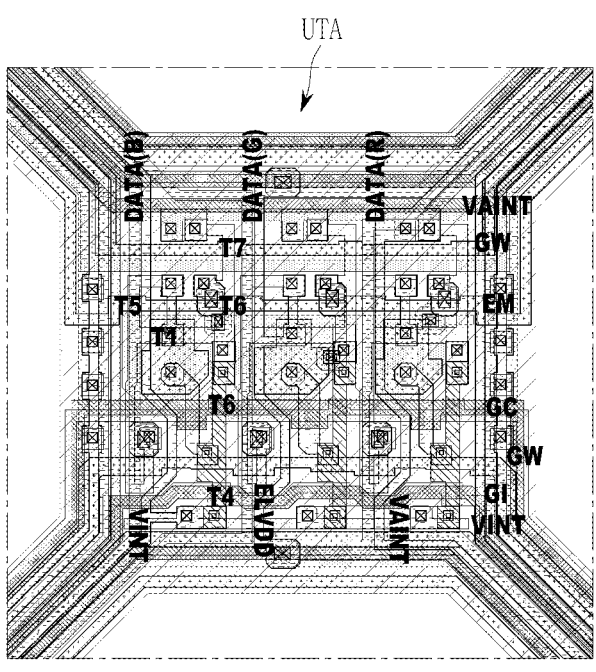

FIG. 20 more clearly shows the arrangement of the normal pixel and the second component pixel based on the boundary area positioned between the display area DA and the second component area EA2, and FIG. 21 shows one unit pixel UPC.

First, referring to FIG. 19A, the second component area EA2 may be surrounded by the display area DA, and may have a planar circular shape or a shape similar thereto. For example, as shown in FIG. 19A, in case that the boundary between the display area DA and the second component area EA2 is enlarged, it corresponds to a circular shape, but as shown in FIG. 20, in the enlarged view, the boundary between the normal pixel and the second component pixel may not include a curved line, but a short straight line that is bent, so that the boundary may not be circular, but may have a shape similar to a circle. Since the planar shape of the second component area EA2 may vary, embodiments are not limited thereto.

FIG. 19B shows the planar shape of the unit pixel UPC and the light transmissive area UTA formed in the second component area EA2 according to an embodiment.

The unit pixel UPC according to the embodiment of FIG. 19B may be disposed at each vertex position of the rhombus with a certain interval. The light blocking portion UBML may be positioned below the unit pixel UPC. The light blocking portion UBML may include expansion parts which are formed widely and a connection part for connecting expansion parts each other in an oblique direction, and an opening area divided by expansion parts and connection parts may be formed. The opening area of the light blocking portion UBML corresponds to the light transmissive area UTA, and one unit pixel UPC may be disposed on the expansion part of the light blocking portion UBML.

A single unit pixel UPC may include a single red second component pixel, a single blue second component pixel, and a single green second component pixel. In FIG. 19B, the light emitting diodes LED (e.g., R, G, and B) of each color are shown. The blue light emitting diode LED (e.g., B) may extend along a side of the unit pixel UPC, and the red light emitting diode LED (e.g., R) and the green light emitting diode LED (e.g., G) may be disposed next to the blue light emitting diode LED (e.g., B). The number and arrangement of the pixels included in one unit pixel UPC may be different from that of FIG. 19B.

In FIG. 20, the arrangement of the normal pixels and the second component pixels positioned on sides (e.g., opposite sides) of the boundary area positioned between the display area DA and the second component area EA2 is more clearly shown.

According to the embodiment of FIG. 20, the second component pixel may have the structure in which the unit pixel UPC including the second component pixels of red, blue, and green one by one is regularly arranged, and the space therebetween may form the light transmissive area UTA. Therefore, the number of the pixels per unit area (or pixel density) of the second component area EA2 may be smaller than the number of the pixels per unit area (or pixel density) of the normal pixel of the display area DA. Therefore, the resolution of the display area DA may be high and the resolution of the second component area EA2 may be formed relatively low.

Referring to FIG. 21, the structure of one unit pixel UPC, and the light blocking portion UBML having the expansion part and the connection part is enlarged. The area where the light blocking portion UBML does not position may be the light transmissive area UTA. FIG. 21 shows the position of the transistor and the position of each wiring in the structure of one unit pixel UPC, but since the structure is complicated and difficult to be confirmed clearly, hereinafter, it is described in detail based on the manufacturing sequence of one unit pixel UPC through FIG. 22 to FIG. 33.

FIG. 22 to FIG. 33 are schematic views showing a structure of each layer according to a manufacturing order of a lower panel layer among a second component pixel according to FIG. 21.

Referring to FIG. 22, a light blocking portion UBML may be positioned on a substrate 110.

The substrate 110 may include a material that does not bend due to a rigid characteristic such as glass, or a flexible material that is bendable such as plastic or polyimide. In the case of the flexible substrate, as shown in FIG. 34, the substrate 110 may have a double-layered structure of polyimide, and a barrier layer formed of an inorganic insulating material thereon may be formed in a double layer.

The light blocking portion UBML may include expansion parts UBML1 and connection parts UBML2 connecting expansion parts UBML1 to each other. The expansion part UBML1 of the light blocking portion UBML may be formed at a position overlapping one unit pixel UPC to be subsequent in a plan view. An opening area may be defined by expansion parts UBML1 and connection parts UBML2. In the second component area EA2, the opening area of the light blocking portion UBML, e.g., the area in which the light blocking portion UBML may not be formed, corresponds to the light transmissive area UTA. The light blocking portion UBML may be formed of the same material and by the same process as the metal layer BML of a normal pixel, and may include a metal such as copper (Cu), molybdenum (Mo), aluminum (Al), titanium (Ti), etc. or an alloy thereof, may additionally include amorphous silicon, and may be formed of a single layer or multiple layers.

On the substrate 110 and the light blocking portion UBML, a buffer layer 111 covering the substrate 110 and the light blocking portion UBML may be positioned. The buffer layer 111 may function to block penetration of impurity elements into the first semiconductor layer 130, and may be an inorganic insulating layer including a silicon oxide $(SiO_x)$, a silicon nitride $(SiN_x)$, a silicon oxynitride $(SiO_xN_y)$, or the like.

On the buffer layer 111, as shown in FIG. 23, a first semiconductor layer U130 formed of a silicon semiconductor (e.g., a polycrystalline semiconductor) may be positioned. The first semiconductor layer U130 may include a channel U1132, a first area U1131 and a second area U1133 of the driving transistor T1. For example, the first semiconductor layer U130 may include channels of the second transistor T2, the fifth transistor T5, the sixth transistor T6, and the seventh transistor T7 as well as the driving transistor T1, and may have areas having a conductive layer characteristic by plasma processing or doping on sides (e.g., opposite sides) of each channel to function as the first and second electrodes. The first semiconductor layer U130 may be formed of the same material and by the same process as the first semiconductor layer 130 of a normal pixel.

The channel U1132 of the driving transistor T1 may be formed in a straight-line shape, and may be formed in a curved shape according to an embodiment. The first area U1131 and the second area U1133 of the driving transistor T1 may be positioned on sides (e.g., opposite sides) of the channel U1132 of the driving transistor T1. The first area U1131 and the second area U1133 positioned in (or formed of) the first semiconductor layer may function as the first electrode and the second electrode of the driving transistor T1.

In the first semiconductor layer U130, a channel, a first area and a second area of a second transistor T2 may be positioned in the portion U1134 extending from the first area U1131 of the driving transistor T1 downward. A channel, a first area and a second area of a fifth transistor T5 may be positioned in the portion U1135 extending from the first area U1131 of the driving transistor T1 upward. A channel, a first area and a second area of a sixth transistor T6 may be positioned in the portion U1136 extending from the second area U1133 of the driving transistor T1 upward. A channel, a first area and a second area of a seventh transistor T7 may be positioned in the portion U1137 extending from the portion U1136 of the first semiconductor layer 130 upward.

In the first semiconductor layer U130 of the second component area EA2, a first island part U1138 and a second island part U1139 having an island-shaped structure may be additionally formed. The first island part U1138 and the second island part U1139 may have a structure that may be connected (e.g., electrically connected) to different overlying wirings in the subsequent process, and may function to block light from flowing from the side through the structure connected to the overlying wirings.

Referring to FIG. 34, a first gate insulating layer 141 may be positioned on the first semiconductor layer U130 including the channel U1132, the first area U1131, and the second area U1133 of the driving transistor T1. The first gate insulating layer 141 may be an inorganic insulating layer including a silicon oxide $(SiO_x)$, a silicon nitride $(SiN_x)$, a silicon oxynitride $(SiO_xN_y)$, or the like.

Figure 24:
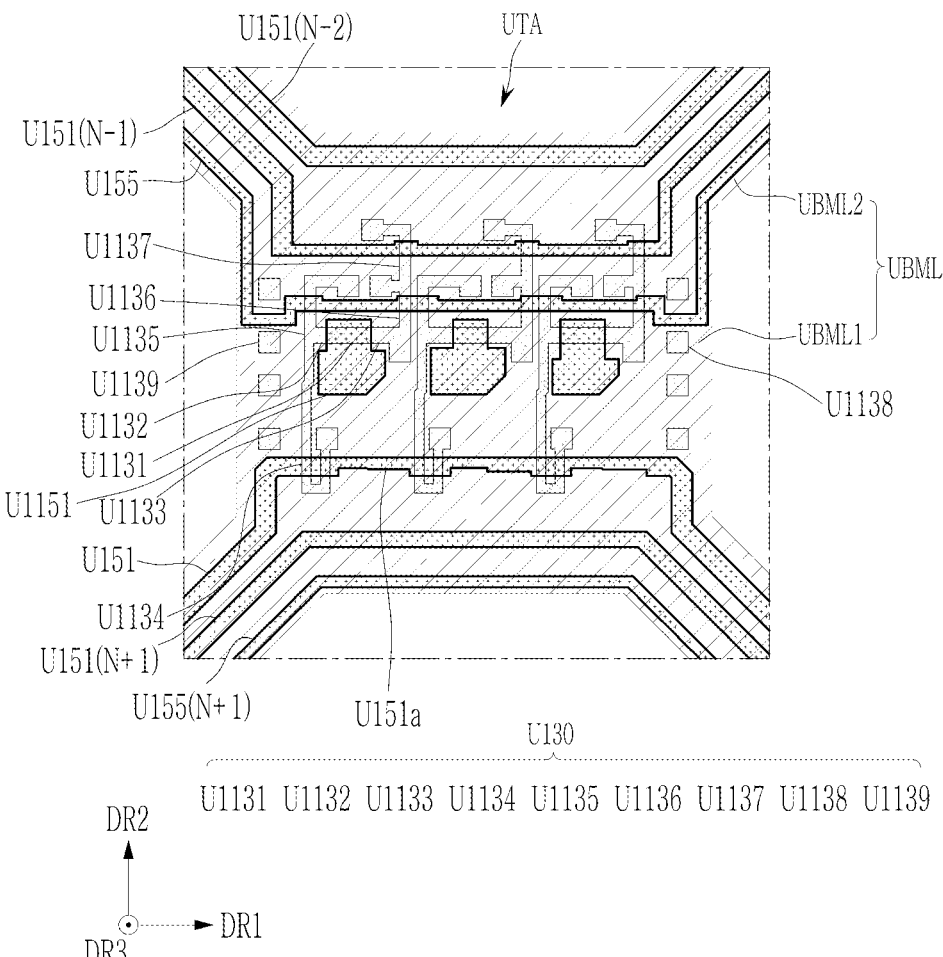

Referring to FIG. 24, a first gate conductive layer GAT1 including a gate electrode U1151 of the driving transistor T1 may be positioned on the first gate insulating layer 141. The first gate conductive layer GAT1 may include a gate electrode of each of the second transistor T2, the fifth transistor T5, the sixth transistor T6, and the seventh transistor T7 as well as the driving transistor T1. The gate electrode U1151 of the driving transistor T1 may overlap the channel U1132 of the driving transistor T1. The channel U1132 of the driving transistor T1 may be covered by the gate electrode U1151 of the driving transistor T1.

The first gate conductive layer GAT1 may further include a first scan line U151 and a light emission control line U155. The first scan line U151 and the light emission control line U155 may extend in an approximately horizontal direction (hereinafter also referred to as a first direction DR1). The first scan line U151 may be connected (e.g., electrically connected) to the gate electrode of the second transistor T2, and the first scan line U151 may be integral with the gate electrode of the second transistor T2. The first scan line U151 may include a lower boost electrode U151a having an extended width, and may overlap an upper boost electrode U3138t to be described below to form a boost capacitor Cboost. The first scan line U151 may be connected (e.g., electrically connected) to or integral with the gate electrode of the seventh transistor T7 of the next pixel. Therefore, the gate electrode of the seventh transistor T7 of the present pixel may be connected (e.g., electrically connected) to or integral with the first scan line U151(N−1) of the previous pixel.

For example, the light emission control line U155 may be connected (e.g., electrically connected) to the gate electrode of the fifth transistor T5 and the gate electrode of the sixth transistor T6, and the light emission control line U155 and the gate electrodes of the fifth transistor T5 and the sixth transistor T6 may be integral with each other.

The first gate conductive layer GAT1 of the second component area EA2 may further include a second previous first scan line U151(N−2) and a previous light emission control line U155(N−1) and a next light emission control line U155(N+1), which extends approximately in the horizontal direction (hereinafter, also referred to as the first direction DR1). At least some of the previous and next scan lines and light emission control lines may not be connected (e.g., electrically connected) to the unit pixel UPC of the second component area EA2. For example, the scan line or the light emission control line that is not connected to the unit pixel UPC of the second component area EA2 may be only connected to the normal pixel of the display area DA positioned on sides (e.g., opposite sides) of the second component area EA2 and be extended by bypassing the unit pixel UPC of the second component area EA2. In an embodiment, the next light emission control line U155(N+1) may be not connected to the unit pixel UPC of the second component area EA2, and the previous first scan line U151(N−1) may not be connected (e.g., electrically connected) to the driving transistor T1 of the unit pixel UPC, but may be connected (e.g., electrically connected) to the seventh transistor T7.

The second previous first scan line U151(N−2), the previous first scan line U151(N−1), the next first scan line U151(N+1) and the next light emission control line U155 (N+1) may be bypass signal line based on the present unit pixel UPC. In case that the bypass signal line needs to be connected (e.g., electrically connected) to another conductive layer through an opening, a contact structure may be formed in the boundary area positioned between the display area DA and the second component area EA2.

The first gate conductive layer GATT of the second component area EA2 may be formed of the same material and by the same process as the first gate conductive layer GATT of the normal pixel, and the first gate conductive layer GATT of the second component area EA2 may include a metal such as copper (Cu), molybdenum (Mo), aluminum (Al), titanium (Ti), or a metal alloy, and may be formed of a single layer or multiple layers.

After the first gate conductive layer GATT including the gate electrode U1151 of the driving transistor T1 is formed, a plasma treatment or a doping process may be performed to make a portion of the first semiconductor layer of the second component area EA2, which is not covered by the first gate conductive layer GATT and is exposed, conductive. For example, the first semiconductor layer covered by the first gate conductive layer GATT may not be conductive, and the portion of the first semiconductor layer not covered by the first gate conductive layer GATT may have the same characteristic as the conductive layer. As a result, the transistor including the conductive portion may have a p-type transistor characteristic, and the driving transistor T1, the second transistor T2, the fifth transistor T5, the sixth transistor T6, and the seventh transistor T7 may be p-type transistors.

Referring to FIG. 34, a second gate insulating layer 142 may be positioned on the first gate conductive layer GATT including the gate electrode U1151 of the driving transistor T1 and the first gate insulating layer 141. The second gate insulating layer 142 may be an inorganic insulating layer including a silicon oxide (SiO$_x$), a silicon nitride (SiN$_x$), a silicon oxynitride (SiO$_x$N$_y$), or the like.

Figure 25:
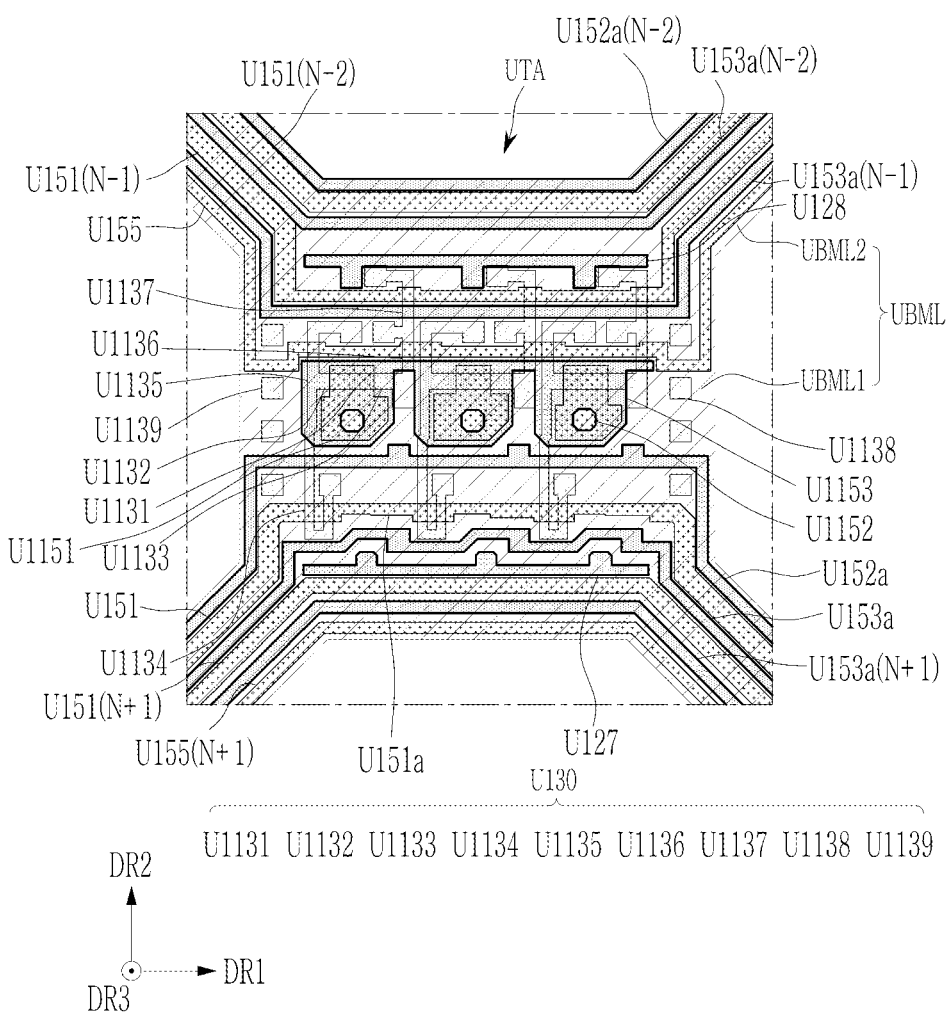

Referring to FIG. 25, on the second gate insulating layer 142, a second gate conductive layer GAT2 including a first storage electrode U1153 of the storage capacitor Cst, a lower second scan line U152a, and a lower initialization control line U153a may be positioned.

The first storage electrode U1153 may overlap the gate electrode U1151 of the driving transistor T1 to form the storage capacitor Cst. An opening U1152 may be formed in the first storage electrode U1153 of the storage capacitor Cst. The opening U1152 of the first storage electrode U1153 of the storage capacitor Cst may overlap the gate electrode U1151 of the driving transistor T1. The first storage electrode U1153 may extend in the horizontal direction (e.g., the first direction DR1) so that three adjacent first storage electrodes U1153 may be connected (e.g., electrically connected) to each other.

The lower second scan line U152a and the lower initialization control line U153a may be extended in the approximately horizontal direction (e.g., first direction DR1). The lower second scan line U152a may overlap the channel of the third transistor T3 to function as a lower shielding layer, and the lower initialization control line U153a may overlap the channel of the fourth transistor T4 to function as a lower shielding layer. For example, the lower shielding layer may be positioned under each channel and may function to shield from light or electromagnetic interference provided to the channel from the lower side.

The second gate conductive layer GAT2 may further include a first initialization voltage applying part U127 and a second initialization voltage applying part U128.

The first initialization voltage applying part U127 and the second initialization voltage applying part U128 have an island-like structure elongated in the horizontal direction (e.g., the first direction DR1), and may each have three expansion parts. The first initialization voltage applying part U127 and the second initialization voltage applying part U128 may be connected (e.g., electrically connected) to a portion of the first semiconductor layer U130 through the subsequent process, respectively, so that the first initialization voltage VINT and the second initialization voltage VAINT may be applied to the first semiconductor layer U130.

The second gate conductive layer GAT2 may additionally include the second previous lower second scan line U152a (N−2), the second previous lower initialization control line U153a(N−2), the previous lower initialization control line U153a(N−1), and the next lower initialization control line U153a(N+1) extending in the horizontal direction (e.g., the first direction DR1).

At least some of the previous scan lines, the next scan lines, and the initialization control lines may not be connected (e.g., electrically connected) to the unit pixel UPC of the second component area EA2. For example, the scan line or the initialization control line that is not connected to the unit pixel UPC of the second component area EA2 may be only connected to the normal pixel of the display area DA positioned on sides (e.g., opposite sides) of the second component area EA2 and be extended by bypassing the unit pixel UPC of the second component area EA2. In an embodiment, the previous lower initialization control line U153a(N−1) and the next lower initialization control line U153a(N+1) may be not connected to the unit pixel UPC of the second component area EA2.

The second previous lower second scan line U152a(N−2), the second previous lower initialization control line U153a (N−2), the previous lower initialization control line U153a (N−1), and the next lower initialization control line U153a (N+1) may be the bypass signal lines based on the present unit pixel UPC. In case that the bypass signal line needs to be connected (e.g., electrically connected) to another conductive layer through an opening, a contact structure may be formed in the boundary area positioned between the display area DA and the second component area EA2.

The second gate conductive layer GAT2 of the second component area EA2 may be formed of the same material and by the same process as the first gate conductive layer GAT1 of the normal pixel, and the second gate conductive layer GAT2 of the second component area EA2 may include a metal such as copper (Cu), molybdenum (Mo), aluminum (Al), titanium (Ti), or a metal alloy, and may be formed of a single layer or multiple layers.

Referring to FIG. 34, a first interlayer insulating layer 161 may be positioned on the second gate conductive layer GAT2 including the first storage electrode U1153 of the storage capacitor Cst. The first interlayer insulating layer 161 may include an inorganic insulating layer including a silicon oxide (SiO$_x$), a silicon nitride (SiN$_x$), acid silicon nitride (SiON$_x$), or the like, and an inorganic insulating material may be thickly formed according to an embodiment.

Figure 26:
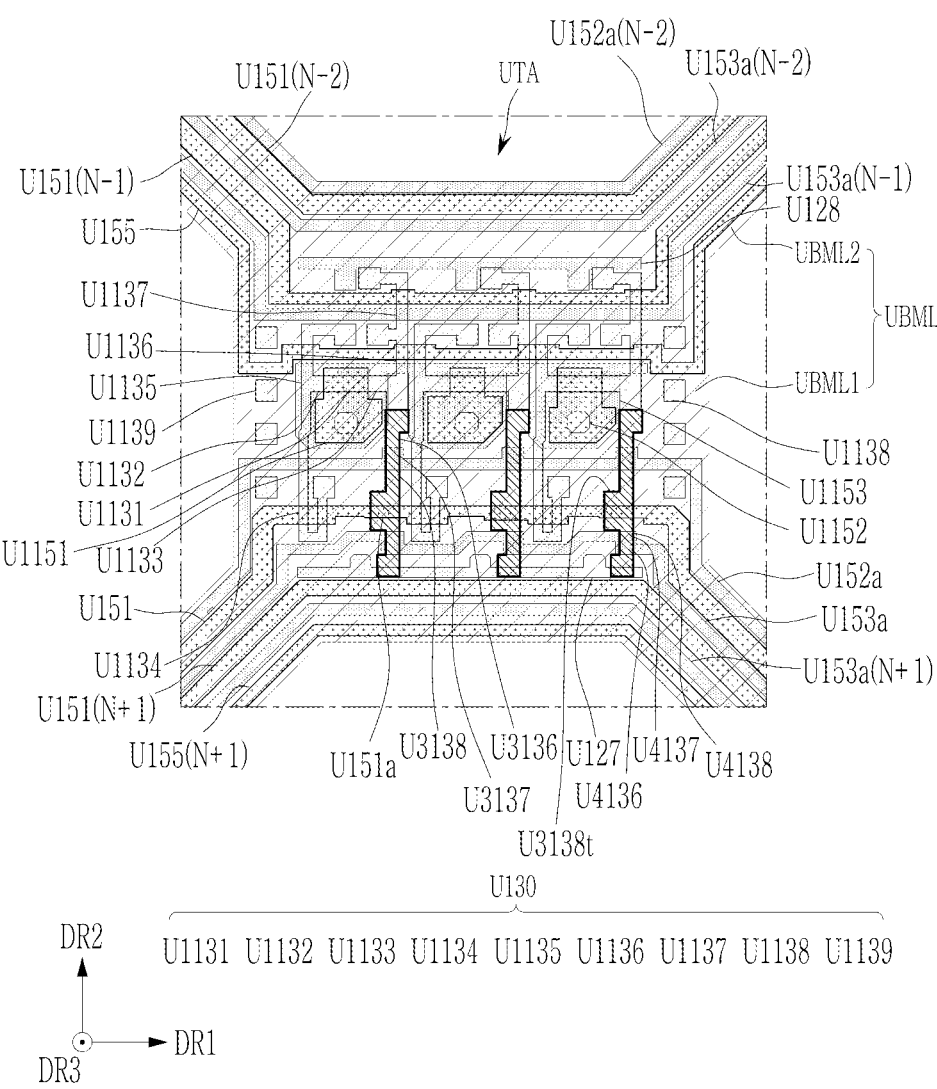

Referring to FIG. 26, on the first interlayer insulating layer 161, an oxide semiconductor layer including a channel U3137, a first area U3136 and a second area U3138 of the third transistor T3, and a channel U4137, a first area U4136 and a second area U4138 of the fourth transistor T4 may be positioned. For example, the oxide semiconductor layer may include an upper boost electrode U3138t of the boost capacitor Cboost.

The channel U3137, the first area U3136 and the second area U3138 of the third transistor T3, and the channel U4137, the first area U4136 and the second area U4138 of the fourth transistor T4 may be connected to each other and may be integral with each other. The first area U3136 and the second area U3138 of third transistor T3 may be positioned on sides (e.g., opposite sides) of the channel U3137 of the third transistor T3, and the first area U4136 and the second area U4138 of the fourth transistor T4 may be positioned on sides (e.g., opposite sides) of the channel U4137 of the fourth transistor T4. The second area U3138 of the third transistor T3 may be connected to the second area U4138 of the fourth transistor T4. The channel U3137 of the third transistor T3 may overlap a portion of the lower second scan line U152a, and the channel 4137 of the fourth transistor T4 may overlap a portion of the lower initialization control line U153a.

The upper boost electrode U3138t of the boost capacitor Cboost with an extended width may be positioned between the second area U3138 of the third transistor T3 and the second area U4138 of the fourth transistor T4. The upper boost electrode U3138t of the boost capacitor Cboost may overlap the lower boost electrode U151a of the boost capacitor Ucboost positioned in (or formed of) the first gate conductive layer GAT1 to form the boost capacitor Cboost.

Referring to FIG. 34, a third gate insulating layer 143 may be positioned on the oxide semiconductor layer including the channel U3137, the first area U3136 and the second area U3138 of the third transistor T3, the channel U4137, the first area U4136 and the second area U4138 of the fourth transistor T4, and the upper boost electrode U3138t of the boost capacitor Cboost.

The third gate insulating layer 143 may be positioned on the entire surface of the oxide semiconductor layer and the first interlayer insulating layer 161. Accordingly, the third gate insulating layer 143 may cover the upper surface and the side of the channel U3137, the first area U3136 and the second area U3138 of the third transistor T3, the channel U4137, the first area U4136, and the second area U4138 of the fourth transistor T4, and the upper boost electrode U3138t of the boost capacitor Cboost. However, embodiments are not limited thereto, and the third gate insulating layer 143 may not be positioned on the entire surface of the oxide semiconductor layer and the first interlayer insulating layer 161. For example, the third gate insulating layer 143 may overlap the channel U3137 of the third transistor T3 and may not overlap the first area U3136 and the second area U3138. For example, the third gate insulating layer 143 may overlap the channel U4137 of the fourth transistor T4 and may not overlap the first area U4136 and the second area U4138.

The third gate insulating layer 143 may include an inorganic insulating layer including a silicon oxide ($SiO_x$), a silicon nitride ($SiN_x$), a silicon oxynitride ($SiO_xN_y$), or the like.

Figure 27:
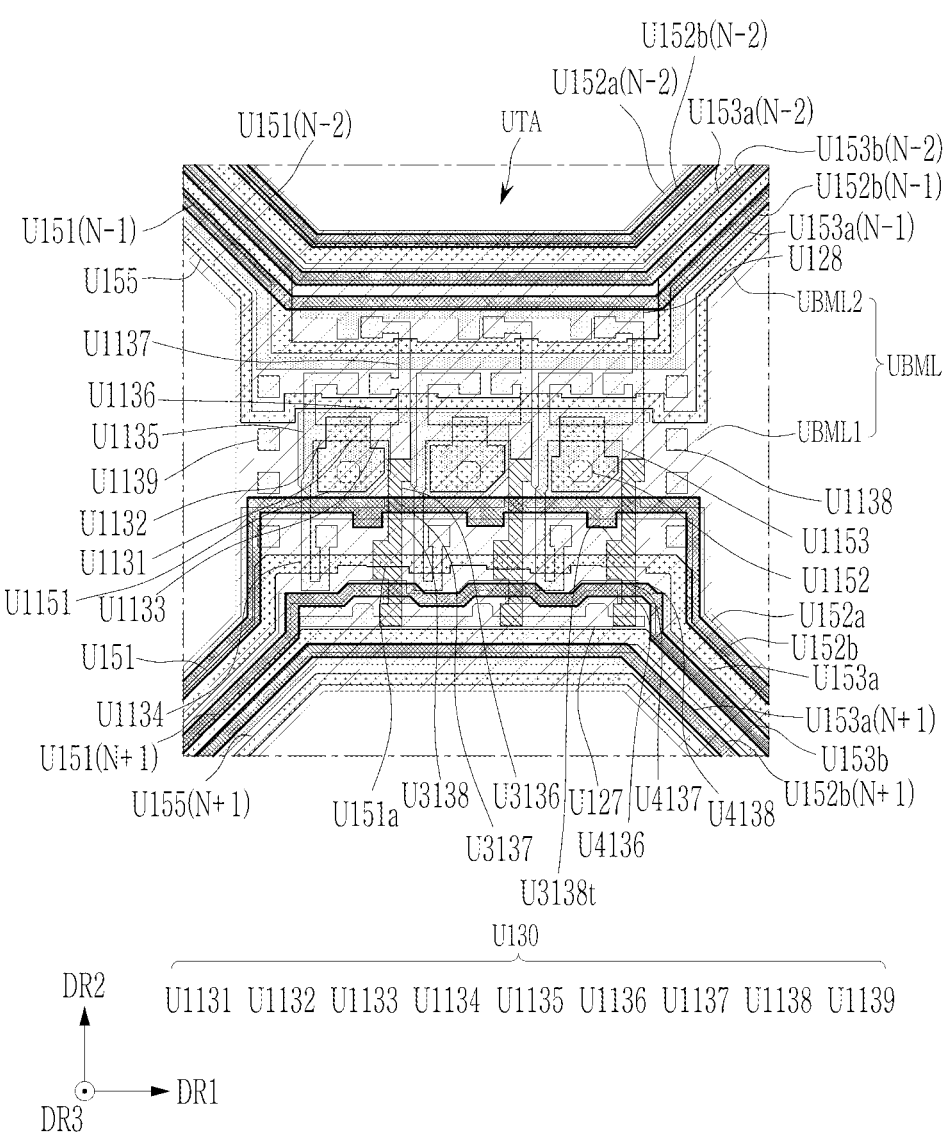

Referring to FIG. 27, a third gate conductive layer GAT3 including an upper second scan line U152b and an upper initialization control line U153b may be positioned on the third gate insulating layer 143.

The upper second scan line U152b and the upper initialization control line U153b may extend in the approximately horizontal direction (e.g., the first direction DR1). The upper second scan line U152b may include the gate electrode of the third transistor T3, and may form the second scan line U152 together with the lower second scan line U152a. The upper initialization control line U153b may include the gate electrode of the fourth transistor T4 and may form the initialization control line U153 together with the lower initialization control line U153a.

The third gate conductive layer GAT3 may further include a second previous upper second scan line U152b(N−2), a second previous upper initialization control line U153b(N−2), a previous upper second scan line U152b(N−1), and a next upper second scan line U152b(N+1) extending in the approximately horizontal direction (e.g., the first direction DR1).

At least some of the scan lines and the initialization control lines may not be connected (e.g., electrically connected) to the unit pixel UPC of the second component area EA2. For example, the scan line or the initialization control line that is not connected to the unit pixel UPC of the second component area EA2 may be only connected to the normal pixel of the display area DA positioned on sides (e.g., opposite sides) of the second component area EA2 and be extended by bypassing the unit pixel UPC of the second component area EA2. In an embodiment, the previous upper second scan line U152b(N−1) and the next upper second scan line U152b(N+1) may be not connected to the unit pixel UPC of the second component area EA2.

The third gate conductive layer GAT3 of the second component area EA2 may be formed of the same material and by the same process as the third gate conductive layer GAT3 of the normal pixel, and the third gate conductive layer GAT3 of the second component area EA2 may include a metal such as copper (Cu), molybdenum (Mo), aluminum (Al), titanium (Ti), or a metal alloy, and may be formed of a single layer or multiple layers.

In an embodiment, the wiring extending by bypassing the unit pixel UPC of the second component area EA2 in the second gate conductive layer GAT2 may be the previous lower initialization control line U153a(N−1) and the next lower initialization control line U153a(N+1), and the wiring extending by bypassing the unit pixel UPC of the second component area EA2 in the third gate conductive layer GAT3 may be the previous upper second scan line U152b(N−1) and the next upper second scan line U152b(N+1). Therefore, both the lower initialization control lines and the upper initialization control lines may have the structure that bypasses and extends through the second gate conductive layer GAT2 and the third gate conductive layer GAT3. The second previous upper second scan line U152b(N−2), the second previous upper initialization control line U153b(N−2), the previous upper second scan line U152b(N−1), and the next upper second scan line U152b(N+1) may be a bypass signal line based on the present unit pixel UPC.

After forming the third gate conductive layer GAT3 including the upper second scan line U152b and the upper initialization control line U153b, the portion of the oxide semiconductor layer covered by the third gate conductive layer GAT3 may be formed into the channel by a plasma treatment or a doping process, and the portion of the oxide semiconductor layer not covered by the third gate conductive layer GAT3, may be conductive. The channel U3137 of the third transistor T3 may be positioned in an area overlapping the upper second scan line U152b, and the first area U3136 and the second area U3138 of the third transistor T3 may not overlap the upper second scan line U152*b*. The channel U4137 of the fourth transistor T4 may be positioned in an area overlapping the upper initialization control line U153*b*, and the first area U4136 and the second area U4138 of the fourth transistor T4 may not overlap the upper initialization control line U153*b*. The upper boost electrode U3138*t* may not overlap the third gate conductive layer GAT3. The transistor including the oxide semiconductor layer may have characteristics of an n-type transistor.

Referring to FIG. 34, the second interlayer insulating layer 162 may be positioned on the third gate conductive layer GAT3. The second interlayer insulating layer 162 may have a single-layer or a multi-layered structure. The second interlayer insulating layer 162 may include an inorganic insulating material such as a silicon nitride (SiN$_x$), a silicon oxide (SiO$_x$), or a silicon oxynitride (SiO$_x$N$_y$), and may include an organic material according to an embodiment.

Figure 28:
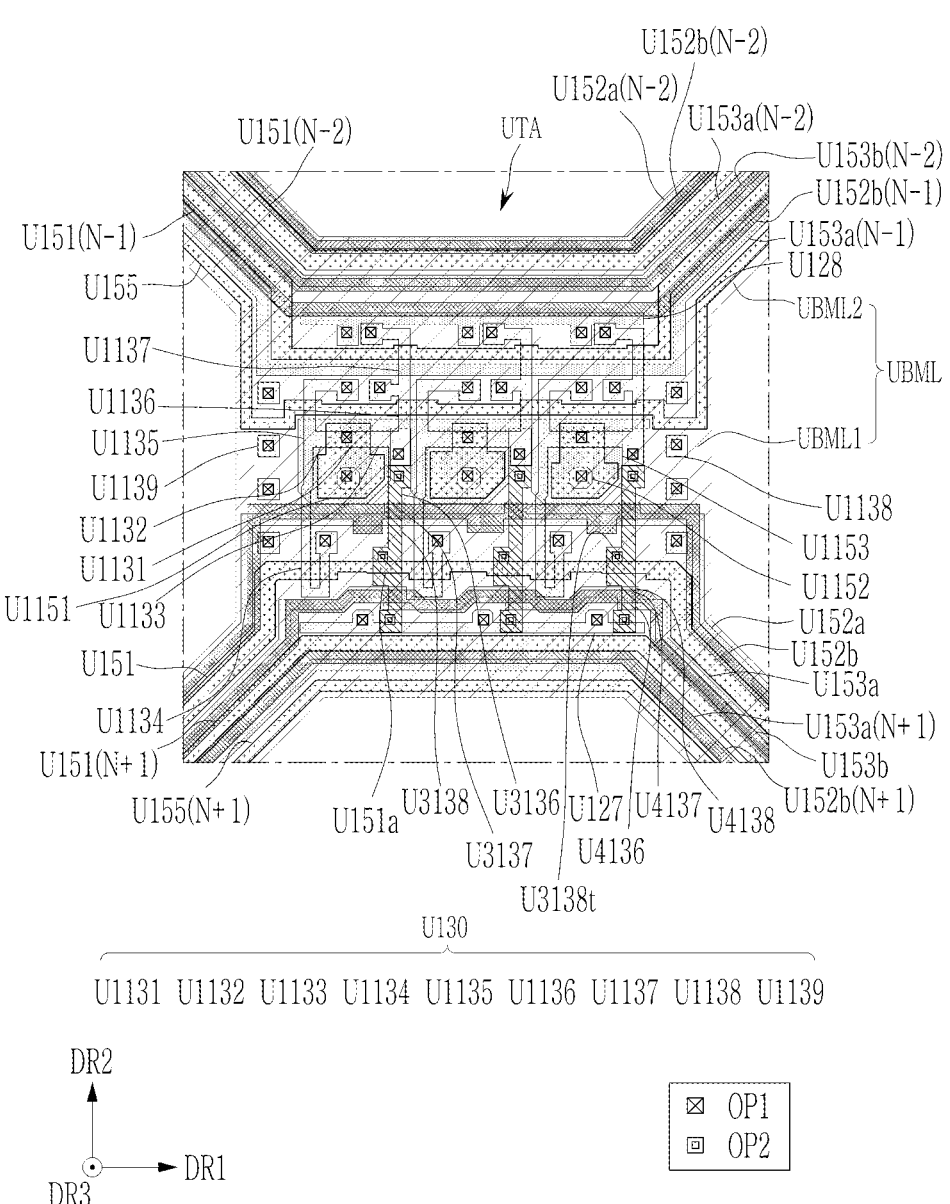

Referring to FIG. 28, two types of openings OP1 and OP2 may be formed in the second interlayer insulating layer 162. Two types of openings OP1 and OP2 may be formed by using different masks.

The opening OP1 may be an opening formed in at least one of the second interlayer insulating layer 162, the third gate insulating layer 143, the first interlayer insulating layer 161, the second gate insulating layer 142, and the first gate insulating layer 141 and may expose the first semiconductor layer 130, the first gate conductive layer GAT1, or the second gate conductive layer GAT2.

The opening OP2 may be an opening formed in the second interlayer insulating layer 162 and/or the third gate insulating layer 143 and may expose the oxide semiconductor layer or the third gate conductive layer GAT3.

One of the opening OP1 may overlap at least a portion of the gate electrode U1151 of the driving transistor T1, and may also be formed in the third gate insulating layer 143, the first interlayer insulating layer 161, and the second gate insulating layer 142. For example, one of the openings OP1 may overlap the opening U1152 of the first storage electrode U1153, and may be positioned inside the opening U1152 of the first storage electrode U1153.

One of the openings OP2 may overlap at least a portion of the boost capacitor Cboost, and may be further formed in the third gate insulating layer 143.

Another one of the openings OP1 may overlap at least a part of the second area 1133 of the driving transistor T1 and may be further formed in the third gate insulating layer 143, the first interlayer insulating layer 161, the second gate insulating layer 142, and the first gate insulating layer 141.

Another one of the openings OP2 may overlap at least a part of the first area U3136 of the third transistor T3 and may be formed in the third gate insulating layer 143.

Figure 29:
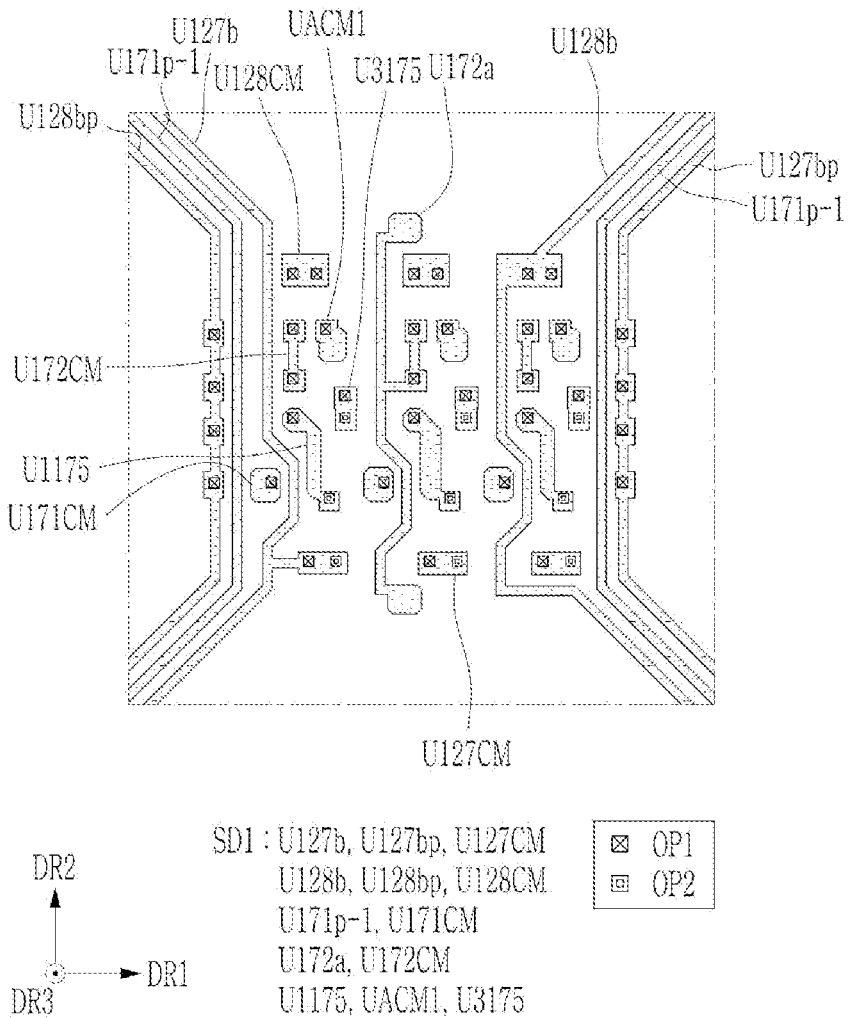
Figure 30:
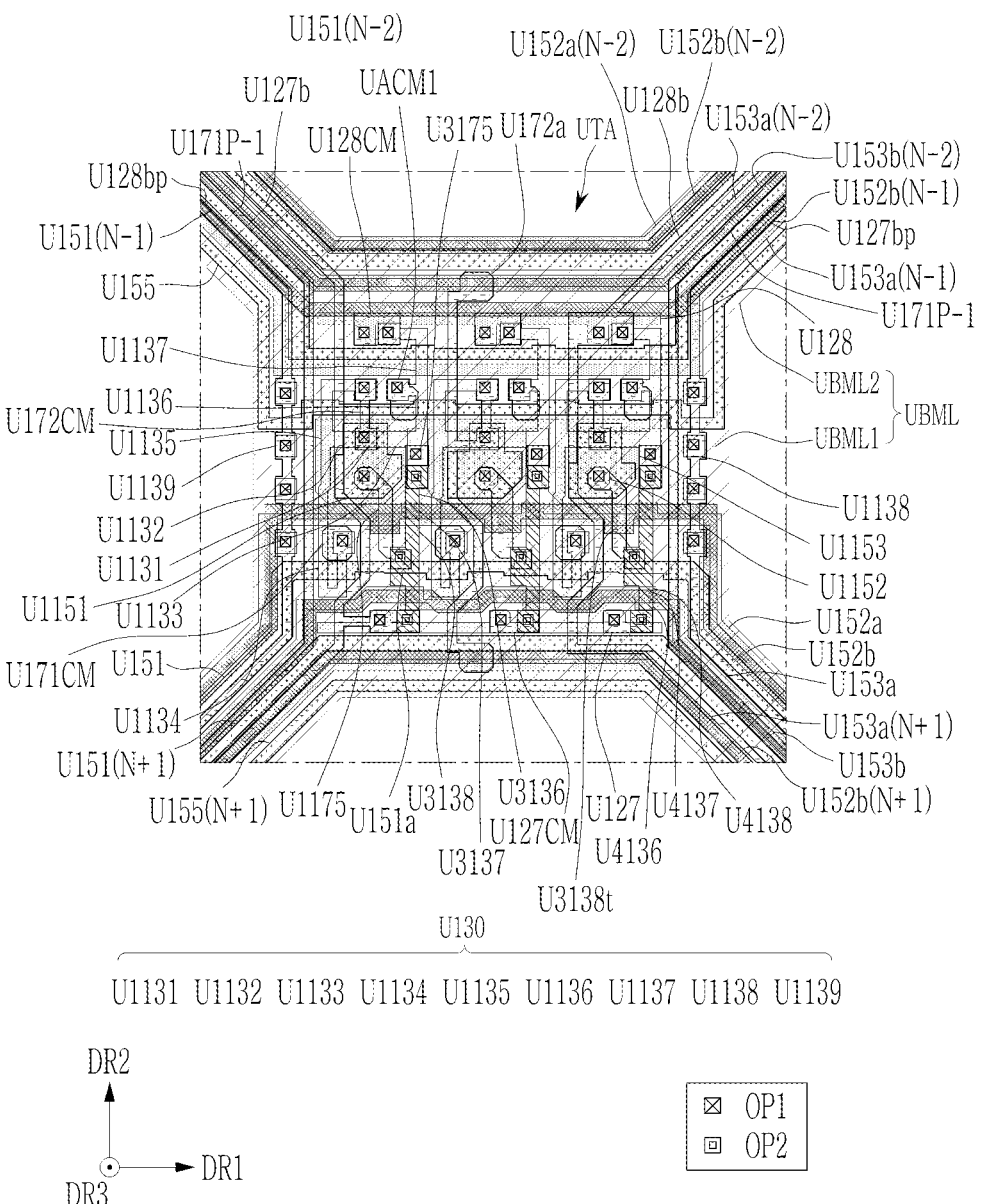

Referring to FIG. 29 and FIG. 30, on the second interlayer insulating layer 162, a first data conductive layer SD1 including a first connection electrode U1175, a second connection electrode U3175, and a first bypass data line U171*p*-1 may be positioned. FIG. 29 is a schematic top plan view showing only the first data conductive layer SD1 and openings OP1 and OP2 since it may be difficult to readily recognize the first data conductive layer SD1 in FIG. 30, and FIG. 30 is a schematic top plan view showing all layers below the first data conductive layer SD1.

The first connection electrode U1175 may overlap the gate electrode U1151 of the driving transistor T1. The first connection electrode U1175 may be connected (e.g., electrically connected) to the gate electrode U1151 of the driving transistor T1 through the opening OP1 and the opening U1152 of the first storage electrode U1153. The first connection electrode U1175 may overlap the boost capacitor Cboost. The first connection electrode U1175 may be connected (e.g., electrically connected) to the upper boost electrode U3138*t* of the boost capacitor Cboost through the opening OP2. Accordingly, the gate electrode U1151 of the driving transistor T1 and the upper boost electrode U3138*t* of the boost capacitor Cboost may be connected (e.g., electrically connected) by the first connection electrode U1175. For example, the gate electrode U1151 of the driving transistor T1 may also be connected (e.g., electrically connected) to the second area U3138 of the third transistor T3 and the second area U4138 of the fourth transistor T4 by the first connection electrode U1175.

The second connection electrode U3175 may overlap the second area U1133 of the driving transistor T1. The second connection electrode U3175 may be connected (e.g., electrically connected) to the second area U1133 of the driving transistor T1 through the opening OP1. The second connection electrode U3175 may overlap the first area U3136 of the third transistor T3. The second connection electrode U3175 may be connected (e.g., electrically connected) to the first area U3136 of the third transistor T3 through the opening OP2. Accordingly, the second area U1133 of the driving transistor T1 and the first area U3136 of the third transistor T3 may be connected (e.g., electrically connected) by the second connection electrode U3175.

The first bypass data line U171*p*-1 may extend in the approximately vertical direction (e.g., the second direction DR2), may not be connected (e.g., electrically connected) to the unit pixel UPC of the second component area EA2, but may be only connected to the normal pixel of the display area DA positioned on sides (e.g., opposite sides) of the second component area EA2 and may extend by bypassing the unit pixel UPC of the second component area EA2.

Referring to FIG. 16 and FIG. 17, the data line 171 of the normal pixel may be positioned in (or formed of) the second data conductive layer SD2, and in the second component area EA2, the first bypass data line U171*p*-1 may be formed in the first data conductive layer SD1. The data voltage may be transmitted to the first bypass data line U171*p*-1 through the data line 171 of the normal pixel and may be again transmitted to the data line 171 of the normal pixel, so that it is necessary to form a contact structure in which one of the data lines 171 of the normal pixel and the first bypass data line U171*p*-1 are connected. Referring to FIG. 29 to FIG. 32, an opening through which the first bypass data line U171*p*-1 is connected to the other portion is not shown in the second component area EA2. For example, in case that the opening where the first bypass data line U171*p*-1 is connected to the data line 171 of the normal pixel is positioned within the unit pixel UPC, the area of the unit pixel UPC may not help increasing. For example, considering that it is common to extend the width of the wiring in the portion overlapping the opening as the width of the wiring is reduced, the area of the unit pixel UPC may be increased relatively significantly. In case that the area of the unit pixel UPC increases in case that the area of the second component area EA2 is constant, the area of the light transmissive area UTA may decrease, and the light transmittance of the second component area EA2 may decrease. In an embodiment, the contact structure that connects the first bypass data line U171*p*-1 and the data line 171 of the normal pixel to each other by forming the opening overlapping thereto may be disposed on the boundary area positioned between the display area DA and the second component area EA2 (or boundary area positioned between the normal pixel and the second component pixel (or the unit pixel UPC)) so that the area of the light transmissive area UTA may not be reduced and the light transmittance of the second component area EA2 may increase.

For example, in addition to the data line, the contact structure in which the wiring such as the signal line, the control line, the voltage line, etc. having the bypass structure may be connected (e.g., electrically connected) the portion positioned in another conductive layer through the opening may be not formed within the unit pixel UPC, but may be positioned in the boundary area. According to an embodiment, in order to further improve the light transmittance, the contact structures that connect the wirings such as the signal lines, the control lines, the voltage lines, etc. that should be connected through different conductive layers may all be disposed in the boundary area.

In FIG. 29 and FIG. 30, in a single unit pixel (UPC) structure, a pair of first bypass data lines U171$p$-1 may be provided in the first data conductive layer SD1, and a first bypass data line U171$p$-1 may be provided. Thus, the data lines 171 of the display area DA may be connected (e.g., electrically connected) to each other.

The first data conductive layer SD1 may further include a first initialization voltage line U127$b$ and a second initialization voltage line U128$b$.

The first initialization voltage line U127$b$ and the second initialization voltage line U128$b$ extend in approximately the vertical direction (e.g., the second direction DR2) and have protruded or extended portions.

The protruded portion of the first initialization voltage line U127$b$ may be connected (e.g., electrically connected) to the first initialization voltage applying part U127 positioned on the second gate conductive layer GAT2 through the opening OP1 and may be connected (e.g., electrically connected) to the first area U4136 of the fourth transistor T4 positioned on the oxide semiconductor layer through the opening OP2. For example, the connection part U127CM corresponding to the protruded portion of the first initialization voltage line U127$b$ and positioned on the portion overlapping the first initialization voltage applying part U127 and the first area U4136 of the fourth transistor T4 may be connected (e.g., electrically connected) to the first initialization voltage applying part U127 through the opening OP1 and may be connected (e.g., electrically connected) to the first area U4136 of the fourth transistor T4 through the opening OP2. As a result, the first initialization voltage VINT flowing through the first initialization voltage line U127$b$ may be transmitted to the first area U4136 of the fourth transistor T4 through the first initialization voltage applying part U127.

For example, the extended portion of the second initialization voltage line U128$b$ may be connected (e.g., electrically connected) to the second initialization voltage applying part U128 positioned in (or formed of) the second gate conductive layer GAT2 through the opening OP1 and may be connected (e.g., electrically connected) to a portion U1137 of the first semiconductor layer U130 through the opening OP2 to be connected (e.g., electrically connected) to the first electrode of the seventh transistor T7. For example, a connection part U128CM corresponding to the expanded portion of the second initialization voltage line U128$b$ and positioned at the portion overlapping the second initialization voltage applying part U128 and a portion U1137 of the first semiconductor layer U130 may be connected (e.g., electrically connected) to the second initialization voltage applying part U128 through the opening OP1 and may be connected (e.g., electrically connected) to the first electrode of the seventh transistor T7 through the opening OP2. As a result, the second initialization voltage VAINT flowing through the second initialization voltage line U128$b$ may be transmitted to the first electrode of the seventh transistor T7 through the second initialization voltage applying part U128.

For example, the first data conductive layer SD1 may further include a bypass first initialization voltage line U127$bp$ and a bypass second initialization voltage line U128$bp$ extending in approximately vertical direction (e.g., second direction DR2).

The bypass first initialization voltage line U127$bp$ may be connected (e.g., electrically connected) to first island parts U1138 positioned on the first semiconductor layer U130 through the opening OP1 to form a blocking structure, and the bypass second initialization voltage line U128$bp$ may be also connected to second island part U1139 positioned on the first semiconductor layer U130 through the opening OP1 to form a blocking structure.

The bypass first initialization voltage line U127$bp$ and the bypass second initialization voltage line U128$bp$ may be positioned outside the other wiring (e.g., the first bypass data line U171$p$-1, the first initialization voltage line U127$b$, and the second initialization voltage line U128$b$) extending approximately in the vertical direction (e.g., the second direction DR2), thereby the blocking structure as described above may function to block light from flowing from the light transmissive area UTA to the side of the unit pixel UPC. For example, this blocking structure may not be a structure that connects the voltage lines passing through the display area DA and the second component area EA2.

In case that the bypass first initialization voltage line U127$bp$ and the bypass second initialization voltage line U128$bp$ also need to be connected (e.g., electrically connected) to other conductive layers through an opening, a contact structure may be formed in the boundary area as the first bypass data line U171$p$-1.

The first data conductive layer SD1 may have a driving voltage applying part U172$a$ having an island-like structure elongated in approximately a vertical direction (e.g., the second direction DR2). The driving voltage applying part U172$a$ may have expansion parts at ends (e.g., opposite ends), and a protruded part protruded on the middle. The protruded part of the driving voltage applying part U172$a$ may be connected (e.g., electrically connected) to a portion U1135 of the first semiconductor layer U130 and the first storage electrode U1153 of the second gate conductive layer GAT2 through the opening OP1. As a result, the driving voltage ELVDD may be applied to the first electrode of the fifth transistor T5 and the first storage electrode U1153.

For example, the connection part U172CM corresponding to the protruded part of the driving voltage applying part U172$a$ and positioned at the portion overlapping a portion U1135 of the first semiconductor layer U130 and the first storage electrode U1153 may be connected (e.g., electrically connected) to a portion U1135 of the first semiconductor layer U130 and the first storage electrode U1153 of the second gate conductive layer GAT2 through the opening OP1. As a result, the driving voltage ELVDD transmitted to the driving voltage applying part U172$a$ may be applied to the first electrode of the fifth transistor T5 and the first storage electrode U1153 through the connection part U172CM.

For example, the first data conductive layer SD1 may further include a connection part U171CM and an anode connection part UACM1.

The connection part U171CM may be electrically connected to a portion 1134 of the first semiconductor layer 130, e.g., the second transistor T2, through the opening OP1.

The anode connection part UACM1 may be electrically connected to a portion 1136 of the first semiconductor layer 130, e.g., the sixth transistor T6 through the opening OP1. The first data conductive layer SD1 of the second component area EA2 may be formed of the same material and by the same process as the first data conductive layer SD1 of the normal pixel, and the first data conductive layer SD1 of the second component area EA2 may include a metal such as aluminum (Al), copper (Cu), It molybdenum (Mo), titanium (Ti), or a metal alloy, and may be formed of a single layer or multiple layers.

Referring to FIG. 34, a first organic layer 181 may be positioned on the first data conductive layer SD1 including the first connection electrode U1175 and the second connection electrode U3175. The first organic layer 181 may be an organic insulator including an organic material, and the organic material may include at least one material selected from a group consisting of polyimide, polyamide, acryl resin, benzocyclobutene, and phenol resin.

Figure 31:
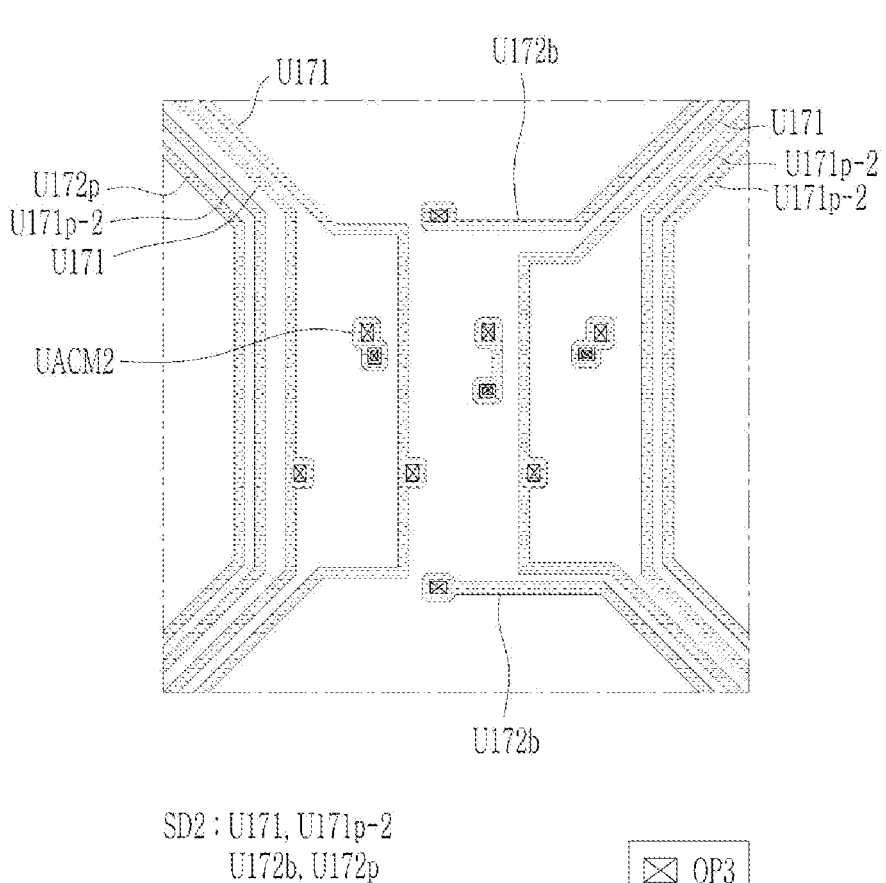
Figure 32:
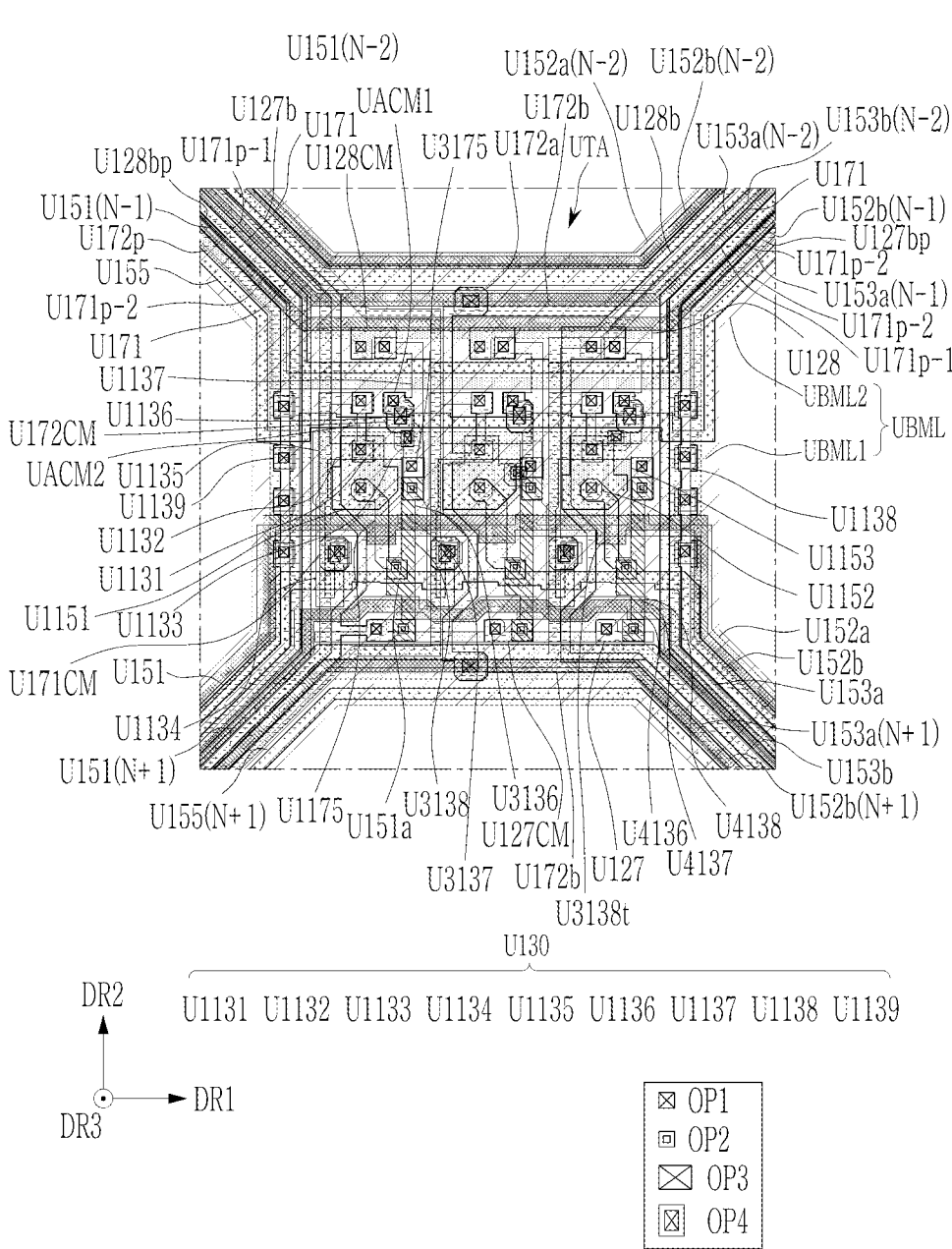

Referring to FIG. 31, FIG. 32, and FIG. 34, the first organic layer 181 may include a lower organic layer opening OP3.

On the first organic layer 181, a second data conductive layer SD2 including a data line U171, a driving voltage line U172b, and an anode connection part UACM2 may be positioned.

On the second data conductive layer SD2, a second organic layer 182 and a third organic layer 183 may be positioned, and an anode connection opening OP4 may be formed in the second organic layer 182 and the third organic layer 183. The anode connection part UACM2 may be electrically connected to the anode (e.g., UAnode in FIG. 33) through the anode connection opening OP4. FIG. 31 is a schematic top plan view only showing the second data conductive layer SD2 and the openings OP3 and OP4 since it is difficult to readily recognize the second data conductive layer SD2 in FIG. 32, and FIG. 32 is a schematic top plan view showing the second data conductive layer SD2 and all surrounding layers.

Referring to FIG. 31 and FIG. 32, the lower organic layer opening OP3 may overlap the connection part U171CM, the anode connection part UACM1, and the expansion part of the driving voltage applying part U172a positioned (or formed of) in the first data conductive layer SD1 to be exposed.

The second data conductive layer SD2 may include a data line U171, a second bypass data line U171p-2, a driving voltage line U172b, a bypass driving voltage line U172p, and an anode connection part UACM2.

The data line U171, the second bypass data line U171p-2, the driving voltage line U172b, and the bypass driving voltage line U172p may extend in approximately vertical direction (e.g., the second direction DR2).

The data line U171 may be connected (e.g., electrically connected) to the connection part U171CM of the first data conductive layer SD1 through the lower organic layer opening OP3 and may be connected (e.g., electrically connected) to the second transistor T2 through this.

The driving voltage line U172b may be electrically connected to the fifth transistor T5 and the first storage electrode 1153 through the expansion part of the driving voltage applying part U172a of the first data conductive layer SD1 through the lower organic layer opening OP3.

The bypass driving voltage line U172p may not be connected (e.g., electrically connected) to the driving voltage applying part U172a of the present unit pixel UPC, but the bypass driving voltage line U172p may be connected to the driving voltage applying part U172a (referred to as an additional driving voltage applying part) of the adjacent unit pixel UPC.

The anode connection part UACM2 may be electrically connected to the anode connection part UACM1 of the first data conductive layer SD1 through the opening OP3, and may be electrically connected to the sixth transistor T6.

The second bypass data line U171p-2 may not include a separate contact structure because it is located in the second data conductive layer SD2 like the data line 171 of the normal pixel. For example, the data voltage may be transmitted to the second bypass data line U171p-2 through the data line 171 of the normal pixel, and to the data line 171 of the normal pixel again. For example, the data line 171 of the normal pixel and the second bypass data line U171p-2 may be integral with each other, thereby not including a contact structure. For example, in case that the second bypass data line U171p-2 needs to be connected (e.g., electrically connected) with another conductive layer through an opening, a contact structure may be formed in the boundary area like the first bypass data line U171p-1.

The second data conductive layer SD2 of the second component area EA2 may be formed of the same material and by the same process as the second data conductive layer SD2 of the normal pixel, and the second data conductive layer SD2 of the second component area EA2 may include a metal or a metal alloy such as aluminum (Al), copper (Cu), molybdenum (Mo), or titanium (Ti), and may be formed of a single layer or multiple layers.

In the embodiment shown in FIG. 29 to FIG. 32, the number of the first bypass data lines U171p-1 and the number of second bypass data lines U171p-2 may be 2 and 3, respectively. This is the reason that the normal pixel of the display area DA includes one red normal pixel, one blue normal pixel, and two green normal pixels, the unit pixel UPC of the second component area EA2 includes one second component pixel each, and only one unit pixel UPC is formed in a space where a total of eight the normal pixels are disposed. For example, only three of the eight data lines connected to the eight normal pixels may be connected (e.g., electrically connected) to the unit pixel UPC, and the other five data lines may become the bypass data lines and may not be connected (e.g., electrically connected) to the unit pixel UPC. In an embodiment, two bypass data lines may be positioned in (or formed of) the first data conductive layer SD1 as the first bypass data line U171p-1, and the remaining three bypass data lines may be positioned in (or formed of) the second data conductive layer SD2 as the second bypass data line U171p-2.

These bypass data lines may form a contact structure in the boundary area positioned between the display area DA and the second component area EA2 in case that it is necessary to connect them through an opening with another conductive layer.

Referring to FIG. 34, the second organic layer 182 and the third organic layer 183 may be positioned on the second data conductive layer SD2. The second organic layer 182 and the third organic layer 183 may be organic insulators, and may include at least one material selected from the group consisting of polyimide, polyamide, acryl resin, benzocyclobutene, and phenol resin. In another example, the third organic layer 183 may be omitted.

Figure 33:
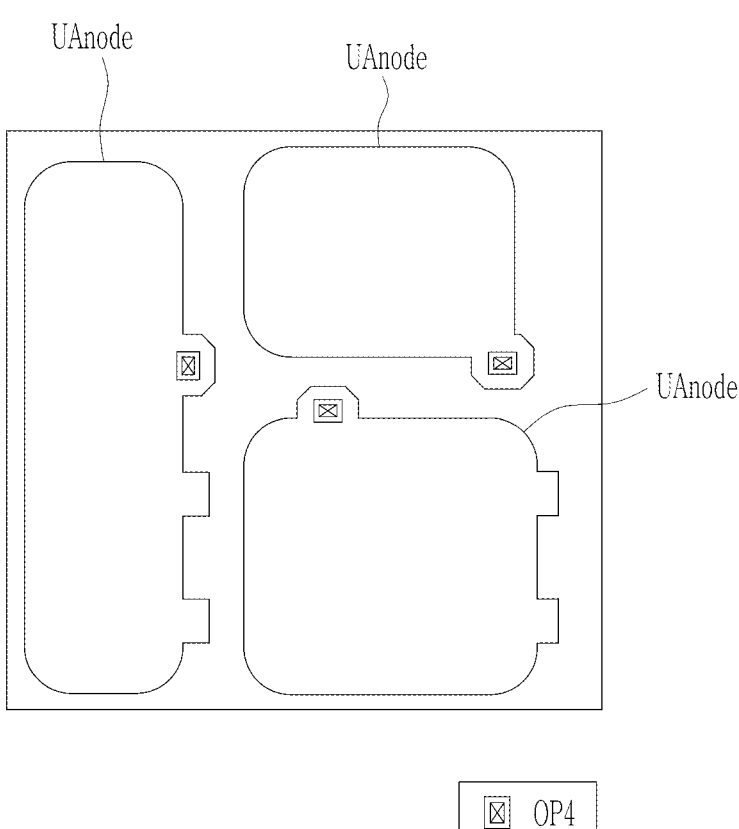

Referring to FIG. 33 and FIG. 34, the second organic layer 182 and the third organic layer 183 include an anode connection opening OP4. For example, the anode UAnode and the anode connection part UACM2 may be electrically connected.

Referring to FIG. 33, the anode UAnode may be formed on the third organic layer 183. The anode UAnode may further include an extended portion to receive the current from the pixel circuit part through the anode connection opening OP4.

The cross-section structure of the light transmissive area UTA of the second component area EA2 in addition to the cross-section structure of the normal pixel having the same structure as that of FIG. 7 to FIG. 18 and the unit pixel UPC of the second component area EA2 having the same structure as that of FIG. 22 to FIG. 33 is described through FIG. 34.

FIG. 34 is a schematic cross-sectional view of a light emitting display device according to an embodiment.

FIG. 34 may be largely divided into the cross-section structure of the light transmissive area UTA and the cross-section structure of the pixel. For example, the pixel may correspond to the normal pixel of the display area DA, and the component pixel of the first and second component areas EA1 and EA2. Hereinafter, the structure of the normal pixel will be described.

The light emitting display device may be largely divided into a lower panel layer and an upper panel layer, and the lower panel layer may be the portion where the light emitting diode LED and the pixel circuit part of the pixel are positioned, and may include up to an encapsulation layer 400 covering. For example, the pixel circuit part may include the second organic layer 182 and the third organic layer 183, and means the configuration below it, and the light emitting diode LED may be the upper part of the third organic layer 183, and may mean the configuration positioned under the encapsulation layer 400. The structure positioned above the encapsulation layer 400 may correspond to the upper panel layer. In another example, the third organic layer 183 may not be included.

Referring to FIG. 34, the substrate 110 may include first, second, third, and fourth sub-substrate layers 110-1, 110-2, 110-3, and 110-4.

Each of the first sub-substrate layer 110-1 and the fourth sub-substrate layer 110-4 may include at least one of a polyimide-based resin, an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. For example, each of the first and fourth sub-substrate layers 110-1 and 110-4 may include a polyimide.

Each of the second sub-substrate layer 110-2 and the third sub-substrate layer 110-3 may include an inorganic material. For example, each of the second sub-substrate layer 110-2 and the third sub-substrate layer 110-3 may include at least one of a silicon oxide, a silicon nitride, a silicon oxynitride, and an amorphous silicon. For example, the second sub-substrate layer 110-2 may include a silicon oxynitride, and the third sub-substrate layer 110-3 may include a silicon oxide.

The thickness of the first sub-substrate layer 110-1 may be thicker than the thickness of the fourth sub-substrate layer 110-4. For example, the thickness of the first sub-substrate layer 110-1 may be about 100,000 angstroms, and the thickness of the fourth sub-substrate layer 110-4 may be about 56,000 angstroms. The thickness of the second sub-substrate layer 110-2 may be thinner than the thickness of the third sub-substrate layer 110-3. For example, the thickness of the second sub-substrate layer 110-2 may be about 1,000 angstroms, and the thickness of the third sub-substrate layer 110-3 may be about 5,000 angstroms. However, the thickness of the first, second, third, and fourth sub-substrate layers 110-1, 110-2, 110-3, and 110-4 are not limited to the above values.

A barrier layer 110-5 may be disposed over the substrate 110. The barrier layer 110-5 may include sub-barrier layers 110-51, 110-52, 110-53, 110-54, 110-55, and a metal layer BML.

Sub-barrier layers 110-51, 110-52, 110-53, 110-54, and 110-55 may include a first sub-barrier layer 110-51, a second sub-barrier layer 110-52, a third sub-barrier layer 110-53, a fourth sub-barrier layer 110-54, and a fifth sub-barrier layer 110-55, which are sequentially stacked in a direction away from the substrate 110. Each of the first, second, third, fourth and fifth sub-barrier layers 110-51, 110-52, 110-53, 110-54, and 110-55 may include an inorganic material. For example, each of the first, second, third, fourth, and fifth sub-barrier layers 110-51, 110-52, 110-53, 110-54, and 110-55 may include at least one of a silicon oxide, a silicon nitride, a silicon oxynitride, and an amorphous silicon. For example, the first sub-barrier layer 110-51 may include a silicon oxynitride, the second sub-barrier layer 110-52 may include a silicon oxide, and the third sub-barrier layer 110-53 may include an amorphous silicon, the fourth sub-barrier layer 110-54 may include a silicon oxide, and the fifth sub-barrier layer 110-55 may include a silicon oxide.

Among the first, second, third, fourth and fifth sub-barrier layers 110-51, 110-52, 110-53, 110-54, and 110-55, the fifth sub-barrier layer 110-55 may be closest to the transistor. The fifth sub-barrier layer 110-55 may be referred to as an upper sub-barrier layer. The thickness of the fifth sub-barrier layer 110-55 may be thicker than the thickness of each of the first, second, third, and fourth sub-barrier layers 110-51, 110-52, 110-53, and 110-54. For example, the thickness of the fifth sub-barrier layer 110-55 may be greater than the sum of the thickness of the first, second, third, and fourth sub-barrier layers 110-51, 110-52, 110-53, and 110-54. For example, the first sub-barrier layer 110-51 may be about 1,000 angstroms, the second sub-barrier layer 110-52 may be about 1,500 angstroms, the third sub-barrier layer 110-53 may be about 100 angstroms, the fourth sub-barrier layer 110-54) may be about 130 angstroms, and the fifth sub-barrier layers 110-55 may be about 4,200 angstroms. For example, the thickness of the fifth sub-barrier layer 110-55 may be thicker than the thickness described above.

A constant voltage having a certain voltage level may be applied to the metal layer BML, and as an example, the driving voltage ELVDD may be provided.

The metal layer BML may be disposed between the fourth sub-barrier layer 110-54 and the fifth sub-barrier layer 110-55. The metal layer BML may be covered by the fifth sub-barrier layer 110-55. Since the fifth sub-barrier layer 110-55 has the thickest thickness among the first, second, third, fourth, and fifth sub-barrier layers 110-51, 110-52, 110-53, 110-54, and 110-55, the degree of the change in the characteristics of the transistors may be reduced by the voltages provided to the metal layer BML.

The metal layer BML may have an opening BMop that defines the light transmissive area UTA. The metal layer BML may be a pattern that functions as a mask in case that the opening CEop on the cathode Cathode may be formed. For example, light irradiated toward the cathode Cathode from the rear surface of the substrate 110 may pass through the opening BMop of the metal layer BML to reach a portion of each of the cathode Cathode and the capping layer CPA. For example, a portion of the cathode Cathode and the capping layer CPA may be removed by light passing through the opening BMop of the metal layer BML. The light may be a laser beam.

An area overlapping the opening BMop of the metal layer BML may be defined as a light transmissive area UTA, and the remaining area may be defined as an area other than the light transmissive area UTA, e.g., the display area DA or the component area EA. The metal layer BML may include titanium, silver, an alloy including silver, molybdenum, an alloy including molybdenum, aluminum, an alloy including aluminum, aluminum nitride, tungsten, tungsten nitride, copper, indium tin oxide, or indium zinc oxide and the like, but embodiments are not limited thereto.

The buffer layer 111 may be disposed over the barrier layer 110-5. The buffer layer 111 may be provided in all of the display area DA, the component area EA, and the light transmissive area UTA. The buffer layer 111 may prevent diffusion of metal atoms or impurities from the substrate 110 to the first semiconductor pattern layer ACT1. For example, the buffer layer 111 may adjust the heat supply speed during the crystallization process for forming the first semiconductor pattern layer ACT1 so that the first semiconductor pattern layer ACT1 may be uniformly formed.

The buffer layer 111 may include inorganic layers. For example, the buffer layer 111 may include a first sub-buffer layer including a silicon nitride, and a second sub-buffer layer disposed over the first sub-buffer layer and including a silicon oxide. The buffer layer 111 may not overlap the light transmissive area UTA. For example, an opening ILop corresponding to the light transmissive area UTA may be defined in the buffer layer 111. As the buffer layer 111 is not provided in the light transmissive area UTA, the transmittance of the light transmissive area UTA may be further improved.

The pixel circuit part including a transistor may be disposed over the buffer layer 111, and a light emitting diode LED may be disposed over the pixel circuit part.

A silicon thin film transistor LTPS TFT and an oxide thin film transistor Oxide TFT of the pixel circuit part are illustrated as examples.

The first semiconductor pattern layer ACT1 may be disposed on the buffer layer 111. The first semiconductor pattern layer ACT1 may include a silicon semiconductor. For example, the silicon semiconductor may include amorphous silicon, polycrystalline silicon, or the like. For example, the first semiconductor pattern layer ACT1 may include low temperature polysilicon.

Only one portion of the first semiconductor pattern layer ACT1 disposed on the buffer layer 111 is illustrated, and the first semiconductor pattern layer ACT1 may be further disposed in another area. The first semiconductor pattern layer ACT1 may be arranged in a specific pattern across the pixels. The first semiconductor pattern layer ACT1 may have different electrical properties according to whether the first semiconductor pattern layer ACT1 is doped or not. The first semiconductor pattern layer ACT1 may include a first area having high conductivity and a second area having low conductivity. The first area may be doped with an N-type dopant or a P-type dopant. The P-type transistor may include a doping area doped with a P-type dopant, and the N-type transistor may include a doping area doped with an N-type dopant. The second area may be a non-doped area or an area doped with a lower concentration than the first area.

The conductivity of the first area may be greater than that of the second area, and the first area may act substantially as an electrode or signal line. The second area may substantially correspond to an active area (or the channel) of the transistor. For example, a portion of the semiconductor pattern layer may be an active area of the transistor, another portion may be a source or a drain of the transistor, and another portion may be a connection electrode or a connection signal line.

The source area, the active area, and the drain area of the silicon thin film transistor LTPS TFT may be formed from a first semiconductor pattern layer ACT1. The source area and drain area may extend in the opposite directions from the active area on the cross-section.

The pixel circuit part may include inorganic layers and organic layers. In an embodiment, the insulating layers 141, 142, 143, 161, and 162 stacked on the buffer layer 111 may be inorganic layers, and the insulating layers 181, 182, and 183 may be organic layers.

The first gate insulating layer 141 may be disposed over the buffer layer 111. The first gate insulating layer 141 may cover the first semiconductor pattern layer ACT1. The first gate insulating layer 141 may be an inorganic layer and/or an organic layer, and may have a single-layered structure or a multi-layered structure. The first gate insulating layer 141 may include at least one of aluminum oxide, titanium oxide, silicon oxide, silicon nitride, silicon oxynitride, zirconium oxide, and hafnium oxide. In an embodiment, the first gate insulating layer 141 may be a single-layer silicon oxide layer. The insulating layer described below as well as the first gate insulating layer 141 may have a single-layered structure or a multi-layered structure.

The gate electrode GE1 of the silicon thin film transistor LTPS TFT or LTPS TFTa may be disposed on the first gate insulating layer 141. The gate electrode GE1 may be a portion of a metal pattern layer. The gate electrode GE1 may overlap the active area. In the process of doping the first semiconductor pattern layer, the gate electrode GE1 may function as a mask. The gate electrode GE1 may include titanium, silver, an alloy including silver, molybdenum, an alloy including molybdenum, aluminum, an alloy including aluminum, aluminum nitride, tungsten, tungsten nitride, copper, indium tin oxide, or indium zinc oxide and the like, but embodiments are not limited thereto.

The second gate insulating layer 142 may be disposed on the first gate insulating layer 141 and may cover the gate electrode GE1. The second gate insulating layer 142 may be an inorganic layer and may have a single layer or a multi-layered structure. The second gate insulating layer 142 may include at least one of silicon oxide, silicon nitride, and silicon oxynitride. In an embodiment, the second gate insulating layer 142 may have a single-layer structure including a silicon nitride layer.

The first interlayer insulating layer 161 may be disposed over the second gate insulating layer 142. The first interlayer insulating layer 161 may be an inorganic layer and may have a single layered structure or a multi-layered structure. For example, the first interlayer insulating layer 161 may have a multi-layered structure including a silicon oxide layer and a silicon nitride layer. An electrode CE of the capacitor (e.g., storage capacitor Cst or boost capacitor Cboost) may be disposed between the second gate insulating layer 142 and the first interlayer insulating layer 161. For example, another electrode of the capacitor (e.g., storage capacitor Cst or boost capacitor Cboost) may be disposed between the first gate insulating layer 141 and the second gate insulating layer 142.

The second semiconductor pattern layer ACT2 may be disposed on the first interlayer insulating layer 161. The second semiconductor pattern layer ACT2 may include an oxide semiconductor. The oxide semiconductor may include areas that are divided according to whether or not the metal oxide is reduced. The area in which the metal oxide is reduced (hereinafter, a reduced area) may have greater conductivity than the area in which it is not (hereinafter, a non-reduced area). The reduced area may have substantially the role of source/drain or signal line of the transistor. The non-reduced area substantially corresponds to the active area (or the semiconductor area, the channel) of the transistor. For example, a portion of the second semiconductor pattern layer ACT2 may be an active area of the transistor, another portion may be a source/drain area of the transistor, and another portion may be a signal transmission area.

The source area, the active area, and the drain area of an oxide thin film transistor Oxide TFT may be formed from the second semiconductor pattern layer ACT2. The source area and the drain area may extend in opposite directions from the active area on the cross-section.

The oxide thin film transistor Oxide TFT may overlap the metal layer BML. Therefore, the light incident from the lower part of the display panel DP may be blocked by the metal layer BML, so the light may not be provided to the active area of the oxide thin film transistor Oxide TFT, and a static electricity potential voltage caused by a polarization of the lower substrate may be shielded.

According to the position, the oxide thin film transistor Oxide TFT may not overlap the metal layer BML, and a layer for blocking light and shielding the lower portion of the oxide thin film transistor Oxide TFT may be added.

The third gate insulating layer 143 may be disposed over the first interlayer insulating layer 161. The third gate insulating layer 143 may cover the second semiconductor pattern layer ACT2. The third gate insulating layer 143 may be an inorganic layer and may have a single layer or a multi-layered structure. The third gate insulating layer 143 may include at least one of aluminum oxide, titanium oxide, silicon oxide, silicon nitride, silicon oxynitride, zirconium oxide, and hafnium oxide. In an embodiment, the third gate insulating layer 143 may have a single-layer structure including a silicon oxide.

The gate electrode GE2 of the oxide thin film transistor Oxide TFT may be disposed on the third gate insulating layer 143. The gate electrode GE2 may be a portion of a metal pattern layer. The gate electrode GE2 may overlap the active area. In the process of doping the second semiconductor pattern layer ACT2, the gate electrode GE2 may function as a mask.

The second interlayer insulating layer 162 may be disposed on the third gate insulating layer 143 and may cover the gate electrode GE2. The second interlayer insulating layer 162 may be an inorganic layer and/or an organic layer, and may have a single layer or a multi-layered structure. For example, the second interlayer insulating layer 162 may have a multi-layered structure including a silicon oxide layer and a silicon nitride layer.

An opening ILop may be defined in at least some insulating layers of the buffer layer 111 and insulating layers 141, 142, 143, 161, 162, 181, 182, and 183 included in the pixel circuit part. For example, the opening ILop may be defined in the buffer layer 111 and the insulating layers 141, 142, 143, 161, and 162, and the buffer layer 111 and the insulating layers 141, 142, 143, 161, and 162 overlapping the light transmissive area UTA may be respectively removed, the transmittance of the light transmissive area UTA may be improved.

The side wall of the buffer layer 111 and the insulating layers 141, 142, 143, 161, and 162 may be more protruded than the side wall of the metal layer BML.

The first organic layer 181 may be disposed over the second interlayer insulating layer 162. The first organic layer 181 may include an organic material, and the first organic layer 181 may include a polyimide-based resin. For example, the first organic layer 181 may include a photo-sensitive polyimide.

The first organic layer 181 may be disposed to a display area DA, a component area EA, and a light transmissive area UTA. Accordingly, the first organic layer 181 may be referred to as a common organic layer. The first organic layer 181 may have a structure filling the opening ILop positioned in the buffer layer 111 and the insulating layers 141, 142, 143, 161, and 162. For example, the first organic layer 181 may overlap the light transmissive area UTA. As the first organic layer 181 is provided in the light transmissive area UTA, the step difference of the upper surface of the first organic layer 181 may be reduced. In case that the step difference of the layers overlapping the light transmissive area UTA is reduced, diffraction of light incident to the light transmissive area UTA may be smoothed (or reduced). Accordingly, an image distortion due to the diffraction may be reduced, and the quality of the images acquired from the devices such as a camera positioned on the rear surface may be improved.

A portion in the thickness direction of the preliminary common organic layer 60_P disposed to the light transmissive area UTA may be removed to form (or provide) the first organic layer 181. In FIG. 34, the preliminary common organic layer 60-P may be shown by a dotted line, and the removed portion 60-del may be shown by a dark hatching. A halftone mask may be used to form the first organic layer 181 from the preliminary common organic layer 60-P.

The thickness of the first organic layer 181 in the light transmissive area UTA may be less than the thickness of the first organic layer 181 in the display area DA and the component area EA. For example, the thickness of the light transmissive area UTA may be the minimum thickness or the average thickness of the first organic layer 181, and the thickness in the display area DA and the component area EA may be the maximum thickness or the average thickness of the first organic layer 181. The thickness of the light transmissive area UTA may be at least 40 percent and less than 100 percent of the thickness at the display area DA and the component area EA. As the thickness difference of the first organic layer 181 according to the area increases, the step difference of the upper surface of the first organic layer 181 may increase. For example, in the process of patterning the conductive layer closest to the light transmissive area UTA, the conductive layer may be more patterned (or removed) than the design. For example, the probability that the line (or the wiring) becomes thinner may increase, and accordingly, the probability of the occurrence of defects may increase. As in an embodiment, in case that the thickness difference is provided by more than 40 percent, the probability of the defect may be reduced. Therefore, the transmittance of the light transmissive area UTA may be improved by providing the thickness difference according to the area by 40 percent or more, and the side effects may be minimized.

For example, in case that the thickness in the display area DA and the component area EA is about 15,000 angstroms, the thickness the light transmissive area UTA may be about 6,000 angstroms or more and about 10,000 angstroms or less. in case that the thickness of the light transmissive area UTA exceeds about 10,000 angstroms, the transmittance improvement effect may deteriorate. Therefore, the thickness of the light transmissive area UTA may be determined within the range of more than 40 percent of the thickness in the display area DA and the component area EA and less than about 10,000 angstroms.

A second organic layer 182 may be dispose on the top surface (or upper surface) of the first organic layer 181, and a third organic layer 183 may be disposed on the top surface (or upper surface) of the second organic layer 182.

Each of the first organic layer 181, the second organic layer 182, and the third organic layer 183 may include general-purpose polymers such as BCB (Benzocyclobutene), polyimide, HMDSO (Hexamethyldisiloxane), poly(methyl methacrylate) (PMMA), or polystyrene (PS), phenolic group-including polymer derivatives, acryl-based polymers, imide-based polymers, aryl ether-based polymers, amide-based polymers, fluorine-based polymers, p-xylene-based polymers, vinyl alcohol-based polymers, and combination thereof.

The light emitting diode LED may be disposed over the pixel circuit part. Each light emitting diode LED include the anode Anode, the first functional layer FL1, the emission layer EML, the second functional layer FL2, and the cathode Cathode. The first functional layer FL1, the second functional layer FL2, and the cathode Cathode may be entirely provided to the display area DA and the component area EA except for the light transmissive area UTA.

The anode Anode may be disposed over the third organic layer 183. The anode Anode may be connected to an electrode of the pixel circuit part through an opening through the second organic layer 182 and the third organic layer 183. The anode Anode may be a transmissive electrode (or semi-transmissive electrode) or a reflective electrode. In an embodiment, the anode Anode may include a reflective layer formed of silver, magnesium, aluminum, platinum, palladium, gold, nickel, neodymium, iridium, chromium, or a compound thereof, and a transparent or semi-transparent electrode layer formed on the reflective layer. The transparent or semi-transparent electrode layer may include at least one selected from the group consisting of indium tin oxide, indium zinc oxide, indium gallium zinc oxide, zinc oxide, or indium oxide, and aluminum doped zinc oxide. For example, the anode Anode may be provided as a multi-layered structure in which indium tin oxide, silver, and indium tin oxide are sequentially stacked.

The pixel definition layer 380 may be disposed over the third organic layer 183. The pixel definition layer 380 may have a property of absorbing light, for example, the pixel definition layer 380 may have a black color. The pixel definition layer 380 may include a black component (e.g., a black color agent). The black component may include black dye and black pigment. The black component may include a carbon black, a metal such as chromium, or an oxide thereof.

In the pixel definition layer 380, an opening OP exposing a portion of the anode Anode may be defined. For example, the pixel definition layer 380 may cover the edge of the anode Anode. For example, the pixel definition layer 380 may cover the side of the third organic layer 183 adjacent to the light transmissive area UTA. The pixel definition layer 380 may be spaced apart from the side of the second organic layer 182 adjacent to the light transmissive area UTA. Accordingly, the pixel definition layer 380 may be in stably contact with the second organic layer 182 and the third organic layer 183. The pixel definition layer 380 may be a black pixel definition layer that is formed of an organic material having a black color so that light applied from the outside may be not reflected back to the outside, and may be formed of a transparent organic material according to an embodiment. Therefore, according to an embodiment, the pixel definition layer 380 may include an organic material of a negative type of black color, and may include a black color pigment.

A spacer may be positioned on the pixel definition layer 380.

The first functional layer FL1 may be disposed on the anode Anode and the pixel definition layer 380. The first functional layer FL1 may include a hole transport layer (HTL), a hole injection layer (HIL), or both a hole transport layer (HTL) and a hole injection layer (HIL). The first functional layer FL1 may be disposed (e.g., entirely disposed) in the display area DA and the component area EA except for the light transmissive area UTA.

The emission layer EML may be disposed on the first functional layer FL1, and may be positioned in an area corresponding to the opening OP of the pixel definition layer 380. The emission layer EML may include an organic material, an inorganic material, or an organic-inorganic material that emits light of a certain color.

The second functional layer FL2 may be disposed on the first functional layer FL1, and may cover the emission layer EML. The second functional layer FL2 may include an electron transport layer (ETL), an electron injection layer (EIL), or both an electron transport layer (ETL) and an electron injection layer (EIL). The second functional layer FL2 may be disposed (e.g., entirely disposed) to the display area DA and the component area EA except for the light transmissive area UTA.

The cathode Cathode may be disposed on the second functional layer FL2. The cathode Cathode may be disposed (e.g., entirely disposed) to the display area DA and the component area EA except for the light transmissive area UTA. In the cathode Cathode, an opening CEop corresponding to (or overlapping) the opening BMop of the metal layer BML may be defined. The minimum width of the opening CEop of the cathode Cathode may be greater than the minimum width of the opening BMop of the metal layer BML.

A capping layer CPA may be further positioned on the cathode Cathode. The capping layer CPA may function to improve the lighting efficiency by the principle of a constructive interference. The capping layer CPA may include, for example, a material having a refractive index of 1.6 or greater for light having a wavelength of 589 nm. The capping layer CPA may be an organic capping layer including an organic material, an inorganic capping layer including an inorganic material, or a composite capping layer including an organic material and an inorganic material. For example, the capping layer may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compounds, heterocyclic compounds, and amine group-containing compounds may be optionally substituted with substituents including O, N, S, Se, Si, F, Cl, Br, I, or any combination thereof.

A portion of the capping layer CPA overlapping the opening CEop of the cathode Cathode may be removed. As a portion of the capping layer CPA including a portion overlapping the light transmissive area UTA and a portion of the cathode Cathode are removed, the light transmittance of the light transmissive area UTA may be further improved.

The encapsulation layer 400 may be disposed on the light emitting diode LED. The encapsulation layer 400 may include a first inorganic encapsulation layer 401, an organic encapsulation layer 402, and a second inorganic encapsulation layer 403 sequentially stacked, but the layers of the encapsulation layer 400 are not limited thereto.

The first and second inorganic encapsulation layers 401 and 403 may protect the light emitting diode LED from moisture and oxygen, and the organic encapsulation layer 402 may protect the light emitting diode LED from foreign particles such as dust particles. The first and second inorganic encapsulation layers 401 and 403 may include a silicon nitride layer, a silicon oxynitride layer, a silicon oxide layer, a titanium oxide layer, or an aluminum oxide layer. The organic encapsulation layer 402 may include an acryl-based organic layer, but embodiments are not limited thereto.

On the encapsulation layer 400, a structure that detects a touch may be additionally disposed. It may include sensing insulating layers 501, 510, and 511 and a sensing electrode 540 to sense touch.

The first sensing insulating layer 501 may be disposed (e.g., directly disposed) on the encapsulation layer 400. The first sensing insulating layer 501 may be an inorganic layer including at least one of a silicon nitride, a silicon oxynitride, and a silicon oxide. In another example, the first sensing insulating layer 501 may be an organic layer including an epoxy resin, an acryl resin, or an imide-based resin. The first sensing insulating layer 501 may have a single-layer structure or a multi-layered structure stacked along the third direction DR3.

At least one sensing electrode 540 may be included on the first sensing insulating layer 501, and the sensing electrode 540 may have a single-layer structure or a multi-layered structure stacked along the third direction DR3.

The sensing electrode 540 having a single-layer structure may include a metal layer or a transparent conductive layer. The metal layer may include molybdenum, silver, titanium, copper, aluminum, or an alloy thereof. The transparent conductive layer may include a transparent conductive oxide such as indium tin oxide, indium zinc oxide, zinc oxide, or indium zinc tin oxide. For example, the transparent conductive layer may include a conductive polymer such as poly-(3,4)-ethylene-dihydroxy thiophene (PEDOT), a metal nanowire, graphene, or the like.

The sensing electrode 540 of the multi-layered structure may include metal layers. The metal layers may have a three-layer structure of titanium/aluminum/titanium. The conductive layer of the multi-layered structure may include at least one metal layer and at least one transparent conductive layer.

In case that two sensing electrodes are included on the first sensing insulating layer 501, the second sensing insulating layer 510 may be disposed between two sensing electrodes. The second sensing insulating layer 510 may include an inorganic layer. The inorganic layer may include at least one of an aluminum oxide, a titanium oxide, a silicon oxide, a silicon nitride, a silicon oxynitride, a zirconium oxide, and a hafnium oxide.

In another example, the second sensing insulating layer 510 may include an organic layer. The organic layer may include at least one of an acryl-based resin, a methacrylic resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The third sensing insulating layer 511 may be disposed on the second sensing insulating layer 510 and may cover the sensing electrode 540. The sensing electrode 540 may include a conductive pattern layer. The third sensing insulating layer 511 may cover the conductive pattern layer, and the probability of the damage to the conductive pattern layer in the subsequent process may be reduced or eliminated.

The third sensing insulating layer 511 may include an inorganic material. For example, the third sensing insulating layer 511 may include a silicon nitride, but embodiments are not limited thereto.

An antireflection layer for reducing the reflection of the external light may be positioned on the third sensing insulating layer 511, and the antireflection layer may include a light blocking layer 220, color filters 230, and a planarization layer 550. The light blocking layer 220 and the color filters 230 may not be disposed in the light transmissive area UTA.

The light blocking layer 220 may be disposed overlapping the conductive pattern layer of the sensing electrode 540. The third sensing insulating layer 511 may be disposed between the light blocking layer 220 and the sensing electrode 540. The light blocking layer 220 may prevent the reflection of the external light by the sensing electrode 540. The material of the light blocking layer 220 is not limited as long as it is a material that absorbs light. The light blocking layer 220 may be a layer having a black color, and in an embodiment, the light blocking layer 220 may include a black component (e.g., a black color agent). The black component may include a black dye and a black pigment. The black component may include a metal such as carbon black or chromium or an oxide thereof.

Openings OPBM may be defined on the light blocking layer 220. Openings OPBM may overlap emission layers EML, respectively. The color filters 230 may be disposed corresponding to openings OPBM of the light blocking layer 220. The color filter 230 may transmit light provided from the emission layer EML overlapping the color filter 230.

The light blocking layer 220 may not be positioned in the light transmissive area UTA, in the area adjacent to the light transmissive area UTA, the end portion of the light blocking layer 220 may be further protruded than the end portion of the pixel definition layer 380 and the end portion of the cathode Cathode.

The planarization layer 550 may cover the light blocking layer 220 and the color filters 230. The planarization layer 550 may include an organic material and may provide a planar surface to the upper surface of the planarization layer 550. In another example, the planarization layer 550 may be omitted.

In another example, the color filters 230 may be omitted, and a reflection adjustment layer may be added in the place where the color filters 230 are omitted. The reflection adjustment layer may selectively absorb light in some bands among light reflected from the inside the display panel and/or the electronic device or light incident from the outside the display panel and/or the electronic device.

As an example, the reflection adjustment layer may absorb a first wavelength area of 490 nm to 505 nm and a second wavelength area of 585 nm to 600 nm, so that the light transmittance in the first wavelength area and the second wavelength area may be provided to be 40% or less. The reflection adjustment layer may absorb light with a wavelength that is out of the wavelength range of light of red, green, and blue emitted from the emission layer EML. As such, the reflection adjustment layer may absorb light of the wavelength that does not belong to the wavelength range of red, green, or blue emitted from the emission layer EML, thereby preventing or minimizing the decreasing in the luminance of the display panel and/or the electronic device. For example, the deterioration of the light efficiency of display panel and/or the electronic device may be simultaneously prevented or minimized, and visibility may be improved.

The reflection adjustment layer may be provided as an organic material layer including dye, pigment, or combination thereof. The reflection adjustment layer may include a tetraazaporphyrin (TAP)-based compound, porphyrin-based compound, a metal porphyrin-based compound, an oxazine-based compound, a squarylium-based compound, a triaryl-methane-based compound, a polymethine-based compound, an anthraquinone-based compound, a phthalocyanine-based compound, an azo-based compound, a perylene-based compound, a xanthene-based compound, a diammonium-based compound, a dipyrromethene-based compound, a cyanine-based compound, and a combination thereof.

In an embodiment, the reflection adjustment layer may have transmittance of about 64% to about 72%. The transmittance of the reflection adjustment layer may be adjusted according to the content of pigment and/or dye included in the reflection adjustment layer. The reflection adjustment layer may overlap light emission areas in a plan view, but may not overlap the light transmissive area UTA in a plan view.

In the light transmissive area UTA as described above, the metal layer BML, the first semiconductor pattern layer ACT1, the first gate conductive layer GAT1, the second gate conductive layer GAT2, the second semiconductor pattern layer ACT2, the third gate conductive layer GATS, the first data conductive layer SD1, the second data conductive layer SD2, and the anode Anode may not be positioned. In another example, the emission layer EML and the sensing electrode 540 may not be formed. In another example, the buffer layer 111, the first gate insulating layer 141, the second gate insulating layer 142, the first interlayer insulating layer 161, the third gate insulating layer 143, the second interlayer insulating layer 162, the second organic layer 182, and the third organic layer 183 may not be formed.

For example, additional openings may be formed in the pixel definition layer 380, the light blocking layer 220, and the color filter 230 in the light transmissive area UTA, so that the pixel definition layer 380, the light blocking layer 220, and the color filter 230 may not be formed.

In the above, the embodiment in which a total of three organic layers are formed, and the anode connection opening may be formed in the second organic layer and the third organic layer has been described. However, at least two organic layers may be formed, the anode connection opening may be positioned in the upper organic layer positioned away from the substrate, and the lower organic layer opening may be positioned in the lower organic layer.

In the above, the structure of the overall light emitting display device and pixel was examined in detail.

Hereinafter, based on an embodiment, whether each wiring is positioned in any conductive layer in the display area DA, the second component area EA2, and the boundary area positioned therebetween is described in detail through FIG. 35 and FIG. 36.

Figure 35:
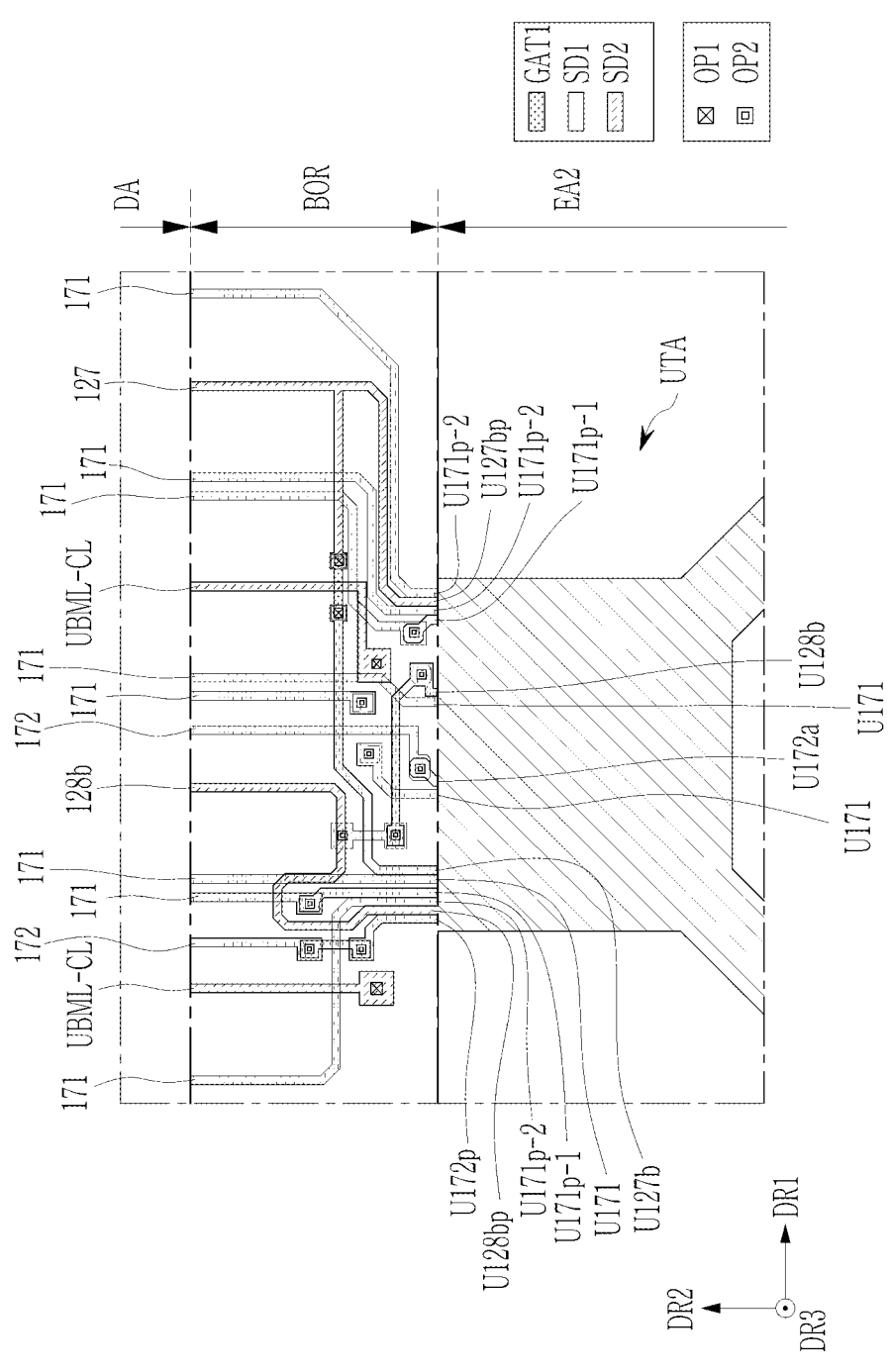

FIG. 35 and FIG. 36 are schematic views showing a structure for connecting a signal line and a voltage line for connecting a normal pixel and a second component pixel according to an embodiment.

FIG. 35 shows the boundary area BOR with the display area DA at the upper side in the second direction DR2 of the second component area EA2 based on the structure extending in the second direction DR2. FIG. 36 shows the boundary area BOR with the display area DA at the left in the first direction DR1 of the second component area EA2 based on the structure connected with extending in the first direction DR1. For example, the boundary area BOR may be positioned between the display area DA and the second component area EA2, and may be a portion in which the normal pixel of the display area DA or the unit pixel UPC of the second component area EA2 may not be formed. For example, in the boundary area BOR, the signal line or the voltage line connecting between the normal pixel and the unit pixel UPC may be positioned, and a contact structure for electrically connecting the signal line or the voltage line may be also positioned.

First, the structure of FIG. 35 is summarized in a table as shown in Table 1 below.

TABLE 1

| Applying voltage | Display area DA | Boundary area BOR | Second component area EA2 |
|---|---|---|---|
| ELVDD | SD2 (172) | SD1 | SD2 (U172p) |
| VAINT | SD1 (128b) | | SD1 (U128bp) |
| DATA_R | SD2 (171) | | SD2 (U171p-2) |
| DATA_G | SD2 (171) | | SD1 (U171p-1) |
| DATA_B | SD2 (171) | | SD2 (U171) |
| VINT | SD1 (127) | GAT1 | SD1 (U127b) |
| DATA_G | SD2 (171) | SD1 | SD2 (U171) |
| ELVDD | SD2 (172) | | SD1 (U172a) |
| DATA)R | SD2 (171) | | SD2 (U171) |
| VAINT | SD1 (128b) | SD2 | SD1 (U128b) |
| DATA_G | SD2 (171) | | SD1 (U171p-1) |
| DATA_B | SD2 (171) | | SD2 (U171p-2) |
| VINT | SD1 (127) | | SD1 (U127bp) |
| DATA_G | SD2 (171) | | SD2 (U171p-2) |

In Table 1, SD1, SD2, and GAT1 denote the first data conductive layer, the second data conductive layer, and the first gate conductive layer, respectively, and symbols positioned in parentheses represent reference numerals FIG. 7 to FIG. 34. For example, ELVDD, VAINT, VINT, DATA_R, DATA_G, and DATA_B described in the applying voltage indicate the driving voltage, the second initialization voltage, the first initialization voltage, the data voltage for red pixel, the data voltage for green pixel, and the data voltage for blue pixel, respectively.

As shown in FIG. 35, the contact structure to connect the voltage line and/or the signal line of the display area DA and the second component area EA2 may be positioned only in the boundary area BOR.

As such, since the contact structure including the opening is positioned in the boundary area, the area occupied by the unit pixel UPC of the second component area EA2 does not increase, the area of the light transmissive area UTA may be relatively wide, and the transmittance of the light transmissive area UTA may be increased.

Since the connection structure of the various voltage wiring described in FIG. 35 is only an embodiment, the connection structure may be formed in the different conductive layer from FIG. 35, or may be connected (e.g., electrically connected) through a separate conductive layer without being directly connected or may be directly connected.

For example, the structure of FIG. 36 is summarized in a table as shown in Table 2 below.

TABLE 2

| Applying voltage | Display area DA | Boundary area BOR | Second component area EA2 |
|---|---|---|---|
| GCN-2 | GAT2 | SD1 | GAT2 |
| | GAT3 | | GAT3 |
| GW N-2 | GAT1 | SD1 | GAT1 |
| G IN-2 | GAT2 | SD1 | GAT2 |
| | GAT3 | | GAT3 |
| GC N-1 | GAT3 | SD1 | GAT3 |

TABLE 2-continued

| Applying voltage | Display area DA | Boundary area BOR | Second component area EA2 |
|---|---|---|---|
| GW N-1 | GAT1 | SD1 | GAT1 |
| GI N-1 | GAT2 | SD1 | GAT2 |
| EM(N) | GAT1 | SD2 SD1 | GAT1 |
| GC(N) | GAT2 GAT3 | SD1 | GAT2 GAT3 |
| GW(N) | GAT1 | SD1 | GAT1 |
| GI(N) | GAT2 GAT3 | SD1 | GAT2 GAT3 |
| GW N + 1 | GAT1 | SD1 | GAT1 |
| GI N + 1 | GAT2 | SD1 | GAT2 |
| GC(N + 1) | GAT3 | SD1 | GAT3 |
| EM N + 1 | GAT1 | SD2 SD1 | GAT1 |

In Table 2, SD1, SD2, GAT1, GAT2, and GAT3 denote the first data conductive layer, the second data conductive layer, the first gate conductive layer, the second gate conductive layer, and the third gate conductive layer GAT3, respectively. For example, GC, GW, GI, and EM described in the applying voltage respectively represent the second scan signal, the first scan signal, the initialization control signal, and the light control signal, and (N), (N−1), (N−2), and (N+1) attached after the signal indicate signals for the present pixel, the previous pixel, the second previous pixel and the next pixel, respectively. In Table 2, there is a portion in which two conductive layers are displayed in two rows for one signal, which indicates that the corresponding signal line may be formed into a double-layer structure. However, according to an embodiment, the corresponding signal line may be formed as a single-layer structure.

As shown in FIG. 36, the contact structure to connect the voltage line and/or the signal line of the display area DA and the second component area EA2 may be positioned only in the boundary area BOR.

As such, since the contact structure including the opening is positioned in the boundary area, the area occupied by the unit pixel UPC of the second component area EA2 may not increase, the area of the light transmissive area UTA may be relatively wide, and the transmittance of the light transmissive area UTA may increase.

Since the connection structure of the various signal wiring described in FIG. 36 is only an embodiment, the connection structure may be formed in the different conductive layer from FIG. 36, or may be connected (e.g., electrically connected) through a separate conductive layer without being directly connected or may be directly connected.

For example, a voltage may be applied to the light blocking portion UBML positioned below the unit pixel UPC of the second component area EA2.

FIG. 35 shows one UBML-CL of the wirings for applying the voltage to the light blocking portion UBML. For example, the voltage may be applied to the light blocking portion UBML positioned in the portion corresponding to the second component area EA2, and this is described as one of the methods of applying the voltage to the light blocking portion UBML through FIG. 37 and FIG. 38.

Figure 37:
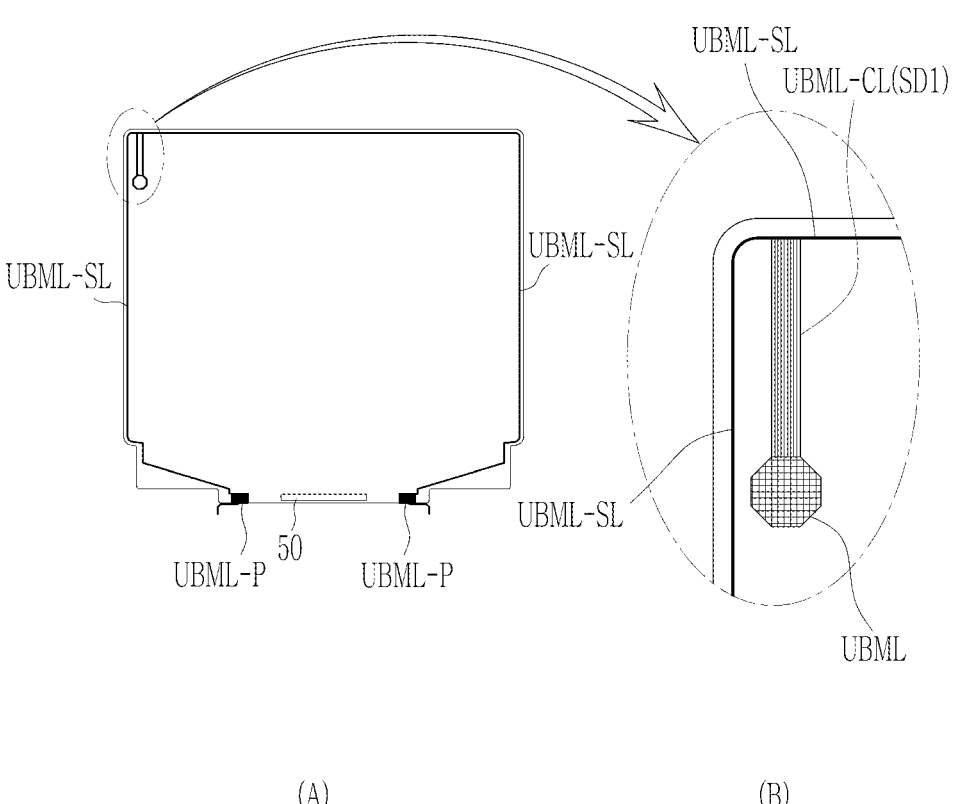
FIG. 37 and FIG. 38 are schematic views showing a structure for applying a voltage to a light blocking portion of a second component pixel in a light emitting display device according to an embodiment.
Figure 38:
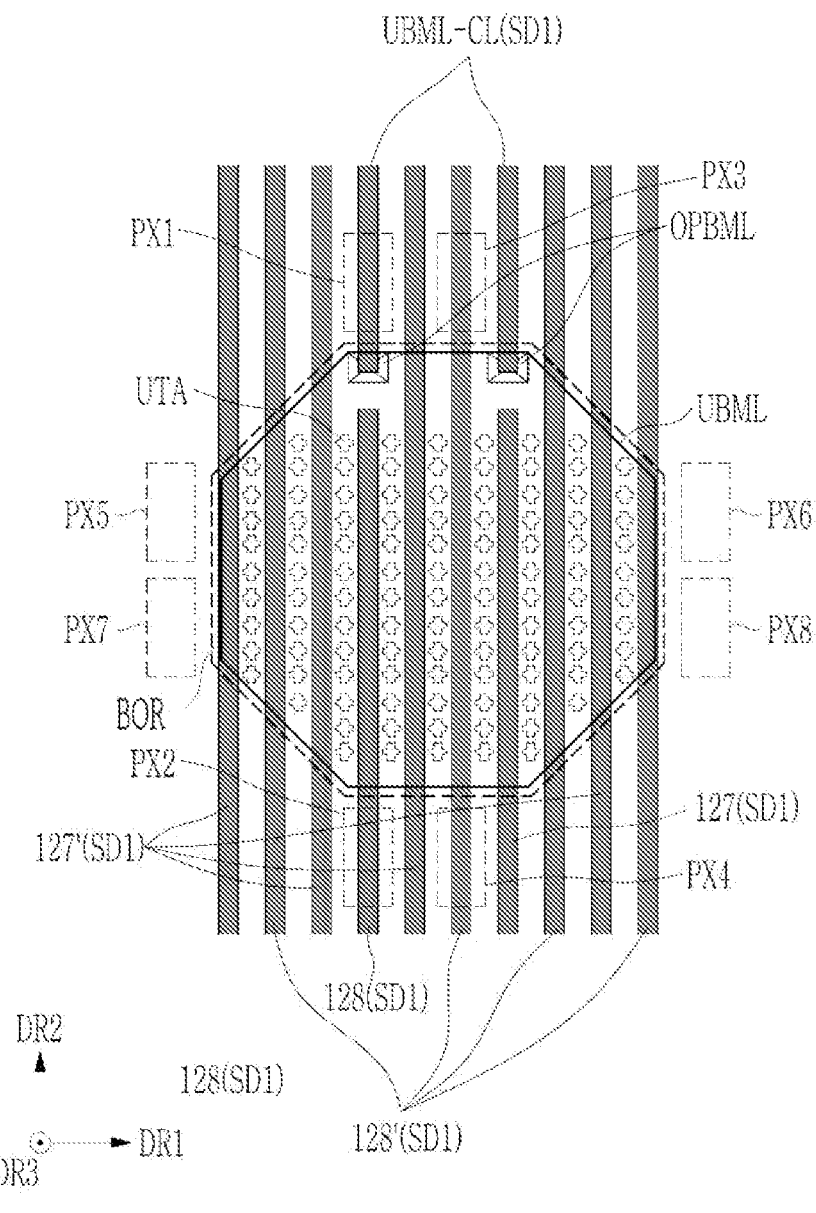

FIG. 37 and FIG. 38 are schematic views showing a structure for applying a voltage to a light blocking portion of a second component pixel in a light emitting display device according to an embodiment.

FIG. 37 is a schematic view showing a structure of a light blocking portion UBML positioned in a portion corresponding to the second component area EA2 in the entire light emitting display device and wirings UBML-SL and UBML-CL and a pad UBML-P for applying the voltage to the light blocking portion UBML.

According to FIG. 37, pads UBML-P (hereinafter also referred to as voltage pads for a light blocking portion) may be positioned on sides (e.g., opposite sides) of the driving part 50. The first voltage application wiring UBML-SL (hereinafter also referred to as a first voltage wiring for the light blocking portion) extended from the pad UBML-P may be extended along the outside of (or an edge portion) the light emitting display device. The first voltage application wiring UBML-SL to the light blocking portion UBML may be connected (e.g., electrically connected) through the second voltage application wiring UBML-CL, and the second voltage application wiring UBML-CL may use one of the wiring positioned on the first data conductive layer SD1 *a* as second voltage application wiring UBML-CL.

The structure for connecting the second voltage application wiring UBML-CL and the light blocking portion UBML is described more in detail through FIG. 38.

FIG. 38 is the schematic view showing the connection relation of the second voltage application wiring UBML-CL and the light blocking portion UBML, and the connection structure with the light blocking portion UBML is clearly illustrated by showing the second voltage application wiring UBML-CL larger. FIG. 38 shows that the size of the light transmissive area UTA is small, but this is because it is not related to the connection relation between the second voltage application wiring UBML-CL and the light blocking portion UBML, and the size is not actually small. For example, as shown in FIG. 21 to FIG. 32, the size of the light transmissive area UTA may have the width wider than that of the second voltage application wiring UBML-CL.

Referring to FIG. 38, the portion of the wiring among the first initialization voltage line 127 and the second initialization voltage line 128 positioned in (or formed of) the first data conductive layer SD1 and adjacently extending in the second direction DR2 may be disconnected and may be connected (e.g., electrically connected) to the first voltage application wiring UBML-SL to be used as the second voltage application wiring UBML-CL. In FIG. 38, the first initialization voltage line 127 and the second initialization voltage line 128 are shown as reference numerals 127 (SD1) and 128 (SD1), respectively, and the first initialization voltage line 127 and the second initialization voltage line 128 to which the same voltage is applied as a whole because there is no disconnection are identified by reference numerals 127' (SD1) and 128' (SD1), respectively.

Some of the first initialization voltage line 127 or the second initialization voltage line 128 of the first data conductive layer SD1 may be disconnected and connected to the light blocking portion UBML through the opening OPBML. For example, a portion of the first initialization voltage line 127 or the second initialization voltage line 128 of the first data conductive layer SD1 that is not connected to the light blocking portion UBML may still be used as the first initialization voltage line 127 and/or the second initialization voltage line 128. For example, the second voltage application wiring UBML-CL may be electrically disconnected from the normal pixel positioned in the display area DA.

On the light blocking portion UBML, the unit pixel UPC like FIG. 21 to FIG. 33 may be disposed. The opening of the light blocking portion UBML corresponds to the light transmissive area UTA.

The voltage applied to the light blocking portion UBML may be the driving voltage ELVDD, and various voltages may be applied according to an embodiment.

FIG. 38 shows that the voltage is applied to the light blocking portion UBML by using the first initialization voltage line 127 and/or the second initialization voltage line 128, but a voltage may be applied by using other various voltage lines.

The voltage application structure to the light blocking portion UBML shown at FIG. 37 and FIG. 38 may be described as follows.

The display area DA may include the first normal pixel PX1 and the second normal pixel PX2 disposed on sides (e.g., opposite sides) of the second component area EA2, respectively, and commonly connected to a data line 171; and the first voltage line positioned adjacent to the first normal pixel PX1 and the second normal pixel PX2, the second component area EA2 may include the light blocking portion UBML and the unit pixel UPC positioned on the light blocking portion, the light blocking portion UBML may have openings corresponding to the light transmissive area UTA, openings may not overlap the unit pixel UPC in a plan view, the first voltage line may be divided into the first portion UBML-CL (SD1) adjacent to the first normal pixel PX1 and the second portion 128 (SD1) positioned adjacent to the second normal pixel PX2, the first portion UBML-CL (SD1) and the second portion 128 (SD1) may be electrically disconnected, and the first portion UBML-CL (SD1) may be electrically connected to the light blocking portion UBML. For example, the first voltage line may be various voltage lines (e.g., the first initialization voltage line, the second initialization voltage line, the driving voltage line, etc.) extending in the second direction DR2.

The first portion UBML-CL (SD1) and the first normal pixel PX1 may be electrically disconnected, and the second portion 128 (SD1) and the second normal pixel PX2 may be electrically connected.

The display area DA may include a third normal pixel PX3 and a fourth normal pixel PX4 positioned on sides (e.g., opposite sides) of the second component area EA2 in the second direction DR2 and connected to another data line 171; and another voltage line 128' (SD1) (referred to as a second voltage line) to which the same voltage as the voltage (e.g., the second initialization voltage VAINT) applied to the second portion 128 (SD1) of the first voltage line, and the third normal pixel PX3, the fourth normal pixel PX4, and the unit pixel UPC may be connected (e.g., electrically connected) commonly to the second voltage line 128' (SD1).

A pad UBML-P disposed on a side of the driving part 50; and a first voltage application wiring UBML-SL for connecting the first portion of the first voltage line connected to the light blocking portion UBML and the first portion and pad UBML-P may be further included, and the first voltage application wiring UBML-SL may be extended along the outside of the light emitting display device. In this structure, the first portion of the first voltage line may correspond to the second voltage application wiring UBML-CL. As described above, the separate wiring may not be formed, and the voltage may be applied to the light blocking portion UBML by using the portion of the voltage line, so that the light transmissive area UTA of the second component area EA2 may not be reduced and the light transmittance of the second component area EA2 may be applied.

The voltages applied to the first portion and the second portion of the first voltage line, and the second voltage line in each area shown in FIG. 38 are shown in Table 3 below.

TABLE 3

| Area | Applying voltage | | | |
| --- | --- | --- | --- | --- |
| Upper display area DA | Voltage for BML | VINT | VAINT | Voltage for BML |
| Second component area EA2 | Disconnection | VINT | VAINT | Disconnection |
| Lower display area DA | VAINT | VINT | VAINT | VAINT |

For example, the voltage for BML may be a voltage applied to the light blocking portion UBML and may be the driving voltage ELVDD, VAINT represents the second initialization voltage VAINT applied to the second initialization voltage line 128, and VINT represents the first initialization voltage VINT applied to the first initialization voltage line 127.

In Table 3, the portion represented by Disconnection indicates a structure that applies different voltages at the upper and lower portion through the disconnection in the portion overlapping the second component area EA2 as the upper display area DA and the lower display area DA positioned on sides (e.g., opposite sides) in the second direction DR2 apply the different voltages.

In Table 3, although it is shown that the voltage is applied to the light blocking portion UBML by using the second initialization voltage line 128 to which the second initialization voltage VAINT is applied, as shown in FIG. 38, the first portion UBML-CL (SD1) positioned adjacent to the first normal pixel PX1 the second portion 127 (SD1) positioned adjacent to the second normal pixel PX2 may be divided by disconnecting a portion by using the first initialization voltage line 127 that applies the first initialization voltage VINT, the first portion UBML-CL (SD1) and the second portion 127 (SD1) may be electrically disconnected from each other, and the first portion UBML-CL (SD1) may be electrically connected to the light blocking portion UBML.

Referring to FIG. 38, the display area DA may further include a fifth normal pixel PX5 and a sixth normal pixel PX6 adjacent to other opposite sides of the second component area EA2, respectively. The fifth normal pixel PX5 and the sixth normal pixel PX6 may be connected to signal lines extending in a direction intersecting the data line 171, which is connected to the first and second normal pixels PX1 and PX2, and the another data line 171, which is connected to the third and fourth normal pixels PX3 and PX4. The unit pixel UPC in the second component area EA2 may be connected to the signal lines, the boundary area BOR may further include connection parts (e.g., the second scan signal GC(N), the first scan signal GW(N), the initialization control signal GI(N), and the light control signal EM(N) in FIG. 36), and the connection parts and the signal lines may be connected in the boundary area BOR.

Referring to FIG. 38, the display area may further include a seventh normal pixel PX7 and an eighth normal pixel PX8 adjacent to the other opposite sides of the second component area EA2. The seventh normal pixel PX7 and the eighth normal pixel PX8 may be connected to other signal lines extending in the direction intersecting the data line 171, which is connected to the first and second normal pixels PX1 and PX2, and the another data line 171, which is connected to the third and fourth normal pixels PX3 and PX4. The second component area EA2 may further include bypass signal lines, the boundary area BOR may further include other connection parts (e.g., the second scan signal GC(N+1), the first scan signal GW(N+1), the initialization control signal GI(N+1), and the light control signal EM(N+1) in FIG. 36), and the bypass signal lines (e.g., the second previous first scan line U151(N−2), the previous first scan line U151(N−1), the next first scan line U151(N+1) and the next light emission control line U155(N+1) in FIG. 27) and the other signal lines may be connected to the other connection parts in the boundary area.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A light emitting display device comprising:
a display area and a component area surrounded by the display area, the component area in which an optical element is disposed, wherein;
the display area includes:
a first normal pixel and a second normal pixel connected to a first data line and adjacent to opposite sides of the component area, respectively; and
a third normal pixel and a fourth normal pixel connected to a second data line and adjacent to the opposite sides of the component area, respectively,
the component area includes:
a first unit pixel connected to the first data line; and
a bypass data line,
the second data line and the bypass data line are formed of different conductive layers, respectively,
the second data line is connected to the bypass data line in a boundary area positioned between the display area and the component area,
the component area includes a plurality of unit pixels that includes the first unit pixel, and
the second data line and the bypass data line are not connected to any of the plurality of unit pixels.

2. The light emitting display device of claim 1, wherein the first data line is formed of a second data conductive layer and continuously extends in the display area and the component area.

3. The light emitting display device of claim 1, wherein the first data line is formed of a second data conductive layer in the display area and the component area,
the boundary area includes a connection part formed of a first data conductive layer, and
the connection part and the first data line are connected to each other in the boundary area.

4. The light emitting display device of claim 1, wherein the first data line and the second data line formed in the display area are formed of a second data conductive layer, and
the bypass data line positioned in the component area is formed of a first data conductive layer.

5. The light emitting display device of claim 1, further comprising
a driving voltage line commonly connected to the first normal pixel, the second normal pixel, and the first unit pixel, and
the driving voltage line is formed of a second data conductive layer in the display area and is connected to a driving voltage applying part formed of a first data conductive layer in the component area.

6. The light emitting display device of claim 5, wherein the component area further includes a bypass driving voltage line and another driving voltage applying part formed of the second data conductive layer, and
the bypass driving voltage line is connected to the another driving voltage applying part.

7. The light emitting display device of claim 1, further comprising
a driving voltage line commonly connected to the first normal pixel, the second normal pixel, and the first unit pixel,
the driving voltage line is formed of a second data conductive layer in the display area and the component area,
the boundary area includes a connection part formed of a first data conductive layer, and
the connection part and the driving voltage line are connected in the boundary area.

8. The light emitting display device of claim 1, further comprising:
a first initialization voltage line commonly connected to the first normal pixel, the second normal pixel, and the first unit pixel,
the first initialization voltage line is formed of a first data conductive layer in the display area and the component area, and
the component area further includes a first initialization voltage applying part formed of a second gate conductive layer so that the first initialization voltage line is connected to the first initialization voltage applying part in the component area.

9. The light emitting display device of claim 8, wherein the component area further includes a bypass first initialization voltage line formed of the first data conductive layer and a plurality of first island parts formed of a semiconductor layer, and
the bypass first initialization voltage line and the plurality of first island parts are connected to each other in the component area.

10. The light emitting display device of claim 8, further comprising:
a first initialization voltage line commonly connected to the first normal pixel, the second normal pixel, and the first unit pixel; and
a second initialization voltage line formed of the first data conductive layer in the display area and the component area, wherein
the component area further includes a second initialization voltage applying part formed of the second gate conductive layer so that the second initialization voltage line is connected to the second initialization voltage applying part in the component area.

11. The light emitting display device of claim 10, wherein the component area further includes a bypass second initialization voltage line formed of the first data conductive layer and a plurality of second island parts formed of a semiconductor layer, and
the bypass second initialization voltage line and the plurality of second island parts are connected to each other in the component area.

12. The light emitting display device of claim 8, further comprising
a second initialization voltage line commonly connected to the first normal pixel, the second normal pixel, and the first unit pixel, wherein
the second initialization voltage line is formed of the first data conductive layer in the display area and the component area, the boundary area includes a connection part formed of a second data conductive layer, and the connection part and the second initialization voltage line are connected in the boundary area.

13. The light emitting display device of claim 1, wherein the display area further includes a fifth normal pixel and a sixth normal pixel connected to a first signal line extending in a direction intersecting the first data line and the second data line, the fifth normal pixel and the sixth normal pixel adjacent to opposite sides of the component area, respectively, the first unit pixel of the component area is connected to the first signal line, the boundary area further includes a connection part, and the connection part and the first signal line are connected to each other in the boundary area.

14. The light emitting display device of claim 13, wherein the display area further includes a seventh normal pixel and an eighth normal pixel connected to a second signal line extending in the direction intersecting the first data line and the second data line, the seventh normal pixel and the eighth normal pixel and adjacent to the opposite sides of the component area, respectively, the component area further includes a bypass signal line, the boundary area further includes another connection part, and the bypass signal line and the second signal line are connected to the another connection part in the boundary area.

15. A light emitting display device comprising:

a display area and a component area surrounded by the display area, the component area in which an optical element is disposed, wherein the display area includes:

a first normal pixel and a second normal pixel adjacent to opposite sides of the component area and commonly connected to a data line; and a first voltage line adjacent to the first normal pixel and the second normal pixel, the component area includes:

a light blocking portion; and a unit pixel positioned on the light blocking portion, the light blocking portion includes a plurality of openings corresponding to a light transmissive area, the plurality of openings do not overlap the unit pixel in a plan view, the first voltage line is divided into a first portion adjacent to the first normal pixel and a second portion adjacent to the second normal pixel, the first portion and the second portion are electrically disconnected from each other, and the first portion is electrically connected to the light blocking portion.

16. The light emitting display device of claim 15, wherein the first portion of the first voltage line and the first normal pixel are electrically disconnected from each other, and the second portion of the first voltage line and the second normal pixel are electrically connected to each other.

17. The light emitting display device of claim 16, wherein a first initialization voltage or a second initialization voltage is applied to the second portion of the first voltage line.

18. The light emitting display device of claim 17, wherein the display area includes:

a third normal pixel and a fourth normal pixel adjacent to the opposite sides of the component area, respectively, and commonly connected to another data line; and a second voltage line to which a voltage applied to the second portion of the first voltage line is applied, and the third normal pixel, the fourth normal pixel, and the unit pixel are connected commonly to the second voltage line.

19. The light emitting display device of claim 15, further comprising:

a pad part adjacent to a side of a driving part; and a first voltage application wiring connecting the first portion of the first voltage line connected to the light blocking portion and the pad part, wherein the first voltage application wiring is extended along an edge portion of the light emitting display device.

20. An electronic device comprising:

a light emitting display device comprising a display area and a component area surrounded by the display area, wherein:

an optical element is disposed in the component area, the display area includes:

a first normal pixel and a second normal pixel connected to a first data line and adjacent to opposite sides of the component area, respectively; and a third normal pixel and a fourth normal pixel connected to a second data line and adjacent to the opposite sides of the component area, respectively, the component area includes:

a first unit pixel connected to the first data line; and a bypass data line, the second data line and the bypass data line are formed of different conductive layers, respectively, the second data line is connected to the bypass data line in a boundary area positioned between the display area and the component area, the component area includes a plurality of unit pixels that includes the first unit pixel, and the second data line and the bypass data line are not connected to any of the plurality of unit pixels.

* * * * *